(12) United States Patent
Murphy et al.

(10) Patent No.: US 12,664,327 B1
(45) Date of Patent: Jun. 23, 2026

(54) AGENTIC AI-BASED SYSTEMS AND METHODS FOR CONTEXT-AWARE BUILDING CONSTRUCTION AND MAINTENANCE MANAGEMENT

(71) Applicant: Togal.AI Inc., Miami, FL (US)

(72) Inventors: Patrick E Murphy, Miami, FL (US); Johnny Maghzal, Miami, FL (US); Thomas Patrick Murphy, Miami, FL (US)

(73) Assignee: Togal.AI Inc., Miami, FL (US)

( * ) Notice: Subject to any disclaimer, the term of this patent is extended or adjusted under 35 U.S.C. 154(b) by 0 days.

(21) Appl. No.: 19/258,264

(22) Filed: Jul. 2, 2025

Related U.S. Application Data

(60) Provisional application No. 63/781,004, filed on Mar. 31, 2025.

(51) Int. Cl.
*G06F 30/12* (2020.01)
*G06F 30/20* (2020.01)
*G06Q 10/0631* (2023.01)

(52) U.S. Cl.
CPC .............. *G06F 30/12* (2020.01); *G06F 30/20* (2020.01); *G06Q 10/063116* (2013.01); *G06Q 10/06313* (2013.01)

(58) Field of Classification Search
CPC ... G06F 30/12; G06F 30/20; G06Q 10/06313; G06Q 10/063116
USPC .......................................................... 703/1
See application file for complete search history.

(56) References Cited

U.S. PATENT DOCUMENTS

| | | | |
|---|---|---|---|
| 2013/0054286 A1* | 2/2013 | Oberhofer .............. | G06Q 10/00 705/7.11 |
| 2018/0012125 A1* | 1/2018 | Ladha .................... | G06N 3/044 |
| 2023/0153485 A1* | 5/2023 | Austern ................. | G06N 20/00 703/1 |
| 2025/0200208 A1* | 6/2025 | Roper, Jr. .............. | G06F 16/93 |
| 2025/0209223 A1* | 6/2025 | Foley .................... | G06F 3/0486 |
| 2025/0239021 A1* | 7/2025 | Curry ..................... | G06F 40/40 |
| 2025/0351802 A1* | 11/2025 | Torres ................. | A01K 27/009 |

* cited by examiner

*Primary Examiner* — Andre Pierre Louis
(74) *Attorney, Agent, or Firm* — Tracnik Law, LLC; Joseph P Kincart

(57) ABSTRACT

Methods, systems, and apparatus for intelligent planning, monitoring, and management of building construction or maintenance projects using Agentic artificial intelligence (AI). A controller operating an AI agent receives a design plan including a spatial layout and building elements, and converts it into a dynamic interactive model comprising interactive components. The AI agent receives contextual data from sources such as IoT devices, BMS systems, user locations, weather services, vendor databases, and calendars. An interactive user interface is generated for user interaction via verbal, textual, or gestural input. Using multi-modal input correlation and natural language processing, the AI agent interprets user intent and autonomously initiates actions including task scheduling, material procurement, and device control. The AI agent may coordinate with sub-agents on other user devices for collaborative management. Real-time updates, simulation walkthroughs, and predictive alerts enable dynamic execution, thereby enhancing operational efficiency and decision-making throughout construction and maintenance phases.

20 Claims, 20 Drawing Sheets

100

400

800

<u>1300</u>

RECEIVE INTO A CONTROLLER A DESIGN PLAN COMPRISING BUILDING ELEMENTS AND SPATIAL LAYOUT

<u>1301</u>

CONVERT THE RECEIVED DESIGN PLAN INTO A DYNAMIC INTERACTIVE MODEL

<u>1302</u>

IDENTIFY AND CLASSIFY DESIGN ELEMENTS FROM THE DESIGN PLAN (E.G., WALLS, FIXTURES, ELECTRICAL LINES, WINDOWS, DOORS)

<u>1303</u>

RECEIVE CONTEXTUAL DATA FROM EXTERNAL SOURCES (E.G., BMS, IOT DEVICES, LOCATION DATA, WEATHER INFORMATION, CALENDAR)

<u>1304</u>

INITIATE AGENTIC AI ENGINE FOR ANALYSIS AND DECISION PROCESSING

<u>1305</u>

GENERATE AND DISPLAY INTERACTIVE USER INTERFACE ON USER DEVICE
<u>1306</u>

RECEIVE USER INTERACTION THROUGH TOUCH, VOICE, OR TEXTUAL COMMANDS

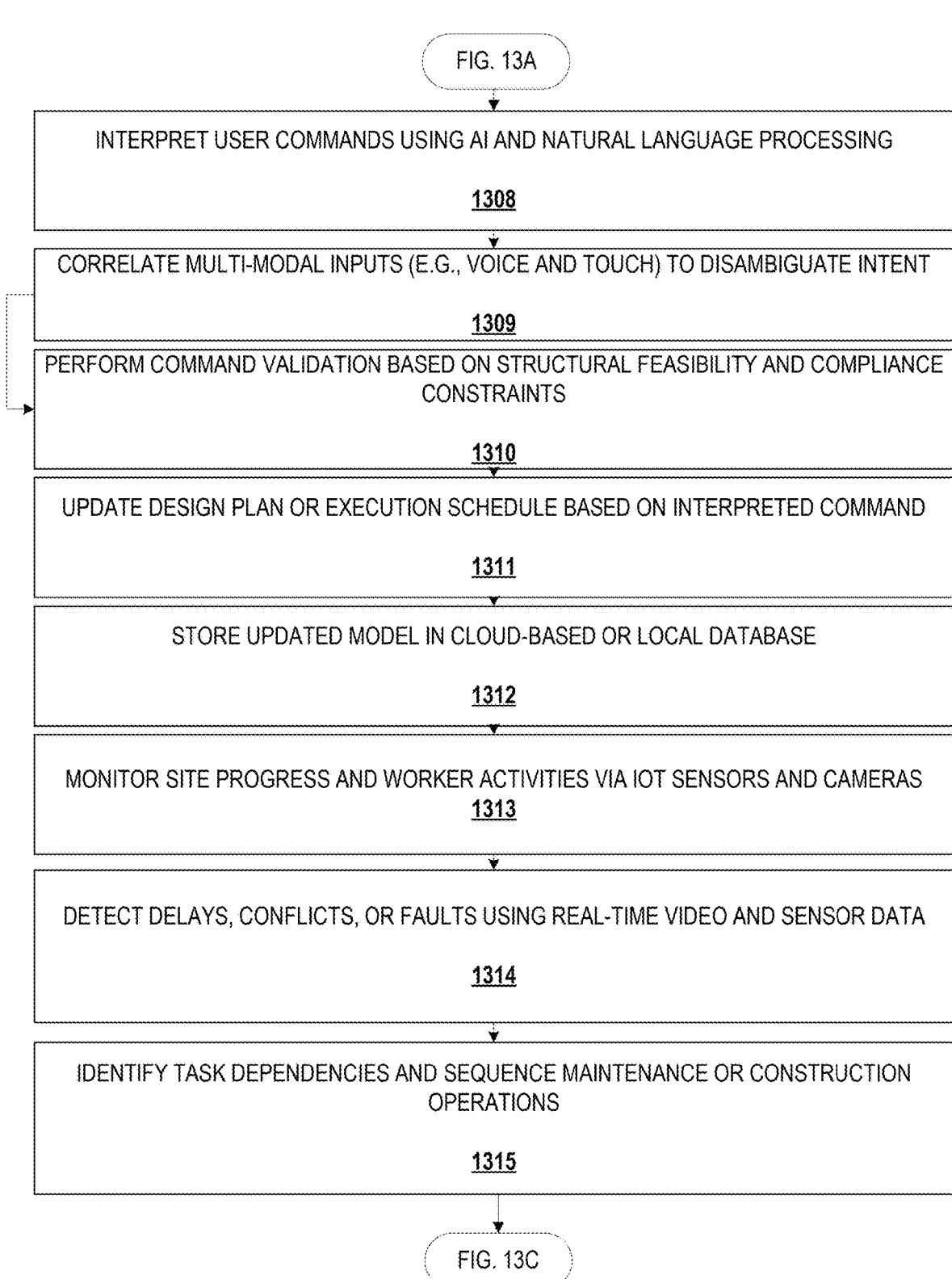

FIG. 13A

INTERPRET USER COMMANDS USING AI AND NATURAL LANGUAGE PROCESSING

1308

CORRELATE MULTI-MODAL INPUTS (E.G., VOICE AND TOUCH) TO DISAMBIGUATE INTENT

1309

PERFORM COMMAND VALIDATION BASED ON STRUCTURAL FEASIBILITY AND COMPLIANCE CONSTRAINTS

1310

UPDATE DESIGN PLAN OR EXECUTION SCHEDULE BASED ON INTERPRETED COMMAND

1311

STORE UPDATED MODEL IN CLOUD-BASED OR LOCAL DATABASE

1312

MONITOR SITE PROGRESS AND WORKER ACTIVITIES VIA IOT SENSORS AND CAMERAS
1313

DETECT DELAYS, CONFLICTS, OR FAULTS USING REAL-TIME VIDEO AND SENSOR DATA

1314

IDENTIFY TASK DEPENDENCIES AND SEQUENCE MAINTENANCE OR CONSTRUCTION OPERATIONS

Figures 13B, 13C, 13D:
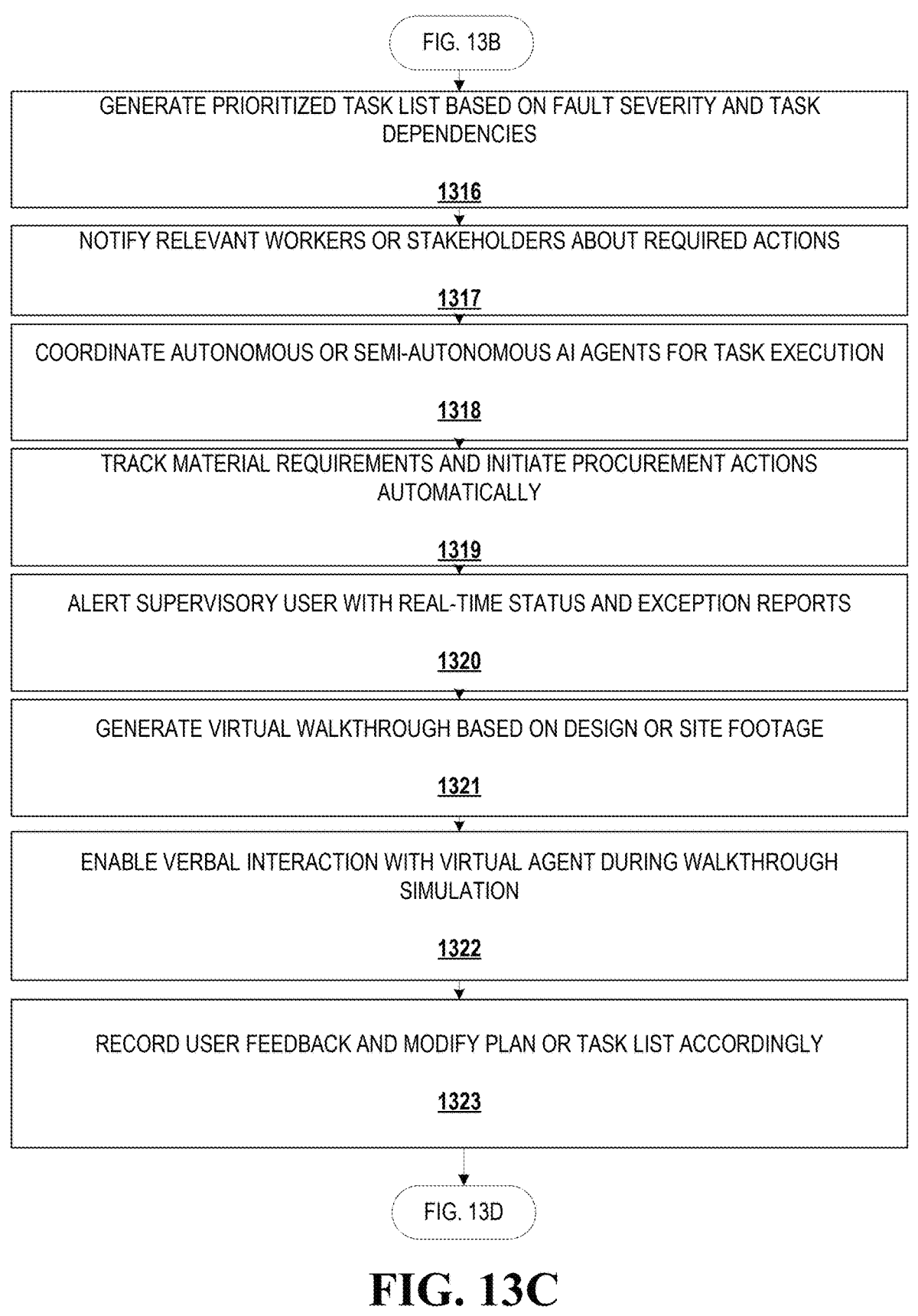

GENERATE PRIORITIZED TASK LIST BASED ON FAULT SEVERITY AND TASK DEPENDENCIES

1316

NOTIFY RELEVANT WORKERS OR STAKEHOLDERS ABOUT REQUIRED ACTIONS

1317

COORDINATE AUTONOMOUS OR SEMI-AUTONOMOUS AI AGENTS FOR TASK EXECUTION

1318

TRACK MATERIAL REQUIREMENTS AND INITIATE PROCUREMENT ACTIONS AUTOMATICALLY

1319

ALERT SUPERVISORY USER WITH REAL-TIME STATUS AND EXCEPTION REPORTS

1320

GENERATE VIRTUAL WALKTHROUGH BASED ON DESIGN OR SITE FOOTAGE

1321

ENABLE VERBAL INTERACTION WITH VIRTUAL AGENT DURING WALKTHROUGH SIMULATION

1322

RECORD USER FEEDBACK AND MODIFY PLAN OR TASK LIST ACCORDINGLY

Figures 13C, 13D:
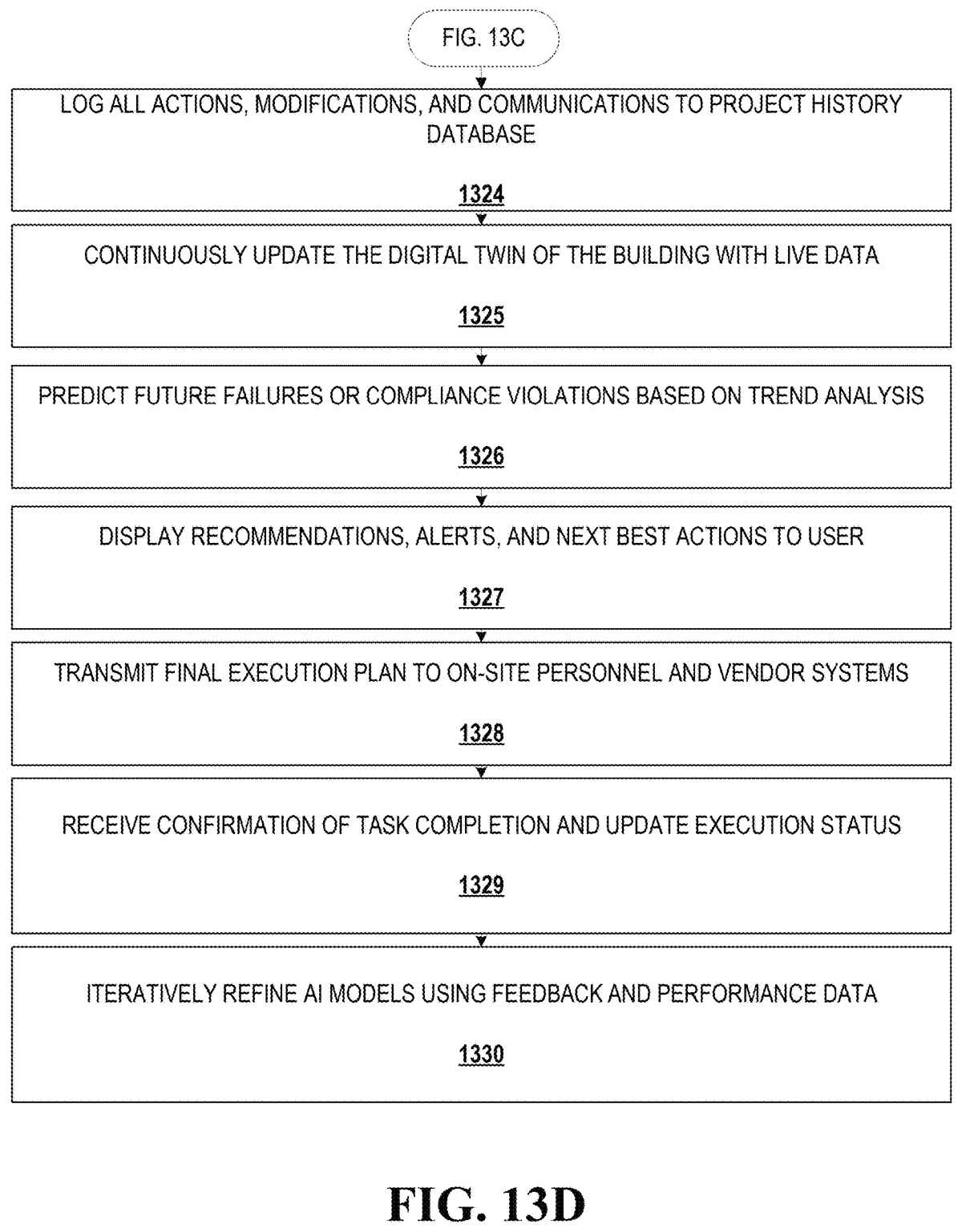

LOG ALL ACTIONS, MODIFICATIONS, AND COMMUNICATIONS TO PROJECT HISTORY DATABASE

1324

CONTINUOUSLY UPDATE THE DIGITAL TWIN OF THE BUILDING WITH LIVE DATA

1325

PREDICT FUTURE FAILURES OR COMPLIANCE VIOLATIONS BASED ON TREND ANALYSIS

1326

DISPLAY RECOMMENDATIONS, ALERTS, AND NEXT BEST ACTIONS TO USER

1327

TRANSMIT FINAL EXECUTION PLAN TO ON-SITE PERSONNEL AND VENDOR SYSTEMS

1328

RECEIVE CONFIRMATION OF TASK COMPLETION AND UPDATE EXECUTION STATUS

1329

ITERATIVELY REFINE AI MODELS USING FEEDBACK AND PERFORMANCE DATA

AGENTIC AI-BASED SYSTEMS AND METHODS FOR CONTEXT-AWARE BUILDING CONSTRUCTION AND MAINTENANCE MANAGEMENT

CROSS-REFERENCE TO RELATED APPLICATIONS

This application claims priority to U.S. Provisional Application No. 63/781,004, filed Mar. 31, 2025, and entitled AGENTIC AI-BASED SYSTEMS AND METHODS FOR CONTEXT-AWARE BUILDING CONSTRUCTION AND MAINTENANCE MANAGEMENT, the entire disclosure of which is incorporated herein by reference.

FIELD OF THE INVENTION

The present invention relates generally to the application of artificial intelligence in the field of building design, construction, and post-construction maintenance. More particularly, the invention concerns the use of Agentic artificial intelligence (AI) systems—autonomous, goal-driven software agents capable of reasoning, planning, and taking action—to manage and optimize tasks across the entire building lifecycle. This includes design generation, construction planning and execution, material and labor management, and post-construction upkeep and facilities maintenance. The invention further relates to systems, methods, and apparatus for intelligent planning, monitoring, and management of building construction and maintenance operations using Agentic AI that autonomously analyzes design plans, contextual data, and user interactions to perform dynamic decision-making, task coordination, and control of on-site operations across various building phases.

BACKGROUND OF THE INVENTION

The construction industry continues to face numerous challenges related to fragmented decision-making, inefficient resource coordination, schedule slippage, budget overruns, and the reactive handling of maintenance issues. Despite the availability of digital tools such as Building Information Modeling (BIM), project management software, and predictive maintenance platforms, these tools typically function in isolation and require constant human input to extract meaningful outcomes. For example, an architect might generate a design using BIM, but the cost estimation, zoning compliance, and labor scheduling must still be handled separately through different systems, and often manually. These disconnected processes lead to miscommunication, delays, and suboptimal use of time and materials.

In recent years, artificial intelligence has been introduced into construction through tools that generate design options based on basic parameters, forecast project delays using historical data, or identify safety risks using computer vision. However, such AI applications are generally limited to narrow tasks and are reactive in nature. They require user prompts to function, lack the ability to reason through multi-step problems independently, and cannot operate with true autonomy. They do not possess context-awareness, nor can they respond proactively to environmental changes, user behavior, or operational thresholds. As a result, they fall short of delivering the kind of seamless, intelligent project management that the construction industry increasingly demands.

Emerging forms of agentic AI-systems capable of autonomous task decomposition, decision-making, and execution-offer the potential to close this gap. In other industries, such as logistics and enterprise automation, agentic AI is already being used to optimize workflows, manage supply chains, and respond to external triggers without explicit instructions. However, the application of such AI in construction remains largely unexplored, particularly in the context of integrating it across all phases of a building's lifecycle.

Construction projects involve a wide array of variables that evolve continuously during the lifecycle of the project, including changes in site conditions, labor availability, material supply, regulatory requirements, and weather disruptions. Coordinating these shifting parameters requires not only access to up-to-date information but also the ability to make timely, context-aware decisions that align with project goals and constraints. Traditional construction management relies heavily on human supervisors to assess this information and adjust plans accordingly. However, manual intervention is often slow, inconsistent, or error-prone, particularly when dealing with large-scale projects or distributed teams.

Although advancements in sensor technologies, IoT-enabled equipment, and real-time monitoring platforms have improved data collection on construction sites, the interpretation and application of such data remains largely dependent on human input. For example, while IoT sensors can detect temperature variations in curing concrete or identify vibrations in structural elements, current systems are generally limited to generating alerts or reports. The task of correlating those observations with project timelines, structural safety standards, or cost implications is still left to project managers or engineers, who must manually synthesize data from multiple systems before making decisions.

Similarly, in the post-construction phase, facility management and maintenance systems often rely on reactive approaches where service is initiated only after a problem has occurred. While predictive maintenance tools are available, they are typically rule-based and lack the ability to adapt to the specific usage patterns, operational schedules, or long-term goals of a particular building. These limitations result in inefficiencies, unplanned downtime, and reduced equipment lifespan, which contribute to increased operational costs over time.

The absence of integrated, autonomous systems that can operate across three major phases—design, construction, and maintenance—creates a persistent bottleneck in improving project efficiency and lifecycle performance. There remains a need for intelligent solutions that can synthesize data from diverse sources, interpret it in light of evolving conditions and constraints, and take appropriate actions or propose well-informed recommendations in real time. Such systems would ideally function with minimal supervision while maintaining responsiveness to user oversight and project-specific requirements.

Despite the increasing complexity of construction projects and the growing availability of real-time data, current AI systems in this field remain narrowly scoped, reactive, and heavily reliant on manual coordination. The integration of agentic AI in construction—if implemented with capabilities for autonomous reasoning, continuous adaptation, and cross-phase coordination—presents a promising opportunity to address these limitations and transform the way building projects are conceived, executed, and maintained.

SUMMARY OF THE DISCLOSURE

Accordingly, the present invention provides systems, methods, and apparatuses for managing construction projects and building lifecycle operations using agentic artificial intelligence (AI). The invention enables autonomous or semi-autonomous execution of tasks across major phases of a building project, including design planning, construction execution, and post-construction maintenance. Through the use of one or more agentic AI entities—each capable of reasoning, task decomposition, real-time decision-making, and contextual awareness—the system is configured to coordinate and optimize a wide range of construction-related activities traditionally handled by separate teams and tools.

In some embodiments, a single unified agentic AI operates as a central decision-making system that manages the overall lifecycle of the project. In other embodiments, multiple specialized AI agents are deployed, each assigned a specific role such as design optimization, material procurement, cost monitoring, labor coordination, regulatory compliance, or maintenance scheduling. Each agent may operate within pre-defined constraints or thresholds and may escalate certain decisions to human users based on cost limits, risk levels, or user-defined approval rules. This role-based architecture allows for modular, adaptive, and scalable deployment of intelligent agents depending on project complexity and user preferences.

The agentic AI system is configured to integrate and analyze real-time data from multiple sources, including but not limited to—building information models (BIM), building management systems (BMS), environmental sensors, IoT devices, site conditions, weather data, labor schedules, and material availability feeds. Based on this data, the system autonomously generates or modifies design plans, forecasts construction timelines, optimizes resource allocation, and identifies deviations from expected progress. In construction scenarios, the system may issue control commands to IoT-connected machinery or safety systems in response to real-time observations, thereby reducing reliance on manual supervision.

The invention further includes context-aware capabilities that enable the AI system to monitor ambient or user-related data—such as geolocation, calendar events, user preferences, or supplier proximity—and apply this contextual information to support project-related decisions. For example, the system may detect that a user is near a vendor location relevant to a pending procurement task and may suggest material inspection, order placement, or cost-saving alternatives. In post-construction phases, the system continues to operate by tracking building system performance, predicting maintenance needs, scheduling service events, and dynamically updating a digital representation of the built environment.

In certain embodiments, the agentic AI system supports inter-agent collaboration, where AI agents negotiate trade-offs and resolve conflicts internally, such as balancing design quality against cost constraints or choosing between timeline acceleration and material efficiency. The AI agents may operate independently or under a central coordinating logic that prioritizes project objectives and user-defined criteria.

In some embodiments of the present invention, a system, method, and apparatus are provided for intelligent planning, monitoring, and management of building construction or maintenance projects using Agentic AI. The system incorporates an AI agent configured to function autonomously or semi-autonomously in various phases of construction workflows, from initial design planning to real-time execution monitoring and post-construction maintenance. The AI agent operates on a controller embedded within a user device or a cloud platform, and is capable of interacting with a dynamic building model, processing contextual and environmental data, communicating with distributed sub-agents, issuing autonomous instructions, and managing resource allocation in real time.

In one aspect, the system receives a digital design plan comprising a spatial layout and a plurality of building elements such as walls, windows, doors, HVAC components, plumbing fixtures, electrical panels, and structural supports. The design plan is converted by the controller into a dynamic interactive model, wherein each building element is represented as an interactive component that can be selected, analyzed, modified, or annotated. The AI agent analyzes the model and correlates it with contextual data retrieved from internal or external sources including, but not limited to, a BMS, IoT devices deployed across the site, weather databases, geolocation tracking systems, scheduling systems, vendor listings, or project calendars.

In some embodiments, the AI agent is configured to generate and display an interactive user interface on a user device operated by a project stakeholder, such as a contractor, client, architect, supervisor, or technician. The user may interact with the AI agent using a combination of verbal commands, typed inputs, or physical gestures. For example, a user may touch a wall component in the model while simultaneously saying, "move this to the west side," prompting the AI agent to interpret the intent using multimodal correlation. The agent may resolve ambiguous references using visual context, previously issued commands, project metadata, or environmental data.

In further embodiments, the system comprises a multi-agent framework, wherein a master Agentic AI agent operates in conjunction with one or more sub-agents residing on user devices of domain-specific stakeholders. Each sub-agent may specialize in managing activities such as plumbing, electrical wiring, HVAC installation, structural inspection, or material procurement. These sub-agents may function independently or as slave entities under the coordination of the master agent. They may autonomously communicate with one another, share project-specific data, resolve conflicts in task scheduling, and provide updates to the master agent or respective users.

The contextual data analyzed by the AI agent may include sensor outputs such as temperature, humidity, water leakage, vibration, or motion data; location data of workers and devices; weather forecasts; and operational schedules. For example, if a temperature sensor on the third floor indicates overheating, the AI agent may correlate this with HVAC logs, occupancy patterns, and device power usage, and generate a maintenance alert on the dynamic design plan. In another scenario, the AI agent may detect that a technician is taking longer than expected to perform a maintenance task—based on scheduled durations and observed delays—and autonomously initiate escalation workflows or interact directly with the worker's sub-agent.

In some embodiments, the AI agent may interact with external vendors and suppliers. Based on project needs and geolocation of workers, the AI agent may suggest or initiate procurement of materials, compare vendor prices, generate purchase orders, and track delivery schedules. For example, if the AI agent detects that a worker is near a supplier offering discounted tiles required for a repair task, it may issue an autonomous prompt, verify user permissions for transaction, and initiate the purchase process.

In construction site monitoring scenarios, the AI agent may control one or more on-site IoT devices such as cranes, power generators, or surveillance drones. A drone equipped with cameras may be autonomously launched by the AI agent to survey work progress, verify the presence of workers, detect safety violations, or document real-time site conditions. The video feed may be analyzed by the AI agent to detect anomalies, such as missing materials, improper installations, or potential hazards.

In some embodiments, the AI agent may render a virtual walkthrough of the building project, either from a design plan elevation or real-time camera feed simulation. A virtual avatar controlled by the AI agent may navigate through the layout and converse with the user, identifying components, explaining progress, or requesting decisions. For example, during remote inspection, a supervisor may instruct the AI to "show me the HVAC panel installation on the second floor," and the AI may navigate the virtual avatar to the corresponding location and provide a real-time update.

In further embodiments, the system comprises intelligent prioritization logic for managing tasks in sequence. If overlapping maintenance or construction tasks are detected, such as tile installation before leak repairs, the AI agent dynamically generates a task execution plan that accounts for dependencies, urgency, and potential work redundancy. Each task may be ranked, scheduled, and assigned based on current site status, labor availability, and material readiness.

The system also enables financial management by associating individual accounts with projects, labor teams, or material types. The AI agent may be granted autonomous decision rights for low-value transactions under a user-defined threshold, while higher-cost actions may be queued for user approval. For example, the agent may auto-approve a purchase for common fasteners but require approval for high-value orders such as electrical panels.

In maintenance applications, the AI agent may interface with a digital twin model of a building, updating it continuously based on real-time sensor data and inspection results. The agent may highlight faults, generate execution plans, and prioritize interventions. Tasks such as leak repairs, plastering, painting, and tile replacement may be sequenced based on urgency and environmental risk factors.

Additionally, the AI agent may engage in both active and passive listening. Active listening may occur when directly addressed, whereas passive listening allows the agent to extract context from ambient conversation. For example, if a worker mentions that a component was "difficult to install," the AI agent may investigate that installation task in project records and prompt the user for follow-up.

The system may also support two-way communication between users. For example, a contractor may command the AI agent to instruct an electrician who is currently near a store to purchase wiring supplies. The AI agent may generate a command, transmit it to the electrician's sub-agent, and provide verbal or visual instructions through that device's interface.

BRIEF DESCRIPTION OF THE DRAWINGS

The accompanying drawings, which are incorporated into and constitute a part of this specification, illustrate several embodiments of the present invention. Together with the description, these drawings serve to illustrate some aspects of the present invention.

FIGS. 13A-13D illustrate exemplary exemplary method steps that may be implemented in some embodiments of the present invention.

DETAILED DESCRIPTION

Figure 1A:
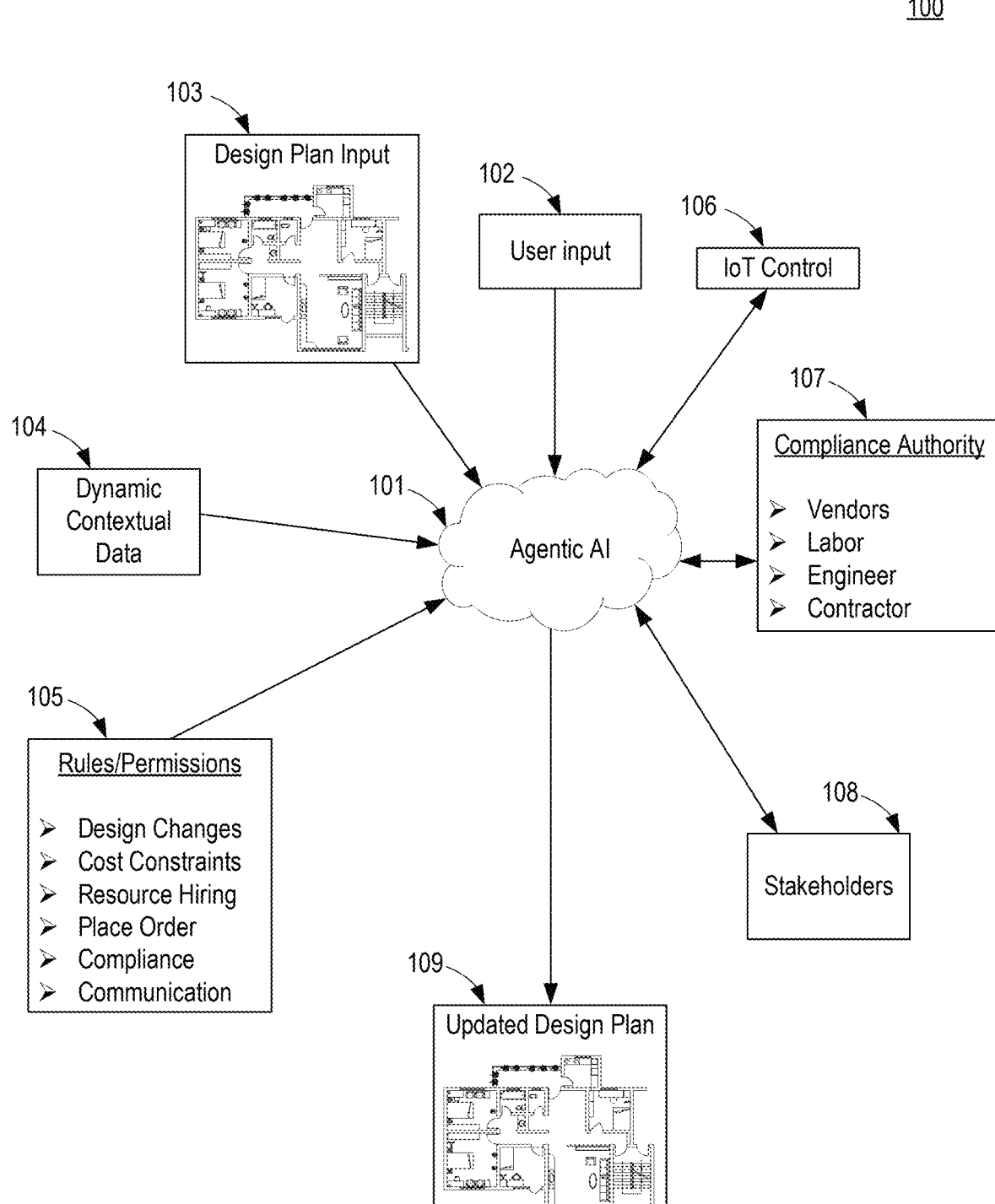
FIG. 1A illustrates an exemplary system for implementing Agentic AI across building processes including design, construction, and maintenance, as per some embodiments of the present invention.

The present invention provides systems, methods and apparatus for intelligent planning, monitoring, and management of building construction or maintenance projects using Agentic artificial intelligence (AI). In various embodiments, the invention facilitates a seamless, interactive environment wherein an AI agent executes on a controller to process a received design plan, interpret user interactions, assimilate contextual data from a variety of sources, and autonomously initiate project-related actions. The invention supports advanced collaboration between multiple users and intelligent agents while dynamically updating a building's design model in response to evolving environmental, operational, and user-driven conditions.

The design plan may include spatial layouts and a plurality of building elements such as structural components, plumbing fixtures, electrical panels, light fixtures, HVAC ducts, and safety systems. Upon receiving this design plan, the controller converts it into a dynamic interactive model composed of interactive components, each representing a corresponding building element. For example, a floor plan featuring a room may be rendered as an interactive object that users can select, annotate, or modify through an interface. Each such component is mapped to a digital representation that the AI agent can query, manipulate, or associate with metadata.

The contextual data processed by the AI agent may include live sensor inputs from IoT devices (e.g., cameras, temperature sensors, humidity sensors, leak detectors, occupancy detectors), location data for personnel or equipment, weather conditions, and calendar or scheduling inputs. For example, if IoT sensors detect increasing humidity near an HVAC unit, the AI agent may infer a possible fault, cross-reference historical logs, and annotate the associated area within the interactive model.

The invention supports a distributed architecture where the AI agent may function as a master agent while collaborating with multiple sub-agents, each operating on different stakeholder devices such as those of plumbers, electricians, or HVAC contractors. These sub-agents may manage domain-specific actions and communicate directly with one another or with the master agent. For example, a plumbing sub-agent detecting a delayed pipe installation may autonomously notify an electrical sub-agent if wiring is scheduled in the same area, avoiding schedule conflicts and improving task sequencing.

Embodiments may further incorporate real-time user interaction wherein users engage with the system through a multimodal interface accepting voice, text, and gesture inputs. An example includes a user verbally stating "move this here" while simultaneously tapping a window icon, prompting the AI agent to deduce the action context by correlating voice and touch inputs. Such mechanisms allow disambiguation of vague commands, enhancing interaction fluidity and precision.

The interactive user interface may render the design model along with real-time status indicators, construction simulation walkthroughs, and digital twin overlays. In some implementations, the AI agent may insert a virtualized avatar into a walkthrough environment to guide users, explain building elements, or highlight work progress. For example, during remote inspection, the virtual agent may narrate current site conditions and point out active maintenance zones.

In certain embodiments, the AI agent leverages geolocation data of users to generate context-aware actions. If a contractor is detected near a hardware supplier, the AI agent may scan project inventories and suggest procurement actions based on shortages or vendor offers. Similarly, the AI agent may detect that a second user (e.g., an electrician) is near an electrical store and prompt the user to purchase required items based on ongoing project needs.

Autonomous actions executed by the AI agent include generating task schedules, hiring contractors, procuring materials, issuing instructions to sub-agents, controlling machinery like cranes or HVAC units, and sending alerts. For example, upon identifying a cracked tile from image feeds, the agent may generate a prioritized maintenance plan, assess dependencies such as waterproofing, and place procurement orders for replacement tiles.

The AI agent may also monitor ongoing activities via video analytics and sensor data. If it determines that a worker is taking too long on a task—such as extended inactivity during HVAC maintenance—the agent may initiate escalation procedures like messaging the worker or notifying a supervisor. This adaptive behavior enhances responsiveness and project efficiency.

In scenarios involving multiple ongoing projects, the AI agent may manage project-specific accounts, allocate labor based on proximity or specialization, and control expenditures by auto-authorizing transactions below user-defined thresholds. It may also segment accounts per project, material type, or service category, allowing fine-grained financial control and audit trails.

The system architecture supports real-time collaboration between devices. A first user may communicate verbally with the AI agent, which may relay instructions to another user's device running a sub-agent. For example, a supervisor commanding a material pickup may trigger the AI agent to communicate with a technician en route, providing store location and procurement instructions.

Drone integration is another facet of the invention. The AI agent may autonomously dispatch a drone to inspect a site, record aerial video, analyze images, and take decisions such as activating a crane or logging hazard zones. Drones may operate periodically or based on detected anomalies, supplementing manual oversight.

In addition to command-based interactions, the AI agent may employ passive listening modes to extract actionable data from user conversations. For example, if a site manager mentions a leaking pipe in a casual conversation, the AI agent may cross-reference this statement with sensor logs and flag it for investigation, thereby augmenting human awareness.

Embodiments also enable predictive maintenance by analyzing long-term sensor trends. If structural sensors show vibration deviations or gradual thermal shifts, the AI agent may forecast possible faults and pre-emptively schedule diagnostics. Such foresight reduces downtime and cost overruns.

Through its multi-agent framework, the invention facilitates intelligent synchronization across trades. When overlapping tasks arise, such as plastering prior to leak repair, the AI agent reprioritizes activities and adjusts project schedules to avoid redundant or compromised work. Prioritization may be dynamically updated based on risk levels, dependencies, and environmental feedback.

Virtual walkthroughs generated by the system are context-sensitive and informative. As users traverse a simulated model or live video-based representation, the AI agent narrates element details, references progress metrics, and supports question-answer dialogs. This allows stakeholders to inspect work remotely and gain operational insights without physical presence.

The present invention provides systems, methods, and apparatus for Agentic Artificial Intelligence (Agentic AI), a framework for deploying goal-driven, contextually aware AI agents configured to operate autonomously or semi-autonomously during various phases of building lifecycle operations, including, but not limited to planning, construction, and maintenance. In some embodiments, the Agentic AI may be instantiated as a software component, program module, or algorithmic engine that resides on a local user device, embedded hardware controller, or remote cloud server, and is configured to receive inputs, execute processes, and deliver outputs based on intelligent reasoning across dynamic construction or maintenance scenarios.

In some embodiments, the Agentic AI may comprise one or more of: (a) a context engine configured to evaluate external and internal environmental conditions; (b) a task orchestration module for allocating and executing construction-related actions; (c) a communication interface for interacting with human users, software APIs, IoT-enabled equipment, and other AI agents; (d) a multimodal input processing module for interpreting verbal, textual, gestural, and interactive inputs; (c) a real-time decision logic engine; and (f) a sub-agent coordination module for managing or collaborating with distributed sub-agents across multiple user devices.

During the planning phase of a building project, the Agentic AI may receive a design plan comprising a spatial layout and plurality of building elements. In some embodiments, a design plan may be parsed by Agentic AI using a pre-trained parsing model or a neural architecture trained on prior architectural layouts to extract building element entities such as rooms, walls, electrical lines, HVAC ducts, and plumbing systems. The extracted information may be used to create a dynamic model comprising user-interactive components that correspond to the real-world fixtures or zones. For example, the Agentic AI may identify that a particular space represents a "bedroom," associate metadata with it (e.g., area, location, lighting requirement), and render this element as an editable component on a display interface.

The Agentic AI may then function as a virtual assistant during design iterations, interpreting vague or incomplete human commands using multimodal correlation. For example, if a user touches a window on the screen and simultaneously speaks, "Shift this to the west wall," the AI agent may interpret "this" as the selected window, and "west wall" by resolving directional metadata associated with the current design layout. The agent may then perform the intended adjustment in real-time and update the interactive model accordingly. In other cases, where no touch input is available, the Agentic AI may rely on contextual inference such as most recently selected object, proximity to cursor, or gaze tracking data.

In the construction phase, the Agentic AI may further serve as a real-time coordinator of tasks, resources, and worker teams. In one embodiment, the Agentic AI may function as a master controller overseeing multiple sub-agents, each executing on the device of a specialized stakeholder such as a plumber, electrician, HVAC technician, site supervisor, or labor contractor. Each sub-agent may be tailored to its domain and may communicate directly with the master Agentic AI to report task progress, request material allocations, or signal detected issues. For example, the sub-agent running on an electrician's device may automatically communicate to a master agent that wiring installation is complete, which may then trigger subsequent dependent actions such as wall plastering by another team.

In some embodiments, the Agentic AI may utilize event-driven architecture and event sourcing principles, wherein each task, user interaction, or data update is treated as an atomic event and appended to a chronological execution log. This log may be persistent and later accessed for auditability, rollback, or predictive modeling. Additionally, the Agentic AI may be configured to evaluate a decision tree or reinforcement learning model to identify optimal next actions based on current state and potential future states. For example, if tile installation is scheduled but a moisture sensor has detected leakage in the corresponding zone, the AI may prioritize plumbing repair and defer tiling to prevent material damage and cost duplication.

In some embodiments, the Agentic AI may initiate drone-based site monitoring, using computer vision to assess project status, detect delays, verify labor presence, or analyze risk exposure. Image streams captured by drone cameras (or Agent supported cameras, or cameras in a fixed position) may be analyzed in real-time or batch processed using image segmentation and object detection models to determine if, for example, electrical panels are installed on the second floor, or whether debris remains in zones marked for HVAC ducting. These visual cues may be overlaid onto a virtualized walkthrough accessible to remote users.

During maintenance phase operations, the Agentic AI may function as an interface between digital twin representations of the building and real-time sensor feeds. The AI may update the digital model in response to new data from leakage sensors, temperature probes, air quality monitors, or structural strain gauges. It may identify faults, forecast failures based on temporal data trends, and autonomously generate execution plans for maintenance personnel. In certain implementations, the Agentic AI may even interact with smart home devices or industrial controllers to shut down malfunctioning equipment, reroute power, or activate emergency systems based on decision policies.

Furthermore, the Agentic AI may manage financial thresholds, labor assignments, and procurement logistics. For example, when tile stock falls below a pre-set threshold in inventory, the AI may access vendor APIs, compare prices, initiate requisitions under a predefined monetary limit, and inform stakeholders via alerts. For amounts above threshold, it may request human approval through notifications on the interactive interface. The AI may also track location of team members and reallocate workforce dynamically—for example, rerouting idle painters from one site to another where delays are occurring due to shortage of labor.

Additionally, the Agentic AI may possess social reasoning capabilities, allowing it to passively listen for cues in ongoing conversations and generate helpful prompts. For example, if it detects a conversation between two users referencing a delay due to material unavailability, it may proactively pull supplier data, locate nearest vendors, and ask if it should initiate a procurement workflow. Likewise, it may prompt a subcontractor near a hardware store to pick up required materials based on location and current requirements in upstream tasks.

The Agentic AI may also simulate various project outcomes using generative adversarial networks (GANs). A GAN engine may be integrated or externally coupled to the AI framework to generate alternate layouts, visualize changes, or simulate environmental responses to design adjustments. In one embodiment, if a user verbally requests "show me what it looks like with skylights," the AI may dynamically update the model using GAN-generated imagery for the modified condition and render it on the interface.

Altogether, the Agentic AI forms an intelligent digital core of construction and maintenance operations, executing decisions with speed, accuracy, and data-awareness beyond traditional human oversight capabilities. It bridges user interaction, machine data, operational logic, and site-level control to deliver holistic automation and insight across building lifecycles.

In some embodiments, the terms "Agentic AI," "Agentic AI engine," "AI agent," "AI agent engine," or simply "AI engine" may be used interchangeably throughout this disclosure to refer to the same underlying computational component configured to perform intelligent decision-making, contextual processing, task automation, and communication with users and systems, regardless of the specific terminology used in different sections. These interchangeable terms collectively denote the software-implemented or hardware-accelerated module that executes the processes described herein, including but not limited to analyzing design plans, processing contextual data, interacting with users, coordinating tasks, and controlling on-site or remote systems in the planning, execution, and maintenance phases of construction projects.

In the following sections, detailed descriptions of examples and methods will be given. The description of both preferred and alternative examples, though thorough, are exemplary only. It is understood by those skilled in the art, that various modifications and alterations may be apparent and within the scope of the present invention. Unless otherwise indicated by the language of the claims, the examples do not limit the broadness of the aspects of the underlying invention as defined by the claims.

Referring to FIG. 1A, an exemplary system 100 is illustrated for implementing an Agentic AI 101 across building-related processes, including but not limited to design plan generation, construction-phase decision making, and post-construction monitoring and maintenance. The Agentic AI 101 may be instantiated on a wide variety of computing platforms, including a user device and/or one or more cloud-based servers. In some embodiments, the Agentic AI 101 may be distributed across multiple computational nodes and may function as a singular intelligent system or as a plurality of collaborative agents performing specific tasks under a coordinated framework.

In an embodiment, the user device (e.g., 115 shown in FIG. 1B) on which the Agentic AI 101 (may be referred to as AI agent) is executed may include, but is not limited to, smartphones, tablets, laptop computers, desktop computers, wearable computing devices (e.g., smart glasses or smart watches), or custom-built construction management devices. The user device may be adapted to provide both input and output functionalities and may further include a user interface for facilitating interactions between the human user and the Agentic AI 101.

The user device may comprise various input modules including, but not limited to, a touchscreen interface for receiving tactile inputs, physical buttons for command execution, a microphone for receiving voice commands, and a camera for capturing images, video, or QR-code-based data inputs. The touchscreen may allow for both free-form input (e.g., drawing layouts) and structured input (e.g., selecting options from a menu). In some embodiments, the user device may comprise speech-to-text modules for converting voice commands into structured data.

The user device may also include output modules such as a graphical display for rendering design plans, status updates, alerts, and other visual feedback; audio speakers for verbal alerts or instructions; and haptic feedback systems for notifying the user through vibrations. In some implementations, the graphical user interface may allow the user to switch between multiple projects, toggle between different stakeholders' perspectives, and track progress of various subsystems such as plumbing, HVAC, or electrical works.

Additionally, the user device may incorporate one or more processing circuitries including processors, co-processors, digital signal processors (DSPs), and graphics processing units (GPUs) for handling complex data operations, design rendering, and AI-based inferencing. The device may also include volatile and non-volatile memory units for storing input data, interim computation states, AI models, rulesets, and design plans.

The user device may be further equipped with a location tracking module such as GPS, GLONASS, or other satellite-based or terrestrial positioning systems to determine the current location of the user. This geolocation information may be used by Agentic AI 101 for triggering context-aware functionalities, such as suggesting a nearby hardware store for pending procurement tasks or identifying proximity to a construction site and subsequently activating project-specific dashboards, inspection protocols, or safety-related alerts. For example, upon detecting that the user device is within a predefined geofence surrounding a construction site, the Agentic AI 101 may initiate location-based routines such as syncing with on-site IoT systems, retrieving current project updates, or prompting the user to review a specific checklist prior to entry. In some embodiments, if the user is approaching a project that has recently experienced a delay or an unresolved compliance issue, the Agentic AI 101 may proactively display or audibly present the relevant updates and action items associated with that site.

Further, the geolocation data may be leveraged to automate check-in/check-out procedures for site workers, thereby maintaining accurate attendance records and enabling real-time tracking of labor resource availability. In another example, if a user's location is detected at a vendor or supplier premises, the Agentic AI 101 may automatically cross-reference pending material requirements across one or more active projects and prompt the user to consider fulfilling those needs during the visit. The system 100 may also access current inventory levels, pricing data, or supplier promotions via a connected vendor portal and present comparative procurement suggestions to the user.

In yet another embodiment, geolocation may be utilized to enforce access control protocols or escalate decision-making thresholds. For example, certain high-risk commands—such as initiating crane movement, altering structural load paths, or approving large material expenditures—may be restricted to users physically present on-site, as determined by the geolocation module. Conversely, for remote stakeholders such as architects or project owners, the Agentic AI 101 may utilize geolocation to filter communications or alerts, prioritizing those events occurring near their location or associated with their immediate oversight responsibilities.

Additionally, if the geolocation indicates that the user is in transit between two project locations, the Agentic AI 101 may optimize the route based on ongoing site needs, traffic conditions, or scheduled meetings. It may further aggregate time-sensitive updates from both sites and present a comparative status summary during transit to facilitate efficient field coordination. Thus, the geolocation data, when contextually interpreted, may enable the Agentic AI 101 to autonomously tailor its behavior, content delivery, and system interactions to match the real-world circumstances and priorities of the user.

In one or more embodiments, the user device may include communication modules or transceivers such as Wi-Fi, cellular (3G, 4G, 5G), Bluetooth, or near-field communication (NFC) for establishing secure and persistent communication links with cloud servers, IoT sensors, compliance authorities, and other stakeholder devices.

Referring again to FIG. 1A, the Agentic AI 101 may receive user input 102 through a plurality of modalities, including but not limited to verbal commands (captured via microphone and processed using speech recognition modules), textual commands (entered via keyboard or touch-screen), gestural inputs (detected via camera or touchscreen gestures), and visual inputs (e.g., image of a marked-up blueprint captured via camera).

The user input 102 may include structured queries such as "Generate a design plan for a 3BHK residential unit with a plot size of 1500 square feet, including one master bedroom, two regular bedrooms, a living room, and two bathrooms." The Agentic AI 101 may parse such queries using natural language processing (NLP) techniques, extract meaningful parameters, and generate an initial layout or design proposal based on predefined architectural standards, zoning regulations, and user preferences stored in the system.

In a further embodiment, the Agentic AI 101 may present the generated design plan to the user for review, and the user may issue refinement commands through additional user inputs 102. For example, the user may input: "Make the master bedroom larger by reducing kitchen space slightly," or "Add a study room near the living area." In response, the Agentic AI 101 may modify the layout accordingly, simulate structural feasibility, and regenerate a revised version of the plan.

User input 102 may also pertain to status inquiries related to ongoing construction projects. For example, a user may provide input such as "What is the status of plumbing work in project 001?" The Agentic AI 101 may parse this query and initiate a sequence of actions to obtain real-time or near-real-time status information.

In order to respond to such status queries, the Agentic AI 101 may communicate with stakeholder modules 108, which may include devices or systems operated by contractors, site supervisors, plumbers, electricians, and other labor resources. The AI agent 101 may query their systems for progress updates, task completions, and logged issues.

Alternatively, or additionally, the Agentic AI 101 may extract status information from IoT control modules (e.g., 106) deployed at the construction site. Such IoT (Internet of Things) control modules may include water flow sensors in plumbing systems, electrical current monitors, motion detectors, and occupancy sensors, which can be queried by the AI agent 101 to infer whether specific tasks have been completed or are currently in progress.

In a further embodiment, user input 102 may include directives to compare progress across multiple projects. For example, the input may read, "Compare HVAC installation progress across Project 001 and Project 003." The Agentic AI 101 may then initiate parallel queries to respective stakeholders 108 and/or IoT devices 106 associated with each project and provide a comparative status dashboard to the user (e.g., contractor, client, owner, or project manager).

In some embodiments, user input 102 may serve to trigger an event or decision within the design or construction workflow. For example, a user may input "Approve material purchase under $5,000 for Project 002," wherein the Agentic AI 101 may validate the authority of the user and proceed to communicate with a procurement subsystem to place an order or confirm the availability of items.

The Agentic AI 101 may also support conversational interactions. A user may initiate a dialog such as: "What was the last modification made to Project 004's electrical plan?" The AI agent 101 may then retrieve modification logs, version history, or timestamped entries from the database (e.g., 122 shown in FIG. 1C) and present a concise response via text, voice, or interactive UI.

In an alternative scenario, user input 102 may pertain to documentation and compliance verification. For example, a user may request: "Show me the compliance certificates received so far for Project 005." The Agentic AI 101 may then access stored certificates, sort them by category, and render them for display or download.

The system 100 may allow multi-modal input wherein a user combines voice and touch input. For example, a user may say "Zoom into the kitchen layout" while pinching on the touchscreen to zoom into a specific area. The Agentic AI 101 may be configured to interpret this combined input contextually. In one embodiment, the user may initiate a command by saying "Shift the dining table closer to the wall," while simultaneously dragging the table element on the display using their finger or stylus. The voice input provides semantic intent, whereas the touch gesture provides the spatial cue. The Agentic AI 101 may process both inputs concurrently, infer that the user wishes to reposition the dining table component within the virtual floor plan, and update the design in real time while maintaining alignment constraints, spatial clearances, and functional layout principles.

In another example, a user may say "Highlight all structural walls" while tapping on a portion of the floor plan. The Agentic AI 101 may recognize the command as a request to visually differentiate load-bearing walls from non-structural partitions. Based on the touch location, the system may further infer the user's area of focus and apply the highlighting selectively within that region. This type of multi-modal input allows the user to convey complex commands naturally and efficiently without navigating through multiple layers of menu options or manually selecting every element involved in the command. The combined use of gesture and speech enables fluid interaction, may particularly be beneficial in high-pressure or field environments where time and clarity are paramount.

In one or more embodiments, the Agentic AI 101 may support command disambiguation. If a user input (102) is vague, such as "Make the bathroom larger," the AI agent 101 may respond with a clarifying question like "Which bathroom do you want to enlarge-guest or master?" thereby maintaining a consistent dialogue.

The user input 102 may also include feedback regarding AI-generated outputs. For example, if a proposed layout does not meet the user's aesthetic preferences, the user may state, "This looks too crowded, remove one wall," upon which the AI agent 101 may provide multiple alternatives for achieving a more open look.

The Agentic AI 101 may employ historical data analysis based on user input 102. For example, if the user has consistently chosen larger kitchens in past projects, the AI agent 101 may adapt future designs to preemptively include larger kitchen layouts.

In some embodiments, user input 102 may contain conditional logic. For example, the user may state, "Only proceed with roof installation if HVAC ductwork is completed." The Agentic AI 101 may monitor the status of HVAC work via IoT inputs or stakeholder confirmations and execute conditional actions accordingly.

In certain embodiments, the Agentic AI 101 may employ machine learning to predict what the user input 102 is likely to be, based on usage patterns, project types, or environmental data, and may present pre-emptive suggestions to the user before input is explicitly provided.

The AI agent 101 may be programmed to support project-specific user profiles. Each user input 102 may be tagged with metadata such as user role (e.g., contractor, architect, client), authority level, and current task, allowing the AI agent 101 to respond appropriately and restrict or allow access to particular functionalities.

Additionally, user input 102 may be voice-authenticated. The microphone module of the user device may capture the vocal input and verify it against stored voiceprints before processing commands, adding an additional layer of security for sensitive operations like financial approval or compliance submissions.

In some embodiments, the Agentic AI 101 may support collaborative user input where multiple users contribute to a shared design or decision-making process. Each user's input may be logged, attributed, and merged through a consensus model or presented for ranked voting.

The Agentic AI 101 may also be configured to support error recovery in user input 102. For example, if a user accidentally deletes a portion of the design or provides a conflicting command, the AI agent 101 may prompt for confirmation or retrieve a prior version of the design plan from a version control system.

The user input 102 may be used to trigger simulation-based feedback. For example, the user may input, "Show me how sunlight will fall in the living room at 3 PM in summer," and the Agentic AI 101 may perform an environmental simulation and render the result visually or verbally.

In a further embodiment, user input 102 may be used to schedule inspections or generate reminders. For example, the user may say, "Remind me to review Project 007's plumbing on Monday," and the AI agent 101 may set a calendar event and issue a reminder.

The user input 102 may also relate to external system integration. A user may request, "Sync this project's plan with the municipal permit portal," and the Agentic AI 101 may prepare required documents and initiate data transmission through APIs or secure file transfer mechanisms.

The AI agent 101 may maintain contextual awareness of user input 102 across sessions. For example, if the user begins a conversation regarding Project 003's HVAC and revisits the subject later, the AI agent 101 may maintain continuity in discussion and recall previous exchanges.

In one or more embodiments, user input 102 may be linked to real-time alerts. For example, a user may say, "Notify me when cement delivery is late by more than two hours," and the AI agent 101 may monitor delivery schedules through integrated logistics systems and trigger alerts as instructed.

The Agentic AI 101 may employ interactive input validation. When receiving complex user input 102 such as "Design a multi-level parking facility under the building," the AI agent 101 may respond with follow-up questions to clarify required levels, vehicle types, load-bearing needs, and compliance codes.

In some scenarios, the user input 102 may involve inspection results. A user may upload annotated photographs or text reports, and the AI agent 101 may process the information to suggest corrective actions, mark the issue for follow-up, or notify relevant stakeholders.

In a further embodiment, the Agentic AI 101 may support user training and onboarding. Based on user input 102 indicating a request for help, e.g., "How do I generate an MEP plan?", the AI agent 101 may initiate a guided walkthrough, offer tips, or provide reference materials. The Agentic AI 101 may maintain logs of user input 102, classify them by intent and frequency, and generate usage analytics that inform system improvements or user productivity enhancements.

Further, the Agentic AI 101 may be configured to receive one or more initial design plans 103 from a variety of input sources and in a range of file formats. The design plan 103 may represent architectural blueprints, schematic diagrams, structural drawings, or system layout plans, including but not limited to electrical wiring, plumbing configurations, HVAC systems, and interior layouts. These design plans 103 may be received in digital file formats such as PDF, DWG, DXF, IFC, SVG, and BIM-compatible formats like RVT or IFCZIP. Additionally, design plan 103 may be received as raster or vector images such as PNG, JPG, or TIFF that have been scanned from physical documents. In one embodiment, the Agentic AI 101 may receive the design plan 103 through direct upload from the user device, while in another embodiment, the plan may be received via email attachment, cloud synchronization service, or real-time capture using a device-integrated or peripheral camera.

The Agentic AI 101 may further include optical character recognition (OCR), computer vision, or pattern recognition modules to extract relevant geometric, textual, and symbolic data from captured images or scanned documents. In one embodiment, the system 100 may allow a user to photograph a printed floor plan using a mobile device, after which the Agentic AI 101 may process the image, segment architectural boundaries, recognize room labels, and reconstruct the plan as a digitally manipulable file. In other embodiments, users may provide voice or text input along with the scanned or uploaded plan to clarify aspects such as intended scale, floor height, or plan orientation.

Once a design plan 103 is received, Agentic AI 101 may be configured to modify or update the plan based on user inputs 102, which may originate from a touchscreen interface, stylus, voice assistant, physical keyboard, or remote server. For example, a user may instruct, "Add a guest bedroom near the kitchen," or "Change the window dimensions in the master bedroom." Upon receiving such commands, Agentic AI 101 may reconfigure the layout accordingly and regenerate a design plan 109 that reflects the requested alterations, while maintaining necessary parameters such as spatial constraints and logical flow between rooms.

In addition to direct user commands (102), Agentic AI 101 may also receive control signals and feedback from IoT Control module 106. For example, sensors installed on a construction site may detect temperature, humidity, light levels, or structural shifts. Based on these real-time measurements, Agentic AI 101 may adjust the design plan 103 accordingly. In one embodiment, if an IoT sensor detects that a site area is consistently exposed to direct sunlight, the AI agent may propose adding shading structures or altering the window orientation in the updated plan 109.

In another embodiment, if a vibration sensor reports instability in a load-bearing structure, the AI agent 101 may respond by modifying the column placement or rerouting the beam system in the design plan 109. The IoT control 106 may further provide input from occupancy sensors, surveillance cameras, or smart construction equipment. This data may be analyzed by the Agentic AI 101 to recommend layout changes, resource rescheduling, or structural reinforcements.

Compliance Authority 107 refers to various external or internal regulatory entities or roles, such as vendors, labor managers, engineers, or contractors, who may impose constraints, approvals, or guidelines on design modifications. Agentic AI 101 may query or receive automatic compliance data such as local building codes, fire safety standards, zoning restrictions, or energy efficiency regulations. For example, if a contractor-linked compliance authority 107 reports a non-conformity with local setback requirements, the Agentic AI 101 may autonomously adjust the building perimeter to remain within acceptable limits.

In another embodiment, a vendor under compliance authority 107 may notify the AI system that a specific construction material has been discontinued or delayed. In response, the Agentic AI 101 may modify the design plan 103 to accommodate an alternate material of equivalent properties, update the design plan 109, and inform relevant stakeholders 108 of the modification.

Stakeholders 108 may include clients, property owners, site supervisors, investors, or any other project participants whose input or preferences may be incorporated into the design plan. Agentic AI 101 may receive preference settings or decision approvals from these stakeholders and integrate them into the design pipeline. For example, a stakeholder may prefer a more open floor plan or may request additional guest parking. Agentic AI 101 may update the spatial layout accordingly in the plan 109 and present a revised version for review.

The stakeholder 108 input may also involve prioritization of construction sequences. For example, if a client wishes to prioritize the completion of kitchen and bathrooms before other areas for early occupancy purposes, Agentic AI 101 may reconfigure project phasing data embedded in the design plan 109. In some embodiments, stakeholders 108 may communicate via remote user interfaces or mobile applications, allowing real-time decision-making and modification tracking.

Dynamic Contextual Data 104 may encompass a wide range of environmental, geographic, operational, temporal, and project-specific data collected in real time or near-real time. This input may originate from Building Management Systems (BMS), geographic information systems (GIS), weather APIs, site-based IoT infrastructure, and operational logs. Dynamic Contextual Data 104 may include variables such as wind direction, solar exposure, soil composition, current weather conditions, seismic activity, surrounding traffic noise, terrain slope, site water flow, and utility availability.

In one example, if the contextual data 104 indicates that the site is located in a flood-prone zone, Agentic AI 101 may propose elevation adjustments, water-resistant material selection, or drainage system integration. In another embodiment, if the contextual data suggests prevailing high temperatures, Agentic AI 101 may optimize HVAC system placement, suggest reflective roofing materials, or adjust window-to-wall ratios for thermal efficiency.

Dynamic Contextual Data 104 may also reflect resource utilization metrics, such as energy consumption, construction waste output, or water usage. If the system 100 detects that a building under construction has exceeded energy consumption thresholds, the Agentic AI 101 may revise lighting layouts or propose energy-efficient fixtures within the design plan 109.

During construction phases, the Agentic AI 101 may receive real-time contextual input 104 indicating worker occupancy levels, task progress, or material availability. For example, if contextual sensors report low material stock levels in a specific zone, Agentic AI 101 may initiate reallocation of material or suggest schedule adjustments to prioritize other areas until resupply occurs.

During post-construction or maintenance phases, Dynamic Contextual Data 104 may include operational performance metrics, fault detections, maintenance alerts, or user behavior analytics. If a recurring HVAC fault is detected through contextual monitoring, Agentic AI 101 may propose relocation, replacement, or design modification to the affected system in future construction projects or retrofits.

The Agentic AI 101 may further correlate contextual data 104 with temporal markers such as seasonal changes or project deadlines. For example, if an impending seasonal rainfall is predicted, and the building envelope is not yet sealed, the AI may reprioritize construction activities to weatherproof the site. Similarly, if a design change has been repeatedly proposed by multiple users or stakeholders during a specific time of year, such as increased ventilation needs during summer, the Agentic AI 101 may infer long-term adjustments to building specifications.

In embodiments where contextual data 104 may include real-time GPS and movement patterns, Agentic AI 101 may track the movement of construction personnel or equipment and identify potential inefficiencies or hazards. Based on this data, updates may be proposed in the design layout to streamline workflows, reduce congestion, or enhance safety compliance.

Agentic AI 101 may further integrate satellite imagery or drone-captured visual data as a form of contextual input 104. In such embodiments, the AI may analyze current site conditions such as excavation status, material spread, or structural assembly progress. Using computer vision techniques, the AI may compare these images with expected design plans and suggest updates to account for deviations or delays.

In another embodiment, contextual data 104 may include sensor data from utility infrastructure such as water pressure, electrical load, and gas leakage monitors. Agentic AI 101 may interpret this data to detect design inefficiencies or recommend adaptive systems like automated shut-off valves, alternate duct routing, or modular plumbing layouts in the updated design plan 109.

The system 100 may also collect contextual data 104 based on historical performance trends of similar projects. For example, if a certain wall insulation specification has been previously associated with poor thermal performance in a nearby geographic area, Agentic AI 101 may update the design plan 109 to incorporate a more thermally efficient alternative, leveraging machine learning modules trained on contextual history.

Furthermore, contextual input 104 may reflect ambient conditions experienced by on-site workers or occupants, such as air quality index (AQI), noise levels, or natural light access. If the AQI exceeds recommended thresholds, Agentic AI 101 may reconfigure ventilation strategies or suggest advanced air filtration integration.

Agentic AI 101 may also use contextual input 104 from smart wearables worn by site personnel. Data such as heart rate, fatigue level, or step count may be anonymously processed to detect overwork or unsafe operating conditions. Upon identifying such data trends, Agentic AI 101 may generate scheduling recommendations or notify stakeholders 108 to review current labor practices.

In yet another embodiment, if contextual data 104 indicates interference from nearby infrastructure projects (e.g., road works, crane operations), the Agentic AI 101 may delay specific construction tasks or reroute delivery schedules. This type of integration facilitates the coexistence of multiple construction ecosystems without operational conflict.

The design plan updates generated by Agentic AI 101 may be version-controlled, with contextual triggers and user decision logs appended to each version history. This allows future audits, traceability, and reuse of adaptive intelligence in subsequent projects.

Contextual data 104 may also be used for predictive forecasting. For example, if meteorological data suggests a prolonged heatwave or monsoon season, the Agentic AI 101 may preemptively revise construction schedules, shift material storage strategies, or recommend temporary structural supports.

In multi-phase projects, contextual data 104 may guide transition planning between phases. For example, if initial site work shows geological instability or soil erosion, Agentic AI 101 may flag risks to the upcoming structural phase and adapt the design for foundational reinforcement.

In some embodiments, the Agentic AI 101 may be assigned specific rules, roles, or permissions 105 which govern the operational boundaries and procedural autonomy of Agentic AI 101 during its functioning within system 100. The Rules/Permissions 105 may be implemented as a data structure, configuration file, or secured access control list maintained either locally within the user device hosting Agentic AI 101 or remotely on a cloud-based controller. These rules and permissions are configured to impose hierarchical, context-aware constraints on the AI agent's ability to act on behalf of various users, stakeholders, or organizational policies in the execution of design, construction, or post-construction maintenance workflows.

In some embodiments, the Rules/Permissions (e.g., module 105) may comprise predefined constraints for design plan modifications. Agentic AI 101 may be permitted to make autonomous design alterations only within a specified scope defined by an architect or project engineer. For example, if a user inputs a verbal command to "optimize bathroom layout," and the scope allows structural relocation of sanitary fixtures within the same area, Agentic AI 101 may process the command and automatically update Design Plan 103 without requiring approval. However, if the modification involves resizing or relocation beyond structural bounds, Agentic AI 101 may flag the change and seek human validation from an authorized user.

The Rules/Permissions 105 may further include granular definitions of cost constraints associated with AI-driven actions. These constraints may limit Agentic AI 101 to perform transactions, procurements, or service hiring only within authorized budget thresholds. For example, Agentic AI 101 may have autonomous permission to approve purchases up to USD 10,000 for materials such as rebar or insulation. For any transaction exceeding that amount, the AI may be required to escalate the action to the owner or contractor for confirmation via notification. Such escalation rules may also be subject to real-time override policies defined in module 105 based on urgency parameters or contextual risk assessment.

In some embodiments, the cost constraints in Rules/Permissions module 105 may be dynamic, i.e., adjustable in real-time by project stakeholders through a secure portal or authenticated voice command. For example, a contractor may verbally authorize an exception to allow Agentic AI 101 to place a USD 15,000 order due to time-sensitive supplier discounts. The updated rule may be stored in a transaction ledger and logged for audit compliance.

Resource hiring policies embedded within Rules/Permissions 105 may define the operational limits of Agentic AI 101 in initiating labor requests or engaging third-party services. For example, the AI agent may be allowed to autonomously hire laborers or technicians from a pre-approved vendor list based on project schedule lags or identified task bottlenecks. However, the AI may be restricted from hiring unverified external parties unless verified by a human supervisor. These permissions may include qualifications, certifications, or safety records as constraints in the AI's decision-making process.

Further, in the context of place order permissions, Agentic AI 101 may be configured to interact with vendor APIs, digital procurement platforms, or online B2B marketplaces. The Rules/Permissions 105 may specify the type, source, and frequency of order placements the AI agent is allowed to initiate. For example, Agentic AI 101 may automatically reorder electrical components such as LED fixtures from Vendor V1 if inventory levels fall below a threshold. The rules may also include blackout periods where procurement actions are restricted, or approval layers required when engaging new vendors.

The Rules/Permissions 105 may also govern compliance behavior for Agentic AI 101. This may include embedded references to building codes, safety regulations, zoning ordinances, and project-specific compliance parameters. Agentic AI 101 may be allowed to validate design changes or equipment installations against local compliance datasets. If a proposed design modification introduces non-compliance risk, the AI may be barred from executing it and instead notify designated authorities such as a site engineer or regulatory officer. The compliance validation behavior may be configurable and linked with regularly updated compliance authority data 107.

In addition to procedural permissions, Rules/Permissions module 105 may include structured communication protocols that define how, when, and with whom Agentic AI 101 is allowed to interact. For example, communication may be permitted only with verified stakeholder devices 108 and restricted during specified hours to prevent unauthorized interference. Communication logs generated by the AI agent may be automatically encrypted and stored in compliance with data governance policies.

In some embodiments, the Rules/Permissions module 105 may be personalized for each user or stakeholder category. A client may allow the AI to make aesthetic adjustments such as paint color recommendations, while a contractor may authorize structural layout changes. Each permission set may be role-based and stored in association with user identifiers, biometric authentication data, or digital tokens to manage access control.

The rules in the Rules/Permissions module 105 may further be conditionally triggered based on real-time data received via Dynamic Contextual Data 104. For example, if weather data indicates a high likelihood of rain, Agentic AI 101 may be restricted from scheduling concrete pouring tasks. Alternatively, permissions may be temporarily elevated if Agentic AI 101 identifies a supply chain disruption requiring fast rerouting of procurement processes.

The rule structures within the Rules/Permissions module 105 may be expressed using markup languages such as XML or JSON, or in policy definition languages compatible with enterprise systems (e.g., XACML). These policies may be centrally authored by an AI administrator or dynamically learned through supervised reinforcement techniques over time. Rule updates may be version-controlled and time-stamped to provide an immutable audit trail.

Agentic AI 101 may access Rules/Permissions 105 through secured API endpoints or embedded logic. In cloud-based implementations, this logic may be maintained on a controller node that syncs with user devices over a secure network. Permissions may be enforced at runtime through rule execution engines integrated into the Agentic AI's task scheduler or decision-making module.

In one embodiment, Agentic AI 101 may attempt to engage in a cross-disciplinary coordination action, such as reassigning a task from electrical to HVAC personnel. Rules/Permissions 105 may explicitly prohibit such task reassignment unless prior approval is granted from both trade leads. The AI agent may thus initiate a multi-party consensus sequence via digital forms or real-time messaging to fulfill the condition.

To support exception handling, the Rules/Permissions module 105 may also include fallback rules. If Agentic AI 101 encounters a blocked operation due to a rule violation, it may attempt an alternative action, notify a human supervisor, or propose a compromise solution. For example, if a structural beam cannot be relocated without violating engineering permissions, the AI may suggest rerouting ductwork instead.

The AI's interaction with stakeholders 108 may be conditioned on language preferences, communication method preferences, or availability constraints defined in the Rules/Permissions 105. For example, if the rules specify that a subcontractor only accepts SMS notifications outside business hours, Agentic AI 101 may automatically convert task alerts to SMS format during those hours.

In another embodiment, permissions may define the AI's autonomy in visual processing tasks. If integrated with site cameras or drones, Agentic AI 101 may be permitted to identify delays, hazards, or material depletions but not to initiate equipment halts without supervisory consent. These limits may be enforced through real-time checks against permissions configured in module 105.

The Rules/Permissions 105 may also define escalation logic. If Agentic AI 101 reaches a predefined threshold of unresolved issues, it may be required to compile a summary and escalate the case to a supervisory dashboard. Escalation may be based on time elapsed, resource consumption, or risk score calculations.

Agentic AI 101 may further interpret conditional permissions. For example, it may have authority to generate design variations only if those variations reduce project cost or environmental footprint. These conditions may be assessed using Dynamic Contextual Data 104 and predefined thresholds stored in the Rules/Permissions 105.

The permissions framework may also support inter-agent governance. If multiple Agentic AIs operate in a federated network, permissions in the Rules/Permissions 105 may define data sharing policies, authority levels, and override protocols between AI instances. For example, a primary AI may override a subordinate AI's decision if flagged as high priority.

Rules within the Rules/Permissions 105 may extend to data privacy constraints. Agentic AI 101 may be barred from transmitting user location data or personal preferences unless explicitly authorized under data use permissions. This can help the AI operate in compliance with regulatory frameworks such as GDPR.

The permissions may also define parameters for temporal behavior. For example, Agentic AI 101 may be granted wider autonomy during off-hours when human supervision is unavailable. Conversely, permissions may restrict AI activity during peak working hours to avoid interference.

In systems involving multiple concurrent projects, the Rules/Permissions 105 may include project-specific permissions. Agentic AI 101 may have wide decision-making freedom in a small renovation project, but limited autonomy in a multi-story building construction project. Permissions may be selected from templates or configured manually per project.

In some implementations, the Rules/Permissions 105 may allow simulation mode execution. Agentic AI 101 may simulate its intended action and present it to stakeholders for feedback. Based on feedback, the rule may be confirmed, adjusted, or revoked. Rules/Permissions 105 may also encode behavioral ethics constraints. For example, if a design suggestion increases square footage at the cost of fire safety compliance, Agentic AI 101 may reject it outright. Ethical logic gates may be built into the AI's decision trees to filter out actions in violation of architectural best practices.

In embodiments involving multilingual support, permissions may define the language for AI's outgoing messages depending on recipient profile. Agentic AI 101 may automatically translate warnings or reports before dispatch. The permissions framework may support adaptive learning. If Agentic AI 101 receives repeated override feedback from a stakeholder regarding a type of procurement, the Rules/Permissions 105 may allow the system 100 to adjust its default thresholds or decision paths accordingly.

In some examples, Agentic AI 101 may be allowed to access external regulatory databases, pricing indices, or weather feeds only if such actions comply with permissions defined in the Rules/Permissions 105. Any unauthorized attempt may be logged and denied by the access control engine.

In further embodiments, permissions in the Rules/Permissions module 105 may allow Agentic AI 101 to interact with robots or automated construction machinery only if dual-authenticated. For example, if the AI agent 101 intends to initiate crane movement, a biometric confirmation may be required from the site supervisor.

The Rules/Permissions 105 may also define confidence thresholds. Agentic AI 101 may only act if its internal model confidence exceeds a defined threshold. For example, a material defect detection action may be permitted only if the AI's certainty score is above 85%. In embodiments where AI agent 101 is integrated with financial software, the Rules/Permissions 105 may limit visibility to balance sheets or authorize invoice generation only under strict role-based access.

In a safety-focused implementation, permissions may define AI behavior during emergencies. Agentic AI 101 may bypass certain rules to initiate evacuation protocols or alert emergency services if IoT Control 106 indicates unsafe gas levels or fire hazard. The Rules/Permissions 105 may include lifecycle constraints. Agentic AI 101 may be allowed to act autonomously only during certain project phases (e.g., design and early construction), and automatically revert to read-only mode during final inspections or legal review. This helps define clear boundaries for AI intervention across the full lifecycle of construction.

Figure 1B:
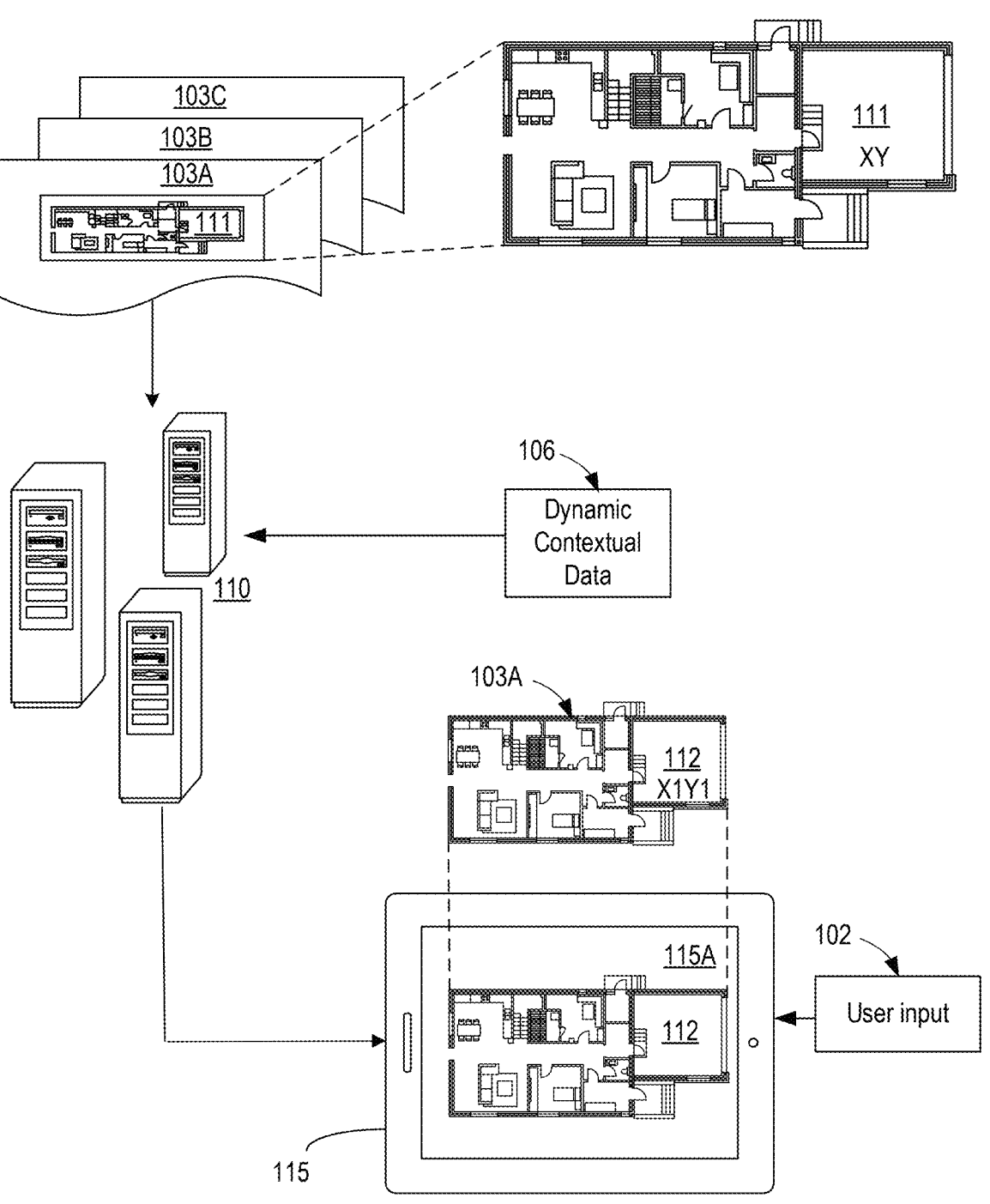
FIG. 1B illustrates an exemplary system for autonomous design plan generation and modification based on dynamic contextual data and user inputs, in accordance with some embodiments of the present invention.

Referring now to FIG. 1B, an exemplary system is illustrated for autonomous design plan generation and modification based on dynamic contextual data 106 and user inputs 102, in accordance with some embodiments of the present invention. As shown, the system of FIG. 1B is configured to receive a plurality of design plans 103A-103C for one or more construction projects and autonomously update said design plans using a controller 110 that operates within a user device 115. The user device 115 may include, but is not limited to, a tablet, smartphone, laptop, desktop terminal, wearable computing device, or embedded control panel integrated into construction site hardware. The user device 115 may be configured with an interactive user interface 115A and various internal modules such as display drivers, processing units, memory, communication interfaces, sensor interfaces, and localization components. The controller 110 may execute software modules configured to run an Agentic AI engine (such as AI agent 101 described in FIG. 1A) and a GAN engine, enabling the system to intelligently generate, revise, or propose design plans based on evolving inputs.

The controller 110 may receive one or more design plan inputs 103A-103C, which may be provided in various formats including but not limited to digital CAD files, BIM models, scanned blueprints, annotated image files, PDF-based floor plans, or sketches captured through the user device camera. These inputs may be manually uploaded by users or automatically retrieved from project databases or cloud repositories. As illustrated, one of the design plans 103A may define a space such as a hall 111 having dimensions XY. The Agentic AI engine operating within controller 110 may process contextual indicators—such as local climate data, usage frequency patterns, or building codes retrieved from contextual data module 106—and generate an updated design plan 103C in which the previously defined space 111 is modified to a new space 112 having dimensions X1Y1. Such modifications may result from predictive or optimization models aimed at improving thermal regulation, spatial utilization, or adherence to updated standards.

In some embodiments, the Agentic AI 101 may receive a user input 102 instructing a design modification. For example, a user may verbally state or type, "Increase the hall space to accommodate 20 guests for indoor gatherings," which is interpreted through the user interface 115A and processed by controller 110. In this scenario, the AI engine determines whether the expansion can be performed without infringing on structural constraints, available area, or other spatial allocations within design plan 103A. If permissible under a set of rules/permissions such as 105 (from FIG. 1A), the updated design plan 103C may be generated with hall 112 having adjusted dimensions X1Y1 and reallocation of adjacent areas, such as shrinking a nearby corridor or merging underutilized space.

The Agentic AI engine may utilize the GAN engine (separately configured or integral part of Agentic AI engine) to simulate various spatial permutations before finalizing the plan update. The GAN engine may comprise a generator model trained on thousands of previously approved design plans to synthesize viable alternatives, and a discriminator model tasked with validating such alternatives against regulatory compliance standards, structural logic, and ergonomic feasibility. By iterating between the generator and discriminator, the GAN engine may output one or more candidate floor plan variations, among which the most contextually appropriate one may be selected as updated design plan 103C.

In another embodiment, user input 102 may involve a request to convert a residential room into a workspace. The input may be a natural language request, such as "Convert the spare bedroom into a home office with maximum daylight exposure." The Agentic AI 101, in cooperation with the GAN engine and controller 110, may analyze the orientation of the building (e.g., retrieved from GPS modules or stored metadata), determine which rooms have access to optimal sunlight, and reconfigure the internal partitioning, furniture layout, or window positioning in the updated design plan 103C to meet the functional objective. The result, displayed on interface 115A, may include space 112 redefined in form and dimension (e.g., X1Y1) for improved daylight utility.

Dynamic contextual data 106 may comprise a wide variety of real-time or historical datasets, such as weather forecasts, climate profiles, air quality indices, urban density, compliance zone alerts, material availability, pricing fluctuations, labor resource schedules, noise restrictions, and ongoing service utility disruptions. For example, during the monsoon season, contextual data 106 may include precipitation probabilities which the Agentic AI 101 processes to raise floor levels or include better drainage in newly updated floor plan 103C. Similarly, a region prone to heatwaves may cause the GAN engine to automatically incorporate additional shading elements or modify wall thicknesses in particular spaces such as hall 112.

In further embodiments, dynamic contextual data 106 may affect design parameters at a micro level. For example, sensor data from the building site indicating persistent moisture at a specific location may lead Agentic AI 101 to adjust the flooring material in a particular room, modify the drainage gradient, or move electrical lines to a dryer zone. Such feedback loops enable continual refinement of the design plan 103C, even after initial approvals.

User device 115 may further be used by architects, engineers, project managers, or even clients to issue design feedback in real-time. The device may receive gestural, verbal, or stylus-based input to select particular regions of the design plan 103A displayed on the interface 115A. The selected area may then be flagged for contextual reassessment. In one example, a contractor using the interface may highlight a staircase and verbally comment, "This landing is narrow." The Agentic AI 101 would analyze the current dimension, compare it against ergonomic standards embedded in its rule set, simulate possible enlargements using the GAN engine, and present updated design alternatives on interface 115A.

In another embodiment, user input 102 may request a sustainability upgrade. For example, the user may provide input such as "Make this layout solar-friendly." In response, the Agentic AI 101 may assess rooftop orientation, structural support for solar panels, local solar exposure data from contextual input 106, and regional incentives for renewable installations. The resulting update in design plan 103C may include south-facing roof configurations, panel slots, battery storage spaces, and inverter placements, along with updated wiring schematics to match.

The system may also receive design plan inputs 103B and 103C corresponding to alternative proposals or different stages of the same project. For example, design plan 103A may represent a conceptual layout, 103B a regulatory-compliant revision, and 103C a construction-ready blueprint. Each of these may be versioned and stored within the controller 110, along with metadata indicating the source, user approvals, and applicable constraints. Updates applied to one plan may be selectively propagated to other versions based on the user's instructions or rule-set precedence.

The GAN engine executed by controller 110 may also propose layout modifications to respond to occupancy or lifestyle changes. For example, contextual input 106 may indicate a shift in household demographics (e.g., through smart home device usage logs), prompting Agentic AI 101 to suggest combining two rooms into a suite or separating a large room into smaller private zones. Such modifications may be made visible on interface 115A and accepted or declined by the user.

Figure 1C:
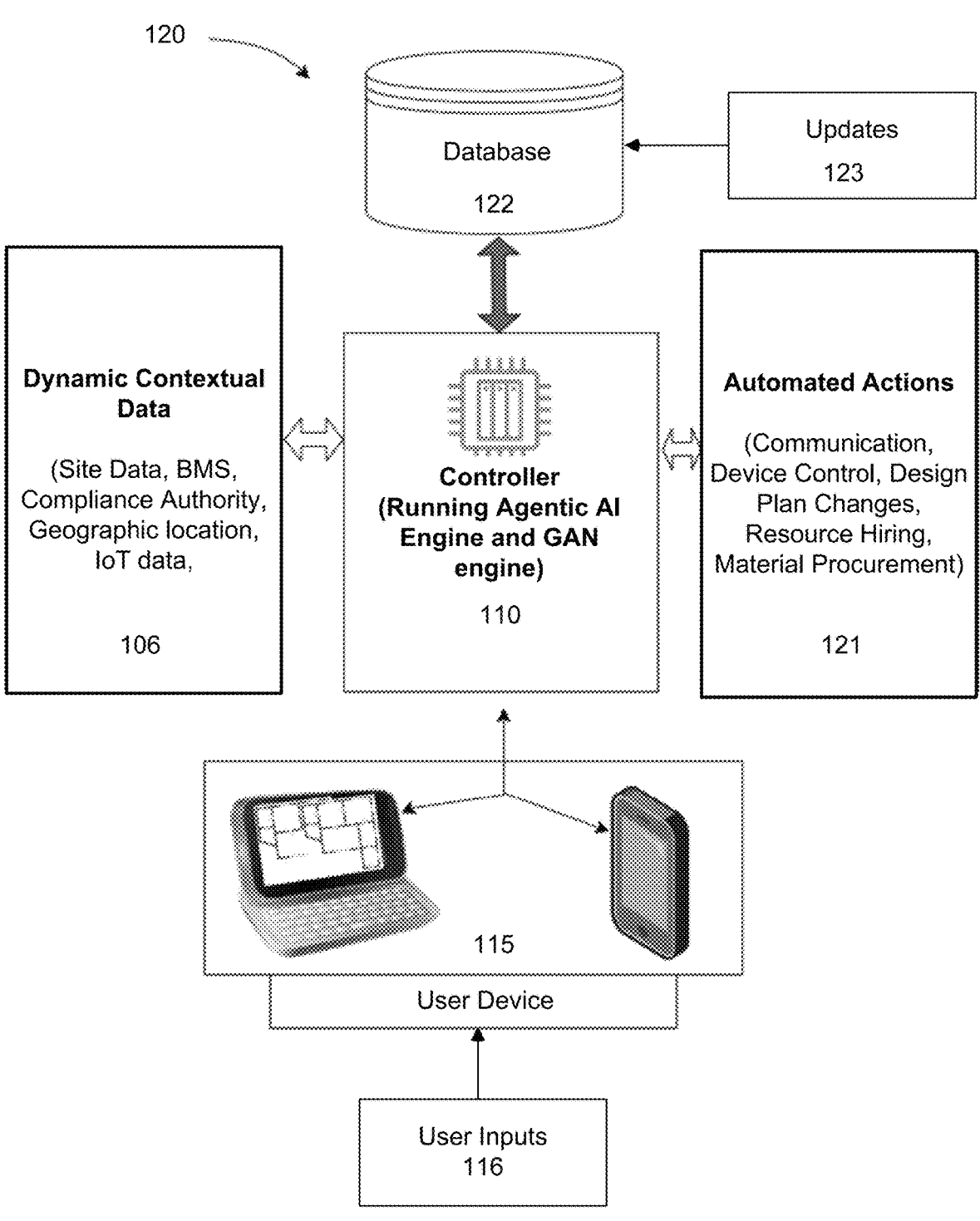
FIG. 1C illustrates an exemplary system architecture for executing automated actions through a controller running an Agentic AI engine based on dynamic contextual data, user inputs, and database updates, in accordance with the present invention.

Referring now to FIG. 1C, an exemplary system architecture 120 is illustrated for executing automated actions 121 via a controller 110 configured to run an Agentic AI engine and/or a GAN engine, in accordance with embodiments of the present invention. The controller 110 may operate from within a user device 115 or in communication with one or more cloud-based services. The architecture 120 may comprise interconnected modules and data flows between dynamic contextual data 106, user inputs 116, a database 122, updates 123, and an output block representing automated actions 121.

The controller 110, as shown in FIG. 1C, may be implemented as a processing unit within the user device 115 and/or on a remote computational server. The controller 110 may receive real-time or asynchronous input data from various input modalities including textual, verbal, gesture-based, and camera-captured interactions received from the user via the user device 115. The user device 115 may include mobile phones, tablets, laptops, wearables, or other computing platforms with embedded sensors, processing circuitry, transceivers, and I/O interfaces.

The dynamic contextual data 106 may comprise inputs derived from real-time sensors, environmental data, compliance parameters, IoT device statuses, BMS interfaces, site-specific conditions, geographic data, weather feeds, and additional location-aware metadata. These inputs may be continuously or intermittently transmitted to the controller 110 to generate contextual awareness, which influences automated decision-making processes.

The database 122 may be a local storage or a cloud-hosted repository and may store structured and unstructured data associated with prior and ongoing construction projects. The stored contents may include, but are not limited to, architectural and structural design plans, material catalogues, material vendor listings, stakeholder communications, contractor schedules, equipment status logs, maintenance records, regulatory compliance logs, cost data, historical user interactions, reinforcement learning datasets, rules and permissions configurations, approved vendor details, as well as user-defined thresholds for spending, timing, or material selections.

The database 122 may also maintain dynamic updates 123 received through an update stream, which continuously or periodically refreshes the contents of the database 122 with information such as market prices of materials, labor availability, compliance code revisions, new vendor onboarding, equipment firmware updates, seasonal adjustment parameters, and sensor calibration data. These updates may be integrated into decision-making by the controller 110 to increase precision and relevance.

The controller 110 may employ the GAN engine to simulate and generate alternate design plans, predictive schedules, or material substitution strategies by learning from historical trends stored within the database 122. For example, if a specific layout plan for a bathroom is found to be spatially inefficient based on prior project records and complaints logged in the database, the GAN engine may synthesize alternative configurations for better flow or accessibility.

Automated actions 121 may be initiated autonomously by the Agentic AI engine within controller 110 based on real-time evaluations and historical data matches. These actions may include, but are not limited to, initiating a purchase order for a material that is trending toward a price increase, issuing commands to reconfigure HVAC control through an IoT network in anticipation of a weather change, sending digital permits to compliance authorities, or scheduling on-site inspections in response to structural deviations flagged by embedded sensors.

In one embodiment, the Agentic AI within the controller 110 may access database 122 to determine that vendor V1 has increased the cost of steel beams by 10%. Cross-referencing this update with a pending foundation layout in a current design plan, the AI agent may autonomously replace V1 with vendor V2 who is offering a lower price and issue a purchase order through automated action block 121.

Another embodiment may involve automated rescheduling of tasks. For example, if real-time weather data from dynamic contextual data 106 indicates an impending storm, the controller 110 may access design plan timelines stored in the database 122 and determine that a concrete pour scheduled for the next day should be postponed. Consequently, the Agentic AI (e.g., 101) may trigger a notification to all, or concerned stakeholders (108) and reschedule the task autonomously.

In further embodiments, if a user input 116 asks "Which part of the HVAC system is underperforming?", the controller 110 may analyze BMS sensor values from dynamic contextual data 106 and retrieve maintenance logs and efficiency thresholds from database 122. If compressor output values are lower than standard for a sustained period, the controller 110 may initiate an automated action to generate a service ticket or notify the maintenance vendor.

The automated action 121 may also include generation of compliance documentation. Suppose database 122 includes revised fire safety norms updated via updates 123, and the design plan in execution still uses outdated spacing parameters for emergency exits. The controller 110 may autonomously modify the design layout or trigger a compliance alert for human review.

In another embodiment, if database 122 stores a rule that no procurement over USD 5000 should proceed without owner approval, and user input 116 authorizes a general material purchase but omits specific values, the Agentic AI engine in controller 110 may split the order into batches to comply with internal rules while proceeding with urgency.

The controller 110 may also generate alternate procurement schedules in response to dynamic changes. For example, if dynamic contextual data 106 indicates that a specific material required for flooring is in short supply due to a local logistics strike, and database 122 suggests past projects have used an alternative vinyl product under such constraints, the Agentic AI engine may autonomously draft a new material list, update the design accordingly, and communicate changes to stakeholders.

The system 120 allows for reusability of past project learnings. If a specific sub-contractor was flagged in database 122 for repeated delays in HVAC installations in earlier projects, and dynamic contextual data 106 may include that the same contractor is currently assigned, the Agentic AI may either alert the user via device 115 or initiate reassignment through automated actions 121.

If a design plan includes sensor data on moisture levels that exceed recommended thresholds in basement areas, the controller 110 may identify a risk of structural weakening. Based on materials stored in the database 122 and prior remediation logs, the controller may automate an action that suggests an alternate waterproofing solution, notifies relevant authorities, and schedules the rectification activity.

In some embodiments, database 122 may include user preferences such as preferred brands, eco-friendly certifications, or vendor partnerships. When generating procurement decisions or layout adjustments, the Agentic AI engine may take such preferences into account to conform outputs to user standards.

Updates 123 may also include regulatory changes. For example, if a new local ordinance prohibits lead-based paint in residential projects, and the stored material list for a current project includes such paint, the controller 110 may autonomously update the list and issue corrective purchase orders or notifications.

The controller 110 may be configured to analyze occupancy sensor data received through dynamic contextual data 106. If repetitive high footfall is detected near a specific corridor area, the GAN engine may generate an expanded layout for that corridor and push the update into the design through automated action 121.

In another embodiment, the Agentic AI engine may automatically calibrate HVAC settings during construction staging based on human presence detection and real-time thermal imaging inputs forming part of dynamic contextual data 106.

Automated actions 121 may include submission of digital requests to city planning portals based on pre-populated permit forms generated by the Agentic AI engine. The forms may be populated using metadata stored in the database 122 and user-inputted project names, locations, and architects' credentials.

The controller 110 may implement predictive forecasting models trained on historical datasets maintained within database 122 to estimate cost overruns or time delays. When thresholds are breached, the Agentic AI engine may automatically send alerts to project managers or reallocate internal resources.

In some embodiments, the Agentic AI engine operating within the controller 110 may execute automated actions 121 based on one or more contextual triggers derived from dynamic contextual data 106, user inputs 116, or continuously updated database entries 122. These automated actions 121 may include direct control of site-based machinery, autonomous drone deployment for real-time site inspections, manipulation of on-field IoT devices for situational status capture, and geolocation-based logic for initiating task workflows. The system architecture 120 may be configured to recognize combinations of environmental and operational signals that justify independent AI-driven action, without necessitating explicit user prompts.

For example, the controller 110 may receive contextual inputs 106 that include vibrations or unusual movement patterns detected from sensors affixed to a foundation crane or other structural machinery on the construction site. Based on such data, and correlating with historical incident records stored in the database 122, the Agentic AI may autonomously initiate a safety check protocol by pausing the machine and engaging an on-field camera system to visually assess the surrounding area. Simultaneously, a remote alert may be issued to the supervisory contractor's user device 115 via a text or voice interface, while a diagnostic command is dispatched to the equipment's internal controller to retrieve system error logs.

In another embodiment, the Agentic AI may autonomously launch a drone from a charging bay or fixed base station upon detecting adverse air quality or low-visibility conditions through environmental sensors integrated in the contextual data 106. The drone may be equipped with multispectral cameras and transmit a live feed to the controller 110, allowing the system to cross-reference image data with expected site conditions stored in the database 122. If the AI detects water accumulation or wind damage to rooftop materials, it may automatically initiate rescheduling of tasks involving elevation work, while notifying vendors via automated communication pathways to delay supply deliveries dependent on weather clearance.

In some configurations, the Agentic AI may track worker location in real time through wearable GPS tags or device geolocation services. Suppose the AI determines that two distinct teams—say, a wiring crew and a flooring crew—have entered the same physical zone within the structure (e.g., a designated hall or utility corridor). The AI may cross-check the construction sequencing logic from stored project guidelines in database 122 and determine that these tasks must be staggered to avoid conflict. As an automated action 121, the AI may communicate a hold order to the flooring crew via device 115, suggesting a delay or reassignment, while simultaneously optimizing the schedule for the wiring crew to continue uninterrupted.

In a further embodiment, the controller 110 may leverage geofencing to execute localized policy enforcement. For example, when a supervisory architect enters a designated zone near a newly erected structural beam, the AI may automatically trigger a compliance overlay on the architect's augmented reality (AR)-enabled glasses or tablet, showing relevant structural code references or flagged discrepancies previously detected by drone scans or BIM model deviations. The AI may also record the architect's viewing behavior or annotations, using that as implicit feedback to refine its future compliance alerting logic.

As another example, suppose that a power generator integrated into an on-site smart grid indicates rising heat levels through its IoT interface, reflected in the contextual data 106. Without requiring human input, the Agentic AI may first command a nearby PTZ camera to focus on the generator, initiate a fan or cooling unit via remote control, and issue a temperature regulation command to the local BMS (Building Management System). If these actions do not yield a satisfactory drop in temperature within a preset interval, the AI may escalate by contacting a technician through automated messaging or even scheduling a repair order with a preferred vendor, as derived from the vendor details stored in database 122.

In some embodiment, the present invention provides an apparatus (115) configured to assist in the intelligent planning, monitoring, and management of building construction or maintenance projects using Agentic AI. In some embodiments, the apparatus (115) may comprise a display screen configured to render an interactive user interface that enables a user to view and interact with building plans, workflows, task updates, and system notifications. The apparatus (115) may also include a digital storage medium storing executable software instructions, and a controller comprising a processor configured to execute the stored instructions. When executed, the software instructions cause the processor to perform a sequence of operations necessary to support AI-assisted construction and maintenance workflows.

The apparatus (115) is configured to receive a design plan of at least a portion of a building. The design plan may be received in the form of a 2D CAD drawing, 3D architectural model, Building Information Model (BIM), or even a scanned hand-drawn layout. The design plan may include a spatial layout that maps rooms, levels, corridors, and other architectural structures, as well as a plurality of building elements such as doors, windows, electrical outlets, plumbing fixtures, HVAC vents, load-bearing walls, ceilings, staircases, and sensor-embedded structural nodes.

Once the design plan is received, the processor converts it into a dynamic interactive model. The dynamic interactive model may be rendered as a live, navigable simulation or a 2D/3D graphical interface that allows users to engage with individual components of the building design. Each building element may be represented as an interactive component that a user may click, touch, speak about, or otherwise select for modification, review, or monitoring. These components are augmented with metadata such as installation date, vendor information, warranty status, maintenance history, and connectivity status to IoT or sensor systems.

The apparatus (115) may further be adapted to receive contextual data from one or more external sources. These sources include, but are not limited to, a BMS, which aggregates sensor outputs from inside the physical building; external IoT devices such as motion detectors, HVAC controllers, leakage sensors, and smart meters; real-time geolocation data of users such as on-site workers, supervisors, or vendors; current weather forecasts relevant to the construction site; digital listings from nearby or partnered material vendors; and scheduling or calendar events related to inspections, deliveries, or shift assignments.

Upon ingesting the contextual data, the processor initiates an AI agent to perform analytical operations. The AI agent evaluates the received design plan and the contextual inputs in tandem to determine actionable insights. For example, if a weather forecast predicts heavy rainfall, and the design plan includes ongoing roofing work, the AI agent may recommend rescheduling that portion of the work. Similarly, if geolocation data shows that a plumber is near a supplier of fixtures that are known to be required in upcoming installations, the agent may prompt the worker or their supervisor accordingly.

The interactive user interface may be generated and displayed on a first user device, such as a mobile phone, tablet, laptop, or AR headset associated with a first user. This interface displays the dynamic interactive model with overlays of sensor status, alerts, work progress markers, and real-time changes. The user may interact with this interface via verbal commands (e.g., "show electrical plan for second floor"), textual entries (e.g., specifying quantities of materials), or gestural inputs such as touching a screen element or using AR hand motion.

The AI agent receives these user interactions and interprets them using natural language processing and correlation techniques. In one example, if a user verbally says "move this near the west wall" while pointing at a window element, the AI agent can correlate the verbal "this" with the user's gestural selection, thereby correctly understanding the ambiguous instruction. The agent disambiguates intent using both the input type and the current system state, including prior commands and ongoing context (e.g., which room the user is currently viewing).

Once the user's intent is determined, the AI agent initiates one or more actions. These actions may include generating a procurement order for materials from vendor listings stored or linked in the system; scheduling personnel such as electricians, masons, or painters based on task dependencies; modifying the digital design plan to reflect updates requested by the user or necessitated by on-site conditions; or transmitting task-specific instructions to the first user or another stakeholder, such as a subcontractor or vendor.

In some embodiments, the apparatus (115) may further support autonomous equipment control, where the AI agent issues commands to on-site machinery such as cranes, lighting systems, or HVAC units. For example, if a site inspection is scheduled during evening hours, the AI agent may preemptively activate floodlights at the relevant section of the site.

This apparatus (115) offers a scalable and adaptive solution to centralize and automate construction-related decision-making by converting static plans into dynamic systems capable of context-aware responsiveness. The AI agent thus acts not only as a passive monitor but as an active participant in construction and maintenance management, facilitating real-time coordination, predictive planning, and multi-party interaction across the digital and physical components of a construction project.

Figure 2:
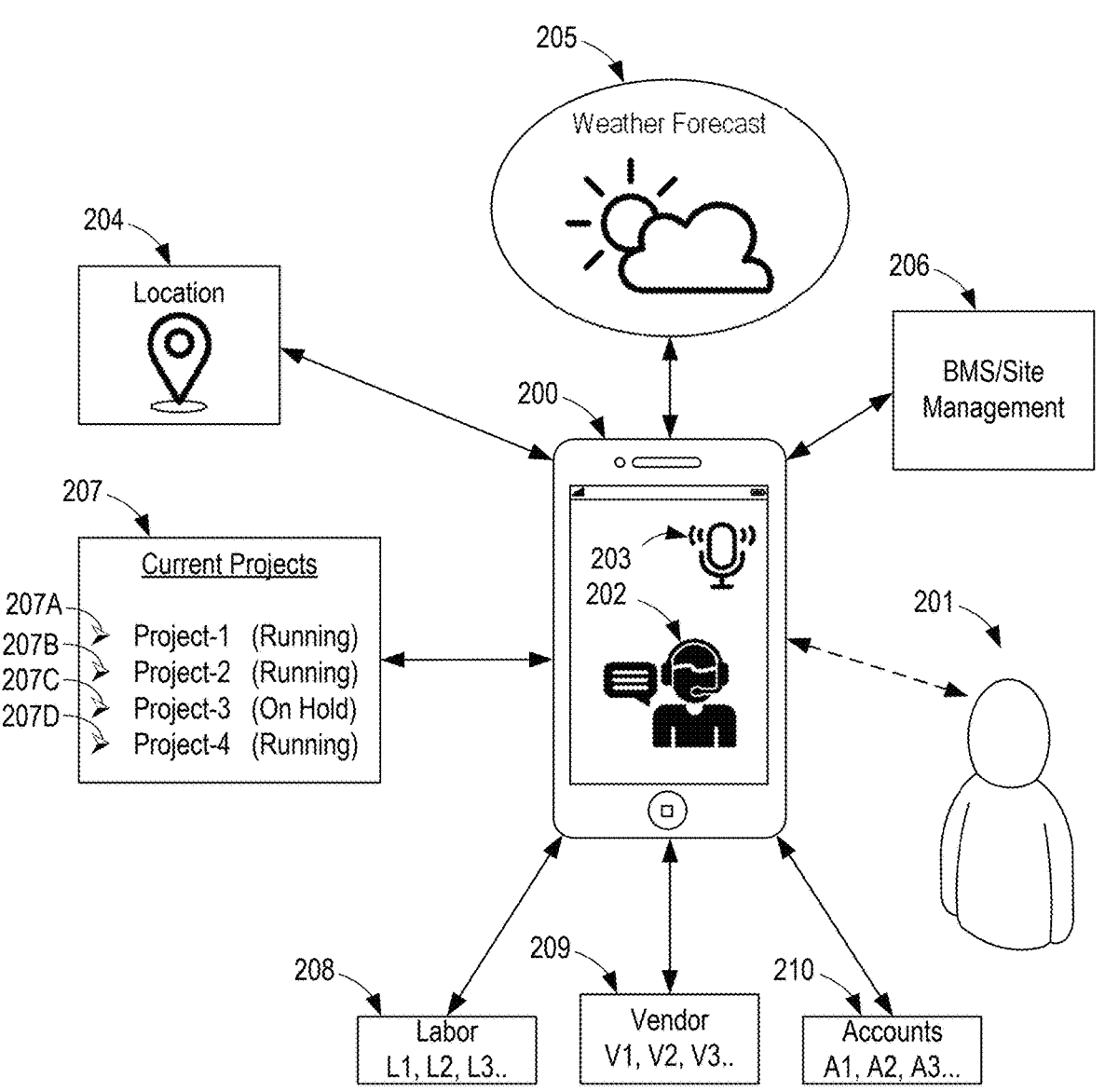
FIG. 2 illustrates an exemplary user device implementing an Agentic AI assistant to process contextual data, monitor ongoing projects, and interact with external systems and users for intelligent construction decision-making, in accordance with some embodiments of the present invention.

Referring now to FIG. 2, an exemplary system architecture is illustrated wherein a user device 200 operates an Agentic AI assistant 202 for intelligent construction-related decision-making based on contextual data inputs, project status, and external systems, in accordance with some embodiments of the present invention. The user device 200 may be any computing terminal, such as a smartphone, tablet, handheld device, or wearable interface equipped with internal processing circuitry configured to host or access a cloud-based instance of an Agentic AI engine. The user device 200 may be linked to a microphone 203 and a speaker (not shown), wherein the microphone 203 facilitates the audio reception of verbal commands, casual utterances, or ambient conversation for passive or active processing by the Agentic AI 202.

In some embodiments, the Agentic AI assistant 202 may operate locally or in synchronization with a cloud-based controller and may function as a virtualized assistant similar in behavior to a project manager. The Agentic AI assistant 202 may continually monitor the conversational inputs of a user 201, who may be an engineer, architect, project manager, contractor, or client owner. The assistant 202 may engage in a human-like conversational interface, allowing both active queries ("What is the vendor status for Project-2?") and passive listening (e.g., overhearing the user 201 say to another worker, "We may need to shift the concrete pouring to Thursday"). The passive listening ability allows the system to predictively react to human behavior and adjust project tasks accordingly.

The microphone 203 may remain active to listen to both directed commands and open contextual speech. In one example, the user 201 is on a construction site discussing work delays with a supervisor. The Agentic AI 202, via microphone 203, recognizes terms such as "delay," "insufficient materials," and references to a specific structure. Without explicit command, the assistant 202 may generate a prompt asking if it should recheck material procurement or contact the vendor 209 for expedited delivery. This behavior exemplifies how passive listening supports decision augmentation.

The user 201 may handle one or more concurrent construction or renovation projects 207. In some embodiments, the Agentic AI 202 may monitor and manage these projects, such as 207A, 207B, 207C, and 207D, by evaluating contextual triggers in relation to each respective project. For example, Project-3 (207C) may be on hold due to permit issues, while Project-1 (207A) may be entering a labor-intensive concrete phase. The Agentic AI 202 may allocate or reassign labor resources 208, adjust cost projections via account module 210, or notify vendors 209 based on the shifting dynamics among the ongoing projects.

The user device 200 may interface with geolocation services via module 204. This geolocation data may be associated with both the position of the user device 200 and other entities involved in the construction workflow, including labor workers 208 or material trucks. In one embodiment, if labor L2 from the labor module 208 is detected far from Project-2's site during critical working hours, the AI agent 202 may generate an inquiry to the user 201, suggesting rescheduling or alerting the labor subcontractor.

The Agentic AI 202 may also incorporate weather forecasting data 205 to intelligently adjust project timelines. For example, if the weather forecast 205 indicates a 90% chance of rainfall in the next 48 hours, the Agentic AI 202 may proactively propose shifting concrete laying work from Project-1 (207A) to another indoor task scheduled for Project-4 (207D), thereby maintaining overall productivity.

BMS or site management data 206 may also be fused with the Agentic AI 202 through interoperable APIs. This may allow the assistant 202 to verify on-site parameters such as electrical consumption, HVAC performance, lighting usage, or access control logs. If, for example, the BMS 206 reports excessive HVAC power draw during non-working hours, the Agentic AI 202 may propose investigating energy wastage, or it may directly trigger automated shutdown protocols.

The labor module 208 may store or interface with worker schedules, identity profiles, certifications, and skill levels. When the user 201 assigns a task verbally or through interaction with the Agentic AI 202, the assistant may parse the required skills and automatically allocate laborers with matching profiles from the labor pool. For example, if plastering work is needed for Project-4 (207D), the system may allocate L1 and L3 from labor pool 208 based on skill match and availability.

The vendor module 209 may be queried by the Agentic AI 202 for procuring materials or services. For example, the user 201 may say, "We'll need waterproofing chemicals next week for Project-2." Even without a formal request, the Agentic AI 202 may record the statement and prepare a tentative procurement plan, including budget estimation, vendor matching (V1, V2, or V3), and material availability timelines. The user 201 may later receive a prompt asking whether to approve the draft order.

In some embodiments, each project 207A-207D may be mapped to individual accounts in the account module 210. These accounts (A1, A2, A3 . . . ) may maintain separate ledgers for budget control, disbursement approvals, transaction history, and invoice validation. When vendor V1 from vendor module 209 issues an invoice for steel rods delivered to Project-1 (207A), the Agentic AI 202 may validate it against the active purchase order, match delivery status, and auto-approve payment if predefined thresholds and permissions are met.

The user 201 may also set temporal conditions through natural conversation. For example, the user may tell the Agentic AI 202, "Don't approve any vendor invoice above $5,000 without my confirmation." This statement may be parsed and encoded into the assistant's operational policy for vendor management within account module 210.

The Agentic AI 202 may access real-time project data from BMS 206 and cross-link it with labor locations 204 to detect and act on productivity discrepancies. In one scenario, the system observes that no entry logs were recorded by the site gate access for Project-3 (207C), which is otherwise marked as active. The Agentic AI 202 may request clarification from the user 201 or recommend pausing the project to optimize billing.

In another embodiment, the AI agent 202 uses weather forecast 205 to negotiate flexible labor timings with the contractor. For example, upon learning that heatwaves are expected during midday hours, the system may suggest altering work hours to early morning or evening, and it may communicate such changes to the labor module 208 and send a notification to the affected laborers.

The user device 200 may store conversational threads, decisions, and context references into a local or cloud-synced knowledge graph to enhance personalized reasoning for the Agentic AI 202. For example, if the user 201 frequently asks about vendor V2's shipment history, the AI agent may begin preemptively providing such data during project review meetings.

When passive listening is activated, the Agentic AI 202 may listen not only to the user 201 but also to nearby discussions. Suppose two subcontractors are discussing issues with steel bending machinery; the AI agent 202 may parse relevant words, associate it with Project-1 (207A), and provide a gentle prompt like, "Should I schedule maintenance for the bending machine at Site-1?"

The AI assistant 202 may further generate graphical dashboards on user device 200 summarizing real-time project health, material stock levels, labor allocation, cost metrics, weather risk indices, and vendor fulfillment status. The dashboards may include action buttons like "Pause Project," "Approve Invoice," or "Reallocate Labor."

Additionally, the Agentic AI 202 may suggest contingency actions. In a scenario where rain is predicted and excavation work is scheduled, the AI may offer options such as shifting to pre-fabrication tasks or allocating protective covers to mitigate site damage.

The assistant 202 may also handle communication routing. If the user 201 says, "Ask the vendor to delay the next batch of paint by 2 days," the Agentic AI 202 may automatically compose and transmit a message or place a call to vendor V1 using pre-integrated communication protocols.

The user 201 may receive periodic summaries or alerts via the user device 200. These alerts may be auditory (through speaker output), visual (on-screen notification), or haptic (vibration alert for wearable devices), depending on user preferences stored within system configuration.

Furthermore, location data 204 may be used to detect user proximity to a site for initiating check-in sequences. When user 201 nears Project-2 (207B), the system may notify relevant teams and fetch live data streams such as camera feeds or environmental sensors from that site, providing the user with immediate contextual awareness.

In some embodiments, accounts module 210 may integrate with external banking APIs to perform vendor payouts, record receipts, and manage tax compliance. For example, on completion of a milestone in Project-4 (207D), the system may suggest transferring 60% payment to vendor V3 and generate a GST-compliant invoice.

In some embodiments, the projects 207A-207D associated with the user device 200, as depicted in FIG. 2, may not necessarily represent separate construction sites but may instead correspond to distinct work components or phases within a single overarching construction project. In such a configuration, the Agentic AI agent 202 may be utilized to manage the concurrent workflows and interdependencies between these segmented workstreams. For example, project 207A may correspond to the foundational construction work, such as excavation, structural framing, and masonry; project 207B may represent electrical system installation; project 207C may encompass plumbing infrastructure implementation; and project 207D may involve interior finishing tasks such as drywall, flooring, and paintwork. Each of these individual work categories may proceed on partially overlapping or staggered timelines and may rely on different specialized worker teams, denoted herein as labor groups L1, L2, L3, and so forth, referenced collectively as labor 208.

The AI agent 202 may be configured to coordinate resource availability and task sequencing across these projects 207A-207D to minimize conflicts and inefficiencies. For example, in one exemplary scenario, if the electrical work associated with project 207B is scheduled to commence in a zone where foundation work (project 207A) has not yet concluded due to unforeseen delays, the AI agent 202 may automatically issue a notification to the supervisor or user 201, along with a proposed reallocation of resources or timeline adjustment. In some embodiments, the AI agent 202 may proactively communicate with labor teams L1 and L2 (assigned to projects 207A and 207B respectively) to inform them of the temporary hold or shift in work sequence, thereby reducing on-site congestion and redundant mobilization.

In another embodiment, the AI agent 202 may receive passive audio input via the microphone 203 to identify conversational cues among field workers indicating that teams L2 and L3 are occupying overlapping spaces for electrical and plumbing installation. Upon identifying this operational clash, the AI agent 202 may consult the master site plan retrieved from a remote or local design plan repository and determine which team has scheduled precedence in that area. The AI agent 202 may then generate and transmit updated task orders, annotated with spatial priority designations, to the respective teams' forepersons or project dashboards. Such decisions may be influenced by compliance schedules retrieved from a BMS or site management server 206, as well as vendor delivery timelines (e.g., when particular conduit materials or junction boxes are due to arrive).

In some implementations, the Agentic AI 202 may assess labor performance metrics—such as completion time per task, number of defects reported, or frequency of onsite clarifications requested—for each labor group L1 through L3, and then optimize future task assignments or stagger workforce shifts accordingly. This process may also factor in contextual data such as weather patterns (received from module 205) that may affect certain teams disproportionately (e.g., masonry during rainfall versus electrical during dry interior work). As another example, if L1 is expected to complete the floor slab casting in a certain wing by the afternoon but wet concrete curing is projected to extend past the anticipated 12-hour window due to lower ambient temperature forecasts, the AI agent 202 may delay L2's entry for wiring installations in that zone and redirect them to an alternate, ready area.

In certain embodiments, projects 207C and 207D may be managed in a cost-segmented manner, such that different financial accounts from account module 210 are mapped to labor teams L3 and L4 respectively. The AI agent 202 may intelligently allocate costs across the projects based on completion percentage, idle time, or materials used, and relay those allocations to the appropriate accounting interface (e.g., Account A1 for electrical, A2 for plumbing). This segregation of financial data helps enable better budget tracking and reporting compliance with governmental or regulatory frameworks.

The AI agent 202 may also act as a collaboration hub by managing interdependencies between teams across projects 207A-207D. For example, if a ceiling falsework must be completed by team L3 (working under project 207C) before L4 can proceed with HVAC duct mounting under 207D, the AI agent 202 may enforce a dependency lock, track task completion via check-in scans or IoT input from BMS system 206, and only release the next phase work order once the prerequisite activity is verified. This mechanism helps avoid premature or out-of-sequence work that may otherwise require rework.

In some embodiments, the AI agent 202 may provide a dynamic visual interface via user device 200 to present a 4D (time and space-based) scheduling overlay where user 201 can view progression and overlaps of projects 207A-207D. If team L2 is working on underground cabling in one half of the plot while team L3 is scheduled to begin plumbing trenches in the same trench line by evening, the AI agent 202 may suggest accelerated cable laying or partial scheduling adjustments to minimize trench reopening or duplicate excavation. Each suggestion may be accompanied by justification text synthesized by the AI agent 202 based on labor performance data, historical sequencing success rates, and environmental constraints.

In some embodiments, the accounts 210 represented as A1, A2, A3, and so on, may be logically associated with various financial or transactional groupings relevant to construction workflows. These accounts 210 may be configured to independently or jointly manage budgetary allocations and expenditures across different operational dimensions. For example, account A1 may be linked to expenditures for project 207A (e.g., civil construction work), account A2 may pertain to project 207B (e.g., electrical systems), and account A3 may correspond to project 207C (e.g., plumbing and mechanical installations). In other configurations, accounts A1-A3 may represent different budget pools across multiple structures in a larger building complex—e.g., A1 for Building Tower 1, A2 for Building Tower 2, and A3 for shared amenities infrastructure. Alternatively, in a material-focused classification, account A1 may manage payments related to steel procurement, A2 to concrete batching, and A3 to MEP (mechanical, electrical, plumbing) systems.

The Agentic AI agent 202, operating through the user device 200, may be pre-configured with a ruleset governing transactional permissions and limitations linked to the individual accounts 210. These rules may be defined by the user 201 or imported from a central configuration database associated with an overarching project governance framework. According to such rules, the AI agent 202 may be permitted to autonomously approve or initiate expenditures up to a predefined transaction threshold. For example, the AI agent 202 may autonomously approve a cement order from a pre-approved vendor 209 within account A1 if the total cost does not exceed INR 50,000 or USD 600. Such thresholds may vary by account type, material criticality, urgency level, or project phase.

In one embodiment, the AI agent 202 may receive a material request notification from a vendor 209, indicating the availability of urgently required grounding rods for the electrical phase of project 207B. Upon verifying that the requirement aligns with the active task list and that the associated account A2 has a sufficient balance, the AI agent 202 may autonomously initiate the purchase, generate a digital purchase order, and log the transaction under account A2, provided the transaction value falls within the pre-set limit.

Conversely, if a large-scale transaction request is received—such as hiring scaffolding labor teams with an aggregate wage expectation that exceeds the authorized autonomous limit under account A3—the AI agent 202 may automatically communicate the transaction summary to the user 201 via the device 200 and request approval. This communication may include transaction amount, vendor/labor details, intended use, associated project (e.g., 207C or 207D), and a projected benefit or impact summary. The user 201 may then approve, reject, or modify the terms via voice (through microphone 203), textual input, or a predefined quick-access command.

In some scenarios, the AI agent 202 may combine financial authorization logic with real-time context data. For example, if account A1 governs project 207A's foundation work and an urgent reinforcement requirement arises due to changing soil compaction metrics detected via BMS/site management input 206, the AI agent 202 may expedite rebar procurement within the allowed financial limit without human intervention. Any larger orders may be queued with annotated urgency metadata for user 201's expedited decision-making.

In some embodiments, the AI agent 202 may analyze contextual data comprising task schedules, real-time sensor inputs, progress updates from workers, and environmental conditions to determine that a particular construction task is subject to delay. Upon detecting such potential or ongoing delay, the AI agent may further identify which dependent or parallel construction activities are likely to be impacted due to the delay in the primary task. The AI agent may then autonomously generate a corrective action plan, which may include rescheduling related tasks, reallocating labor resources from other sites, initiating expedited procurement of pending materials, or recommending alternative workflows to maintain overall project continuity. For example, if concreting work is delayed due to unavailability of formwork material, the AI agent may assign idle workforce to other pending activities not dependent on concreting, such as wiring preparation or site cleaning, and simultaneously trigger material procurement workflows to address the delay.

Figure 3:
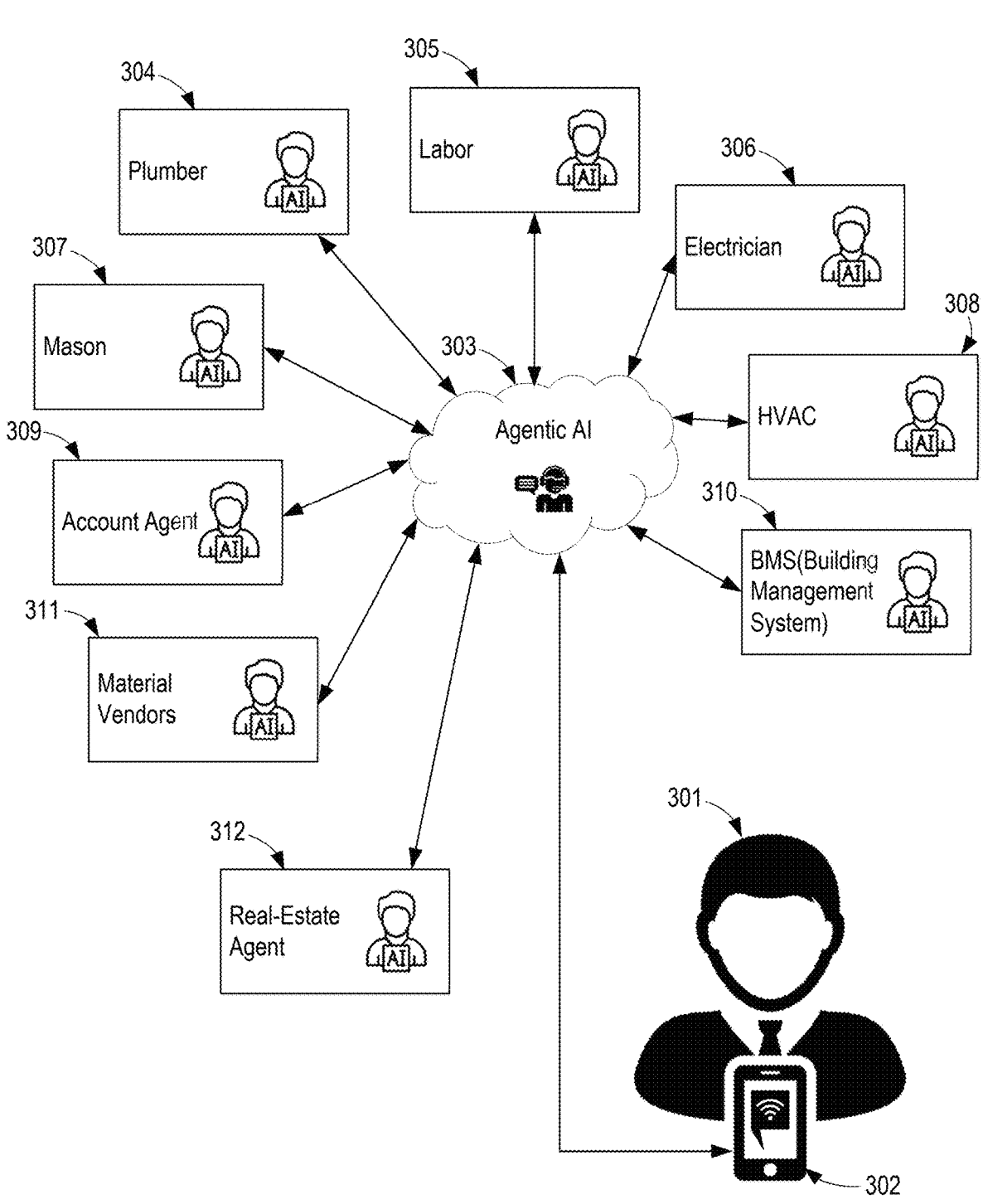
FIG. 3 illustrates an exemplary system comprising a master Agentic AI coordinating with multiple specialized AI agents for managing respective construction-related roles and entities.

Referring now to FIG. 3, an exemplary system 300 is illustrated for coordinating various construction-related tasks through a centralized Agentic AI structure. The system 300 comprises a master Agentic AI 303 configured to execute decision-making, coordination, monitoring, and communications across a network of intelligent sub-agents 304-312. The master Agentic AI 303 is operable from a user device 302 associated with a user 301, who may be a project manager, client, contractor, or owner overseeing one or more construction activities.

The master Agentic AI 303 may comprise or be communicatively coupled with a plurality of sub-agents, including but not limited to plumber AI agent 304, labor AI agent 305, electrician AI agent 306, HVAC AI agent 308, mason AI agent 307, account agent 309, material vendors agent 311, real-estate agent 312, and BMS AI agent 310. Each sub-agent may be responsible for a specific discipline or resource vertically relevant to the lifecycle of a building or construction project.

The plumber AI agent 304 may be configured to track, manage, and coordinate plumbing-related tasks for one or more projects. In some embodiments, plumber AI agent 304 may have access to all floor plans, plumbing layouts, fixture schedules, and specifications such as pipe types, pressure requirements, flow rates, and fixture counts. When a modification request is received by master agent 303 that affects plumbing infrastructure—such as repositioning a bathroom or increasing the number of wash basins—the master agent 303 may delegate the impact assessment and replanning to the plumber agent 304. This agent 304 may analyze the new design against code compliance, material availability, and previously allocated labor.

The plumber AI agent 304 may also autonomously issue commands to order plumbing fixtures and pipes if authorized under procurement rules. For example, if a project timeline requires installation of pressure-reducing valves by the coming week, and agent 304 determines the inventory is short, it may trigger a material request to the vendor agent 311. Agent 304 may also interact with the labor agent 305 to schedule plumbing labor resources accordingly.

Labor AI agent 305 is responsible for tracking availability, deployment, work quality, hours logged, and productivity data of on-site laborers. Labor agent 305 may have modules to perform identity verification, geofencing for attendance logging, safety training compliance, and role-based task assignment. For example, if a sudden increase in manpower is needed for excavation in a high-priority project, agent 305 may recommend redeployment from a lower-priority project after evaluating deadlines, permissions, and worker skill alignment.

The electrician AI agent 306 may be configured to supervise electrical installations, rewiring, fault diagnostics, energy usage predictions, and compliance with safety codes. In one scenario, a client user 301 may issue a command to integrate solar panels in a residential building. The master agent 303 may allocate this task to the electrician agent 306, which may update wiring schematics, reroute circuit loads, communicate with vendors for inverter and battery specifications, and initiate coordination with the HVAC agent 308 for energy consumption balancing.

HVAC agent 308 handles ventilation, heating, and air-conditioning infrastructure logistics. This may include sensor calibration, thermal load simulation, duct routing optimization, and real-time performance evaluation. In response to a seasonal change, agent 308 may autonomously alter temperature settings across HVAC zones in commercial buildings, notify the user 301 of anticipated energy consumption changes, or schedule preventive maintenance with agent 305 for air filter replacements.

The mason agent 307 may be responsible for monitoring structural activities such as wall erection, blockwork, plastering, and concrete curing schedules. Upon receiving updates from agent 303 about a change in building facade aesthetics, agent 307 may perform quantity surveys, request material availability from agent 311, and update the task timeline accordingly. Mason agent 307 may also cross-check the weather forecast module before scheduling any outdoor concrete pouring activities.

The account agent 309 may handle financial workflows such as purchase orders, subcontractor payments, tax documentation, cash flow forecasting, and audit trails. If a user 301 sets a procurement budget ceiling for a specific project, agent 309 may continuously evaluate the budget status and autonomously approve transactions below a defined threshold while routing high-value decisions to the user for final authorization.

Material vendors agent 311 acts as a digital liaison between the AI ecosystem and external vendors or suppliers. When a sub-agent requests a bill of materials, agent 311 may query vendor APIs, compare prices, evaluate delivery timelines, and initiate procurement workflows. For example, when the plumber agent 304 requires sanitary fittings, vendor agent 311 may access a catalog database, negotiate based on previous order history, and confirm the lowest bid with agent 309 before executing the purchase.

The BMS agent 310 may interact with on-site IoT devices including thermostats, occupancy sensors, air quality monitors, and lighting control modules. When feedback is received from such devices indicating anomaly patterns (e.g., temperature drop, unauthorized movement, or excessive energy usage), the BMS agent 310 may notify master agent 303 and initiate a chain of communications with HVAC 308 or electrician agent 306 for diagnosis.

The real estate agent 312 may provide insights into property valuation, competitive benchmarking, tenant interest, and project visibility. If a project milestone is met earlier than planned, agent 312 may suggest advancing listing dates, launching virtual walkthroughs, or pushing promotional campaigns via integration with external real estate platforms.

Each sub-agent 304-312 may periodically synchronize with master agent 303, pushing updates or requesting permissions based on priority levels and configured autonomy levels. In some cases, peer-to-peer sub-agent interactions may also occur to achieve contextual coordination, such as labor agent 305 communicating directly with mason agent 307 to realign work shifts after rain-induced delays.

The master agent 303 may also serve as a query resolution point for user 301, receiving natural language queries via device 302, parsing intents, and determining whether to process the request internally or forward it to a designated sub-agent. For example, if user 301 inquires, "What is the ETA for HVAC ducting on the second floor?", agent 303 may delegate the query to HVAC agent 308 which in turn fetches real-time progress data from its task monitoring modules.

User device 302 may include a display for viewing ongoing tasks, a microphone for voice commands, a touchscreen interface, and network modules for data transmission. Device 302 may also display performance analytics of each sub-agent, including average task turnaround time, incident count, and SLA compliance indicators.

In some embodiments, the system 300 may be used in off-grid construction zones where only one user device 302 with locally running master agent 303 is present. The sub-agents 304-312 may operate in modular configurations on the same device, activating or suspending themselves based on task schedules, user preferences, or battery-saving policies.

In cloud-enabled configurations, sub-agents 304-312 may operate as containerized microservices on distributed cloud nodes, dynamically scaling based on workload, concurrent users, or AI inference tasks requiring GPU acceleration. Master agent 303 may orchestrate such scaling behaviors using telemetry logs and predictive analytics.

Each agent 304-312 may have configurable permissions for independent decision-making. For example, plumber agent 304 may be allowed to execute purchase orders up to 5,000 units of currency while HVAC agent 308 may have elevated access for initiating maintenance sequences across large building zones without human supervision.

In some implementations, the agents may maintain temporal task histories for auditing purposes. For example, mason agent 307 may maintain a log of wall curing tasks for a specific block and expose it to master agent 303 in response to an audit query raised by the account agent 309.

Agentic AI structure shown in system 300 may also include anomaly detection layers using embedded machine learning models. These may be used by each agent to determine deviations from planned schedules, budgetary overruns, resource conflicts, or design non-compliances.

The communication between master agent 303 and each sub-agent may follow a standardized schema such as JSON, Protobuf, or XML, with message validation modules incorporated to detect transmission errors or command injection vulnerabilities.

FIG. 3 thus enables a multi-agent construction orchestration framework that allows the user 301 to focus on strategic decision-making while deferring operational complexity to the respective sub-agents 304-312. The system 300 may be scaled for residential, commercial, and infrastructure projects alike, with minimal reconfiguration.

In advanced embodiments, sub-agents 304-312 may include feedback loops from stakeholder satisfaction surveys. For example, after an HVAC task completion, agent 308 may send automated follow-up queries to site supervisors and capture sentiment scores, which are then archived for training next-generation AI agents.

In some embodiments, the Agentic AI system 300 illustrated in FIG. 3 may be deployed in a distributed computing architecture where the master agent 303 operates on a central user device 302 associated with a supervisory user 301—such as a project manager, site coordinator, contractor, or building owner—while individual sub-agents 304 through 312 are executed on separate user devices corresponding to respective tradespeople, specialists, or systems. In such a configuration, each of the sub-agents 304-312 may operate as lightweight, task-specific applets or modules running autonomously or semi-autonomously on their respective stakeholder devices. These devices may include smartphones, tablets, embedded controllers, wearables, or augmented-reality headsets, each having a processing unit, transceiver for wireless connectivity, local memory, and user interface suitable for task-level interaction.

For example, the plumber agent 304 may be deployed on a mobile device carried by a plumber actively engaged at a construction site. The plumber's device may include a pre-installed sub-agent applet 304 configured to receive real-time assignments, task changes, or alerts from the master agent 303 through a wireless communication protocol such as Wi-Fi, 4G/5G, or low-power mesh networking. The master agent 303, operating on device 302, may dispatch a work order to the plumber's sub-agent 304 requesting immediate inspection or correction of an identified pipe alignment issue in the basement level of Project-1. In response, the sub-agent 304 may not only acknowledge the command but also prompt the plumber to input status updates or upload visual media (e.g., image or video of the plumbing section in question) through the device UI. This input may be sent back to the master agent 303 for further processing, archiving, or action coordination.

Similarly, the labor agent 305 may be installed on a supervisor's device used to manage general laborers. The labor sub-agent 305 may allow the labor supervisor to receive dynamically generated task lists, resource allocation reports, and schedule updates in real-time. For example, if a sudden weather update from source 205 (as previously discussed in relation to FIG. 2) predicts rainfall during the afternoon, the master agent 303 may instruct the sub-agent 305 to accelerate outdoor foundational tasks before noon, and update internal task lists accordingly. The labor supervisor, via the device hosting sub-agent 305, may approve or modify the task priority as permitted by the access control rules of system 300 and communicate changes to on-field teams.

In the case of the electrician agent 306, the sub-agent may interface with both the human electrician's mobile device and embedded IoT sensors within the building's electrical layout. For example, the sub-agent 306 may receive a prompt from master agent 303 after AI-detected anomalies in voltage patterns recorded by smart breakers. The sub-agent 306 may deliver an alert to the electrician with location-specific details and may include a thermal snapshot if available. The electrician, upon visiting the site and performing corrective measures, may interact with sub-agent 306 to input a resolution code or speak a status report which may be transcribed by the applet and transmitted to the master agent 303.

Further, HVAC agent 308 may be embedded in the software stack of smart HVAC controllers at the construction site. Sub-agent 308 may not only track ongoing installation schedules but also continuously monitor performance of newly installed units. For example, if an air-handling unit (AHU) exhibits anomalous airflow, sub-agent 308 may send alert data and suggested resolution pathways to the master agent 303, which then correlates the issue with schedule data and labor availability from other agents (such as 305 and 209), and automatically reassigns the HVAC technician or prompts procurement of a replacement unit.

In another embodiment, the BMS agent 310 may function as a digital twin interface agent residing within the BMS interface module. The BMS sub-agent 310 may interact with HVAC, lighting, safety, and access control systems and may communicate event triggers or compliance violations to the master agent 303. The master agent 303 may further share the issue with the real-estate agent 312 if prospective buyer visits are scheduled, and schedule a remediation task to be tracked through labor agent 305 and material vendor agent 311.

Each sub-agent 304-312, while operating autonomously for routine data acquisition and transmission, may be architected to function in a subordinate "slave agent" capacity to the centralized master agent 303. This master-slave topology allows the master agent 303 to maintain holistic control of workflow coordination, priority escalation, and policy compliance, while offloading the real-time interaction and domain-specific communication to the appropriate sub-agents. In some embodiments, the sub-agents may comprise minimal UI layers designed primarily for task intake and feedback transmission, while computationally heavier tasks such as design analysis, predictive modeling, or policy enforcement remain centralized with the master agent 303.

By allowing such delegation of functionality across respective devices, the Agentic AI system 300 provides scalability and localized intelligence without sacrificing central oversight. For example, material vendor agent 311 running on a procurement staff's handheld terminal may continuously scan vendor catalogs and stock availability via APIs, and push suggestions for materials needed for a task triggered by mason agent 307. If a requested material is out of stock, vendor agent 311 may autonomously escalate the issue to the account agent 309 to check fund availability and authorize expedited procurement from an alternative supplier, as permitted within the transaction rules defined in the permissions layer.

In yet another embodiment, the real-estate agent 312 may operate as an advisory sub-agent residing on a mobile device of a leasing manager or real-estate consultant. This sub-agent may notify the master agent 303 of changes in market value, occupancy readiness, or buyer preferences. The master agent 303 may then evaluate whether building progress is aligned with projected delivery timelines, and suggest adjustments in finishing schedules, drawing input from plumber agent 304, electrician agent 306, and HVAC agent 308 as needed.

This distributed yet coordinated multi-agent framework enables adaptive, parallel execution of interrelated construction tasks while preserving centralized decision-making authority. The use of sub-agent applets 304-312, each focused on narrow operational domains but communicating with the master agent 303 over standardized protocols, facilitating that specialized information is gathered and acted upon quickly and contextually without requiring direct human supervision over each subsystem. The master agent 303 may further implement trust policies and authentication mechanisms to confirm the identity and authority level of each user device operating a respective sub-agent, thereby maintaining operational integrity and accountability across the system 300.

Figure 4:
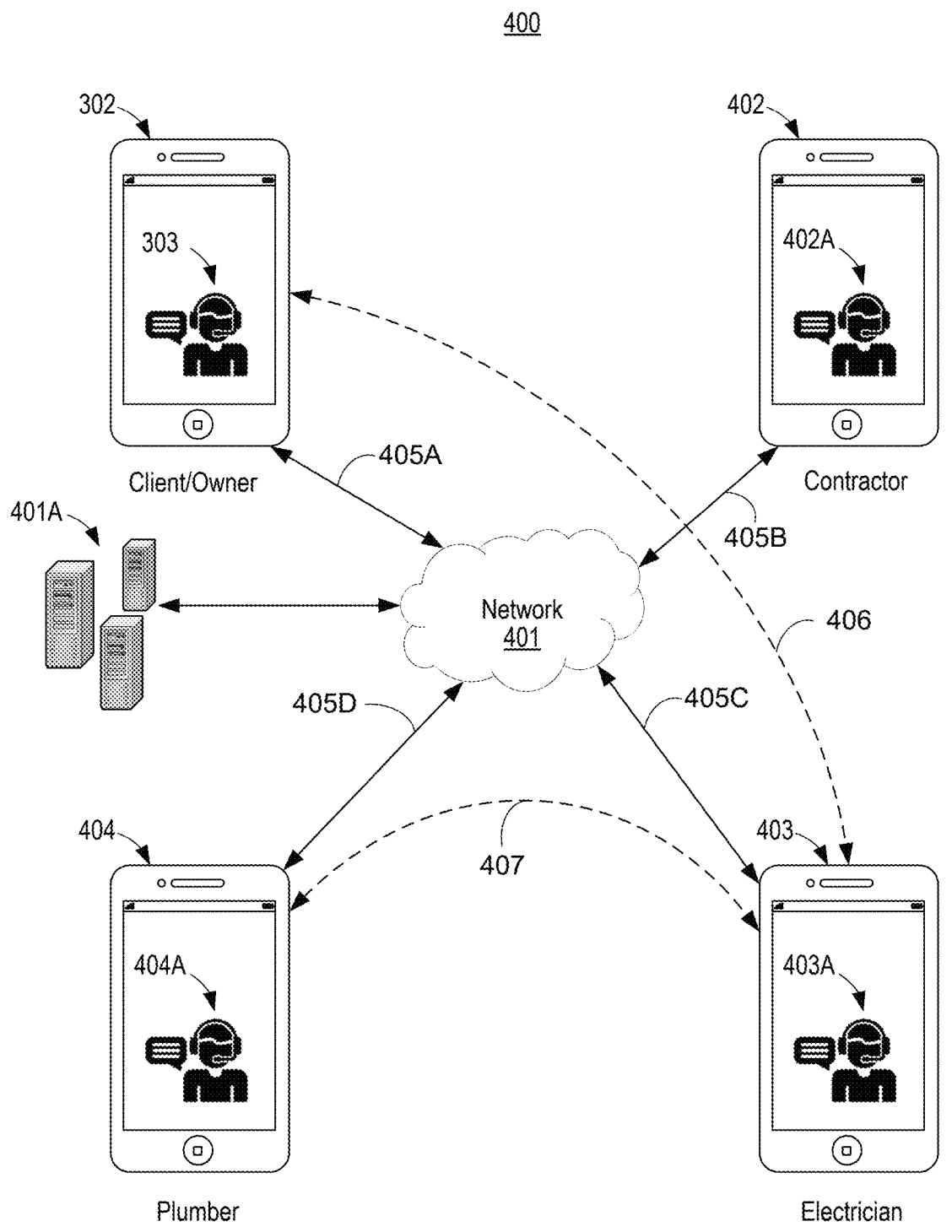
FIG. 4 illustrates an exemplary system enabling distributed coordination and communication among multiple AI agents operating on respective user devices via a network for collaborative construction task management, in accordance with some embodiments of the present invention.

Referring now to FIG. 4, an exemplary system 400 is illustrated for enabling distributed coordination and communication among multiple AI agents 303, and 402A-404A operating on respective user devices 302 and 402-404 via a network 401 for collaborative construction task management, in accordance with some embodiments of the present invention. The system 400 facilitates decentralized, yet interconnected, task execution across the stakeholders in a construction project. The architecture enables intelligent distributed operation through communication links between multiple user devices, each running their own contextual AI agent. These AI agents collectively support ongoing task execution, reporting, data synchronization, and decision facilitation without dependency on a centralized command center.

As illustrated, the user device 302 is associated with a supervisory user 301, such as a project manager, client, or owner, who oversees the execution of multiple construction-related workflows. The AI agent 303 operating on the user device 302 may function as a master agent or supervisory agent, configured to manage project progress, assign sub-tasks to individual contractors, and receive real-time status updates from subordinate workers or team members. This supervisory role enables the user to retain strategic oversight while delegating lower-level operational responsibilities to workers such as electricians, plumbers, or contractors.

The user devices 402, 403, and 404, shown in FIG. 4, are associated with worker roles, such as a contractor, electrician, and plumber, respectively. Each of these devices is configured with an instance of a dedicated AI agent—402A on device 402, 403A on device 403, and 404A on device 404. These AI agents act as intelligent assistants on the respective user devices, enabling each worker to receive, process, and execute project-specific tasks without requiring constant instruction from the supervisory user.

The network 401 serves as the primary communication medium through which user devices 302, 402-404 are interconnected. In some embodiments, network 401 may comprise a wireless local area network (WLAN), a cellular data network (4G/5G), or a cloud-based communication infrastructure that allows encrypted and authenticated transmission of instructions, reports, and contextual data between devices. The presence of this shared network permits each AI agent to function autonomously while remaining in constant synchronization with other participants.

The connection 405A represents the data communication link between the supervisory user device 302 and the network 401. Through this connection, the AI agent 303 may transmit commands, project modifications, and contextual feedback to other agents on the network, while simultaneously receiving real-time updates on execution status, deviations, or issues that may need supervisory intervention. This dynamic, bidirectional communication allows adaptive project management.

Similarly, connection 405B links the contractor's user device 402 to the network 401. The contractor AI agent 402A may be responsible for tracking task dependencies, monitoring supply availability, updating work status, and issuing or receiving work orders from the AI agent 303 or other collaborating agents. For example, the contractor AI agent 402A may receive an instruction to begin installation of structural panels and respond with estimated completion timelines and resource requests.

Connection 405C links the electrician's device 403 to network 401, enabling the electrician AI agent 403A to interact in real-time with other agents. For example, the AI agent 403A may detect a delay in wiring tasks due to an inaccessible wall cavity and automatically notify the master AI agent 303. The agent 403A may also coordinate with the contractor AI agent 402A to request assistance or reschedule work phases, depending on the dependencies.

Connection 405D enables the plumber's device 404 to communicate with the network 401, thus allowing the plumber AI agent 404A to log plumbing task status, report detected faults (e.g., low water pressure in a new line), or confirm material installation such as pipe fittings. In some scenarios, plumber AI agent 404A may autonomously request replacement parts or labor assistance through the network 401 based on predefined operational thresholds.

One or more backend servers 401A may be communicatively linked to the network 401 to provide auxiliary functions such as long-term data storage, AI model updates, access policy enforcement, and historical project analysis. These servers may maintain synchronized databases of task logs, communication records, and AI decision trails, allowing for compliance checks, audits, and iterative learning. The presence of backend servers 401A enhances the robustness and resilience of the distributed system 400.

Communication path 406 may indicate a direct device-to-device interaction between the contractor device 402 and the electrician device 403. This peer-level communication enables dynamic task alignment and issue resolution between field workers without waiting for instructions from the supervisory user. For example, if the electrician detects exposed structural wiring, they may ping the contractor AI agent 402A through path 406 to confirm structural status and assess risk.

Communication path 407 reflects a similar direct link between the plumber device 404 and the electrician device 403, enabling sub-agent 404A to interact directly with sub-agent 403A. This kind of peer-to-peer interaction supports autonomous conflict mitigation, coordination of interdependent work such as plumbing and electrical conduit installation, and avoidance of overlapping scheduling or resource contention.

In some embodiments, the AI agent 303 may be configured as a master agent that operates on the user device 302 of a supervisory user 301, such as a project manager, building owner, or contractor responsible for overseeing a plurality of concurrent construction activities. The master agent 303 may be endowed with supervisory privileges and processing authority over other AI sub-agents 402A, 403A, and 404A operating on user devices 402, 403, and 404, respectively. Each of the AI sub-agents 402A-404A may be designed to interface exclusively with the master agent 303 through designated secure wireless channels 405B, 405C, and 405D respectively, and may not communicate directly with one another. This hierarchical architecture facilitates centralized orchestration of task-related updates, status checks, and inter-role assignments through the master agent 303.

For example, in such a configuration, AI agent 402A operating on the contractor's device 402 may relay a notification to the master agent 303 indicating that a new batch of steel beams has arrived on-site and needs to be unloaded. The master agent 303, upon receiving the alert, may cross-reference the scheduling information and the current activity logs of the electrician's AI agent 403A and plumber's AI agent 404A to determine which labor resources are currently idle. The master agent 303 may then assign unloading duties to the appropriate team via the respective AI sub-agent, without requiring the sub-agents 403A and 404A to interact directly.

In an alternative embodiment, each AI agent 303, 402A, 403A, and 404A may function as an independent, fully autonomous agent running locally on its corresponding user device 302, 402, 403, and 404, respectively. In such cases, the master-slave paradigm is not imposed, and each AI agent may serve the individual interests and task profiles of its associated user. For example, AI agent 403A running on the device 403 of an electrician may independently manage the progress, resources, and reporting of electrical tasks related to various construction sites without requiring authorization or instructions from the supervisory AI agent 303.

In the independent-agent configuration, AI agent 403A may, for example, receive a verbal input from the electrician stating, "Reschedule today's wiring task due to unavailability of conduit pipes." Upon processing the input, the AI agent 403A may access inventory databases, communicate with vendors, place a procurement request, or adjust the electrician's schedule autonomously. It may also report the rescheduling to the supervisor's AI agent 303 for visibility, but such communication may be optional or configuration-dependent, as the AI agents act as peer entities rather than subordinates.

Furthermore, in embodiments where AI agents 303, 402A-404A operate independently, the network 401 may be configured to support secure peer-to-peer communication between the agents. For example, AI agent 403A on the electrician's device 403 may directly communicate with AI agent 404A on the plumber's device 404 using peer communication path 407 to coordinate sequencing of electrical conduit installation with plumbing lines to prevent worksite clashes. This configuration permits decentralized collaboration, where each AI agent functions with decision-making authority appropriate to its user's domain, while maintaining optional interoperability with other agents across the distributed system 400.

In some embodiments, the AI agents 303, 402A, 403A, and 404A shown in system 400 of FIG. 4 may be configured to operate with autonomous inter-agent communication capabilities, wherein they may directly communicate with one another via the network 401 without requiring involvement or explicit notification of their respective human users 301 or other associated users operating devices 402, 403, and 404. This autonomous communication paradigm may be designed to facilitate seamless coordination, intelligent decision-making, and rapid conflict resolution in ongoing construction projects, reducing delays and minimizing repetitive or non-value-adding interruptions to the users.

In one embodiment, the AI agent 403A associated with an electrician and operating on device 403 may detect a scheduling overlap for electrical conduit installation in a specific utility corridor that is simultaneously scheduled for plumbing line routing managed by AI agent 404A associated with the plumber's device 404. Upon such detection, the AI agent 403A may initiate a peer-to-peer communication 407 with AI agent 404A to negotiate a conflict-free schedule or to update priorities. For example, if the plumber's task is marked with higher urgency based on pending inspection requirements, the electrician's AI agent 403A may autonomously decide to reschedule its own conduit task to a non-conflicting slot, log the change, and proceed without involving either the electrician or the plumber.

Such autonomous coordination between AI agents may be predicated on access to shared scheduling, resource availability, safety constraints, and project progression datasets. These agents may access a shared database hosted on servers 401A or replicated locally, allowing each agent to intelligently assess priority, dependencies, and allowable flexibility without needing explicit instructions. In some configurations, the AI agents 403A and 404A may utilize conflict resolution protocols based on pre-defined rulesets or learned policies, such as prioritizing inspections, safety-critical installations, or time-sensitive deliveries.

In another example, if AI agent 404A determines that pipe-laying in a certain zone is complete, it may proactively communicate this status to AI agent 403A, signaling that the electrician may now proceed with installing outlet boxes and cabling in that region. This coordination may happen in real time, triggered by on-site IoT sensor feedback or completed task confirmations, and may allow the AI agent 403A to begin preparations or dispatch electricians to that section. This eliminates latency caused by manual progress reporting or user-driven follow-ups, streamlining task execution with minimal supervisory friction.

In yet another embodiment, the AI agent 402A associated with a contractor may receive an automatic update from AI agent 404A that plumbing material stocks are running low due to unexpected leakage repairs. Based on its permissions and policy rules, AI agent 402A may notify the vendor or place a low-cost order autonomously. This event may later be logged and visible to the contractor via a dashboard or daily digest, but the real-time communication and remediation between agents occur without necessitating immediate user attention or interruption.

This inter-agent autonomy may be advantageous in maintaining workflow continuity during night shifts, holidays, or scenarios where human users are engaged in unrelated meetings, travel, or on-site inspections. In such cases, even without direct user availability, agents may interact across devices 302, 402, 403, and 404 to reroute dependencies, reassign labor based on proximity data, and adjust timelines to adapt to evolving construction dynamics-based entirely on contextual understanding drawn from dynamic data inputs.

In some embodiments, the server 401A illustrated in FIG. 4 may be configured to host a master AI agent that operates at a supervisory layer above the distributed AI agents 303, 402A, 403A, and 404A running on respective user devices 302, 402, 403, and 404. The master AI agent residing on server 401A may maintain global oversight over the entire project ecosystem, offering centralized logic, decision policies, data processing capabilities, and coordination functionalities that supplement or override the decisions of individual agents as needed. The master AI agent may also function as a failsafe entity for mediating conflicts, reallocating tasks in case of priority shifts, and generating system-wide alerts across connected users and devices.

In another embodiment, the server 401A may be configured to maintain a continuously updated version of each AI agent 303, 402A, 403A, and 404A. These server-resident versions may act as synchronized mirrors or backup instances that reflect the state, configuration, logic pathways, communication logs, and operational metadata of the corresponding local agents running on the user devices. For example, if the device 402 hosting AI agent 402A (contractor) temporarily loses power or network connectivity, the contractor's AI agent functionality may be seamlessly transitioned to the cloud-hosted copy maintained by server 401A, allowing communications, status monitoring, and command responses to continue uninterrupted.

This architecture enables fault-tolerant distributed AI decision-making without compromising the integrity or continuity of the collaborative construction process. For example, if AI agent 403A (electrician's agent) was in the middle of a negotiation with AI agent 404A (plumber's agent) for re-sequencing tasks when device 403 loses signal, the master agent or the cloud-resident 403A may continue the session and complete the communication, avoiding time-sensitive stalls.

In some configurations, the server 401A may also serve as a centralized database repository for compliance standards, historical project performance data, approved supplier/vendor records, weather and geographic databases, construction blueprint archives, IoT sensor feeds, and rule-based access control mechanisms for users and agents. For example, if the AI agent 404A queries an optimal material vendor based on a delivery time constraint, the server 401A may respond with real-time scoring of vendors based on their delivery history, current availability, and proximity to the project site.

Furthermore, the server 401A may include AI model training pipelines or reinforcement learning modules that gather feedback from multiple ongoing projects to iteratively improve the behavior of subordinate agents. For example, if repeated communication failures or inefficiencies are noted between electrician and HVAC AI agents across projects, the server-based master AI may suggest or enforce behavioral adjustments, such as restructuring negotiation protocols or modifying task delegation patterns for improved performance.

In one embodiment, the server 401A may also act as a distributed ledger node to store tamper-proof logs of transactions initiated by AI agents—such as purchase orders, labor assignments, or compliance sign-offs. These logs may be useful for post-project auditing or for resolving disputes among stakeholders. For example, if AI agent 402A places an order for wiring supplies through AI agent 404A's vendor network, the server 401A may generate and timestamp an immutable entry that may subsequently be queried for reference, verification or reconciliation with project accounts or other purposes.

In some embodiments, an AI agent 303 and the AI agent's associated sub-agents (402A-404A) may be configured to autonomously exchange updates with each other across user devices (302, 402-404) without requiring intervention or awareness of human users. These updates may be derived from dynamically logged data, such as worker check-ins, task initiation or completion timestamps, equipment usage logs, or real-time environmental readings. For example, a sub-agent operating on a plumber's device may automatically send a completion status update upon detecting that a leakage repair task has been finalized, prompting another sub-agent managing interior plastering to initiate its own assigned task based on the newly available work area. This inter-agent communication may facilitate synchronized workflows, reduce redundant task switching, and enhance proactive coordination across distributed construction stakeholders.

Figure 5:
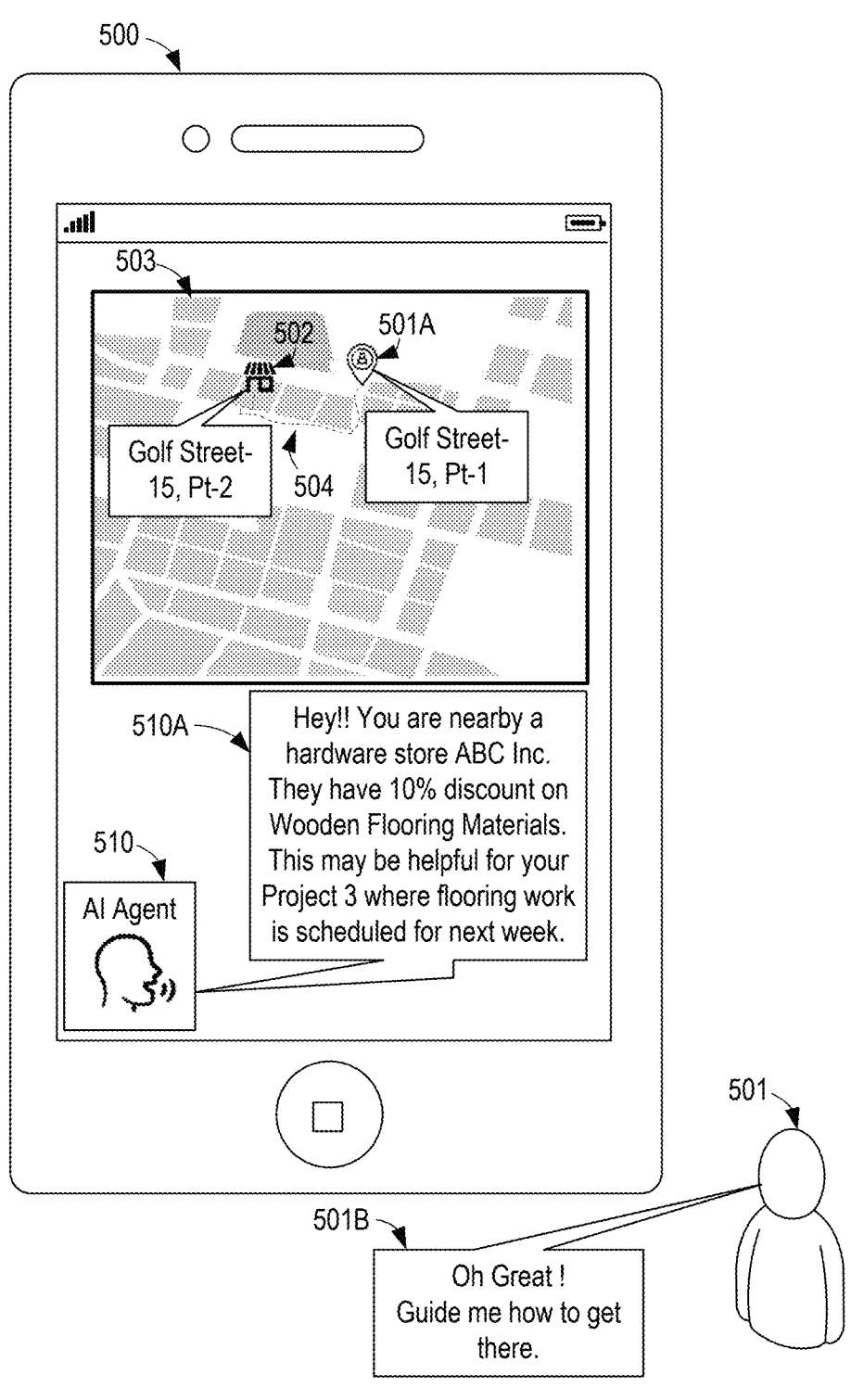
FIGS. 5 and 5A illustrate exemplary applications and methods of using AI agents to provide contextual recommendations and navigational assistance based on the users' location and upcoming project needs, in accordance with the present invention.

Referring now to FIG. 5, an exemplary application and method is illustrated for using an AI agent 510 on a user device 500 to provide contextual recommendations and navigational assistance based on a user's location and upcoming project needs, in accordance with embodiments of the present invention. The user device 500 may comprise a mobile communication device such as a smartphone or a tablet, optionally equipped with one or more sensors and input/output interfaces. The AI agent 510 may be configured to operate either locally on the user device 500 or be connected to a cloud-hosted agentic system for advanced analytics and decision processing.

The user device 500 may be associated with a user 501, which may include but is not limited to a supervisory personnel, a construction contractor, an owner, a vendor representative, or a field worker. In various embodiments, the user 501 may be responsible for overseeing, coordinating, or executing one or more construction projects. The AI agent 510 may be configured to process environmental, operational, and personal context data associated with the user 501 to proactively provide support in real time.

The AI agent 510 may determine the location 501A of the user 501 by accessing embedded GPS modules, wireless triangulation systems, IP-based geo-identification, or motion pattern recognition based on device activity logs. The AI agent 510 may poll the location 501A at configurable intervals, or in response to certain triggers, such as the user traveling beyond a geofence perimeter or arriving in the vicinity of a known point of interest. In some cases, a combination of GPS and Bluetooth proximity detection may be used to further refine accuracy in indoor or high-interference environments.

Based on the captured location 501A, the AI agent 510 may analyze whether the current location corresponds to any recognized external resources, such as suppliers, utility providers, logistics hubs, or subcontractor yards. In the example illustrated in FIG. 5, the AI agent 510 detects that the user 501 is present at a location 501A that is proximate to a hardware store 502. The AI agent 510 may query vendor directories, partner APIs, public data sources, or a localized database to retrieve current offers, inventory availability, operating hours, or product catalogs from the store 502.

The AI agent 510 may further cross-reference this environmental data with an internal status model of ongoing project needs maintained in memory or stored in synchronized project databases. For example, if the AI agent 510 detects from project planning records that flooring work for Project-3 is scheduled for the upcoming week, and that materials for flooring (such as wooden laminate panels) have not yet been marked as procured, the AI agent 510 may infer a potential benefit in notifying the user 501 of the nearby store 502 offering a 10% discount on those materials.

In other examples, the AI agent 510 may correlate the user's location 501A with anticipated site visits, compliance deadlines, or required inspections. If the user 501 is in the vicinity of a government inspection office, and a safety clearance request is pending for Project-2, the AI agent 510 may prompt the user 501 to consider stopping at the office to expedite documentation formalities. Alternatively, if the user is detected near a known bottleneck zone on a supplier's transportation route, the AI agent 510 may issue alerts on potential logistics delays impacting critical delivery timelines.

In some embodiments, the AI agent 510 may present this contextual insight via a visual interface rendered on the interactive display of the user device 500. The visual interface may comprise a map 503 highlighting the current position 501A of the user, the nearby store 502, and any navigation route 504 computed therebetween. The map 503 may be generated using a mapping engine integrated into the agent 510 or invoked from a third-party map API.

The AI agent 510 may also issue textual prompts 510A to communicate its recommendations, such as: "Hey!! You are near hardware store ABC, Inc. They have 10% discount on Wooden Flooring Materials. This may be helpful for your Project 3, where flooring work is scheduled for next week." The prompt 510A may be rendered within a notification bar, pop-up window, or as an embedded banner on the user interface. Alternatively, or additionally, a verbal output may be generated using text-to-speech synthesis and emitted via the audio output interface of the user device 500.

In response to the recommendation 510A, the user 501 may choose to initiate further action. As illustrated in FIG.

5, the user 501 may issue a verbal command 501B, such as "Oh great! Guide me how to get there," which may be captured via the microphone of the user device 500. The AI agent 510 may process this input via a speech recognition module, extract intent, and proceed to compute the shortest, fastest, or most convenient navigation path 504 between the location 501A and the store 502.

The navigation path 504 may be rendered dynamically on the map 503 or spoken aloud step-by-step. In some embodiments, the AI agent 510 may evaluate traffic congestion, weather conditions, roadblocks, or site access constraints to generate an optimized route. If the user 501 indicates time limitations or driving restrictions, the AI agent 510 may incorporate these constraints while computing the navigation solution.

In further embodiments, the AI agent 510 may provide an option to initiate procurement tasks directly from the user device 500 interface. For example, upon identifying that a needed item is available at store 502, the AI agent 510 may allow the user 501 to initiate a remote order, check stock availability, or reserve the item for pickup via an integrated vendor ordering module. The agent 510 may also retrieve and auto-fill project-specific material codes or dimensions based on past records.

In some cases, the AI agent 510 may automatically synchronize the procurement intent with the broader project schedule or cost allocation ledger. If an order is placed, the AI agent 510 may update procurement logs, notify accounts department, or revise inventory forecasts associated with the relevant project task. For example, if wooden flooring for Project-3 is scheduled for March 20, and the order is placed for 100 square feet of laminate on March 15, the AI agent 510 may flag that the lead time aligns appropriately.

In embodiments where the AI agent 510 is part of a broader network of agents (as described in earlier figures), the agent 510 may also communicate with agents associated with labor management or site operations to prepare for incoming material. For example, the flooring contractor's sub-agent may be instructed to reschedule their crew to be on site the day after material delivery.

In some embodiments, if the user 501 declines or ignores a contextual prompt, the AI agent 510 may log the interaction for future learning or behavioral profiling. For example, if the user consistently rejects material procurement prompts in favor of later ordering through web portals, the AI agent 510 may recalibrate its threshold for issuing in-person procurement suggestions.

In further embodiments, the AI agent 510 may cluster and rank nearby resources based on relevance, urgency, historical preferences, and project timelines. For example, if multiple vendors are within a five-minute radius of the user's current location 501A, but only one vendor has supplied HVAC parts reliably in the past, that vendor may be prioritized in suggestions for HVAC projects.

Figure 5A:
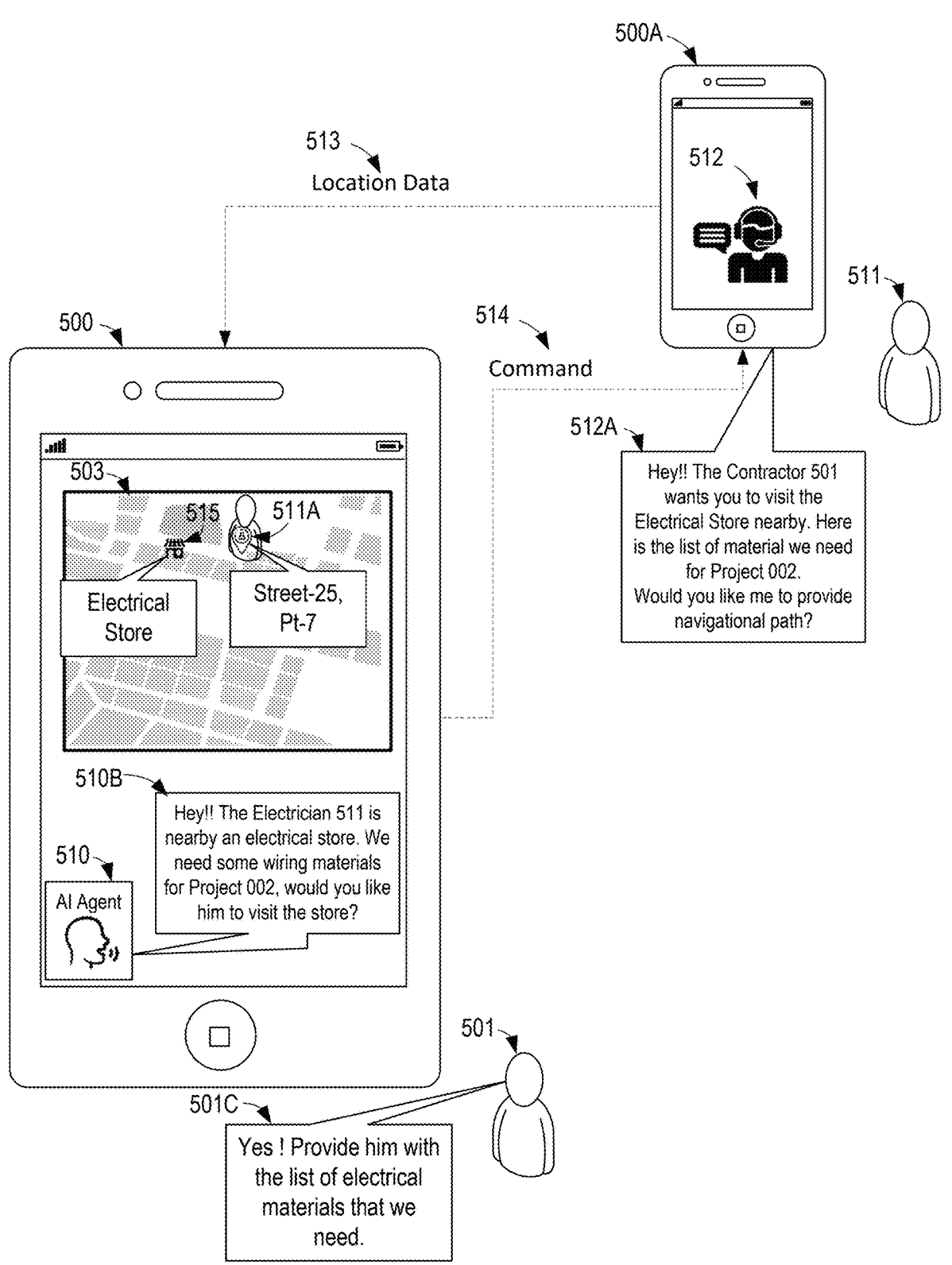

Referring now to FIG. 5A, an exemplary system is illustrated for demonstrating contextual coordination between two or more user devices, namely a first user device 500 and a second user device 500A, based on real-time location data 513 and inter-agent communication 514 in accordance with some embodiments of the present invention. The first user device 500 is associated with a first user 501, who may be a contractor, project supervisor, or site manager. The second user device 500A is associated with a second user 511, such as an electrician working under the supervision of the first user 501. Each of these user devices 500 and 500A may operate an Agentic AI module 510 and 512 respectively, which may be configured either as master-sub-agent pairs or as independent contextual AI agents.

In some embodiments, the Agentic AI 510 running on the first user device 500 may be configured to constantly monitor the project requirements and the movement of associated personnel, such as subcontractors, technicians, and laborers, by interpreting contextual information such as geographic coordinates received from GPS modules embedded within the second user device 500A. The first user device 500 may further comprise an interactive display configured to show a digital map 503, a speaker for voice-based prompts, and a microphone for capturing verbal inputs 501C from the user 501.

The Agentic AI 510 may be configured to receive location data 513 from the second user device 500A, indicating the live position of the second user 511. The location data 513 may be shared periodically or in real time, based on a pre-configured sharing protocol between the user devices 500 and 500A. Such a protocol may depend on multiple parameters such as project assignment, user preference, hierarchical permissions, and security clearance levels. For example, in a one-way location sharing model, the second user device 500A operated by an electrician 511 may continuously transmit its geolocation to the first user device 500 operated by the contractor 501, without requiring the contractor to reciprocate the sharing.

In another embodiment, the location sharing may be configured to be bidirectional, where both the user devices 500 and 500A share location data to facilitate dynamic coordination. This model may be applicable where the two users, such as a site supervisor and a plumbing subcontractor, are working collaboratively at different site zones and need to converge for discussion or material handoff. The Agentic AI 510 and 512 may utilize these data points to autonomously suggest mutual meeting points, estimate travel time, or generate alerts based on geographical proximity.

As shown in FIG. 5A, the Agentic AI 510 executing on the first user device 500 receives location data 513 indicating that the second user 511 (electrician) is located at a position 511A proximate to a physical resource node such as an electrical store 515. The AI agent 510 then cross-references the contextual need for electrical supplies required for a project 002 being handled by the first user 501. This determination may be made based on current inventory status, scheduled milestones for project 002, and historical procurement logs stored locally or in a connected database.

Based on the contextual intersection between proximity to store 515 and material needs for project 002, the Agentic AI 510 triggers a recommendation prompt 510B directed toward the first user 501. The recommendation prompt 510B may be rendered visually on a display screen or acoustically through a speaker, asking the user whether the electrician 511 should be instructed to visit the store 515 and procure the required items.

In some embodiments, the prompt 510B may contain supplementary details such as itemized lists of needed materials, ongoing store promotions, estimated cost, and expected delivery timelines. The prompt 510B may further include actionable options like "Send Instruction," "Add Items," or "Ignore for Now," thereby allowing the user 501 to make an informed decision.

The user 501 may respond to the recommendation prompt 510B by providing a verbal input 501C such as "Yes, provide him with the list of electrical materials that we need." The verbal input 501C may be processed using a speech recognition module embedded within the first user device 500. Alternatively, the user 501 may interact through textual input via a touch-based interface.

Upon receiving a valid input from the user 501, the Agentic AI 510 composes a task-specific command 514 that encapsulates the required actions. This command 514 may include detailed instructions, the list of electrical items needed, store address, contact information, and a suggested timeline for task completion. This command 514 is transmitted wirelessly to the second user device 500A.

The second user device 500A, upon receiving the command 514, activates its embedded Agentic AI module 512 which may either be a sub-agent of the AI module 510 or an independent peer agent. The AI agent 512 analyzes the incoming command 514 and generates an appropriate prompt 512A targeted at the second user 511.

The prompt 512A may be displayed as a pop-up notification on the screen or may be played as an audio instruction such as "Hey! The contractor 501 wants you to visit the electrical store nearby. Here is the list of materials we need for Project 002. Would you like me to provide the navigational path?" This prompt 512A may be interactive and capable of accepting voice responses, gesture inputs, or touch-based selections from the second user 511.

In some embodiments, the second user 511 may confirm the request via a simple voice command such as "Okay, proceed" or "Yes, show the route." Upon confirmation, the AI agent 512 may automatically launch a navigation module that calculates the optimal route from the user's current location 511A to the electrical store 515. The route may be rendered on a digital map or provided as turn-by-turn audio guidance.

The system as described in FIG. 5A may also include fallback mechanisms in cases where the user 511 does not respond within a specified timeout. For example, the AI agent 512 may repeat the prompt 512A or escalate the task to a backup user such as a delivery assistant assigned to the same project 002.

In certain configurations, the electrical store 515 may also be equipped with its own digital interface capable of receiving advance notification of incoming personnel. The Agentic AI 512 may send a pre-visit alert to the store, including the list of materials and estimated time of arrival, enabling store personnel to prepare the order and reduce transaction time.

Such a system significantly reduces manual dependency on the contractor 501 for micromanagement and empowers AI agents 510 and 512 to perform autonomous micro-level coordination, thereby optimizing project timelines and resource utilization.

In an alternate embodiment, the prompt 510B may additionally suggest alternative electricians who are geographically closer to the store 515 or are less occupied based on their current workload status. This multi-agent awareness may be supported by a shared contextual database or real-time workforce analytics.

Moreover, the recommendation mechanism triggered by the Agentic AI 510 may not be limited to procurement. It may be adapted to other tasks such as requesting status updates, requesting photos of installed electrical components, or assigning inspection duties.

In some embodiments, the system may utilize machine learning models trained on historical task completions and user decisions to determine the probability of prompt acceptance by the user 501. This may enable the AI agent 510 to prioritize prompts and reduce cognitive overload.

The decision-making process performed by the AI agents 510 and 512 may include weightage-based evaluation matrices where proximity to resource nodes, urgency of material need, workload balance, and historical reliability of the second user 511 are factored into the final recommendation.

The system may also include audit trails where generated prompts, user responses, and executed commands are logged for future reference. Such logs may be useful in analyzing field operations, material usage trends, and worker responsiveness.

In a further embodiment, the command 514 transmitted from the first user device 500 may include encrypted metadata indicating task priority, supervisory level, and time-sensitive flags. The second user device 500A may be configured to decode and act upon these metadata flags automatically.

The AI agents 510 and 512 may also support a shared state model where each agent maintains a lightweight shadow state of the other agents it coordinates with. In the present example, the AI agent 510 may maintain contextual variables such as the last known location, task list, and material handling preferences of the AI agent 512. This shared state may be refreshed periodically via handshake protocols between agents or may be hosted on a cloud-based middleware that acts as a context synchronization layer.

The interactive communication model described in FIG. 5A may also support offline fallback modes where commands such as 514 are cached locally on the second user device 500A and executed once connectivity is restored.

Moreover, AI agent 510 may also consult regulatory constraints, project-specific procurement protocols, or vendor agreements before issuing the command 514. These constraints may be stored in a centralized compliance policy engine accessible to both devices 500 and 500A.

In some cases, the electrical store 515 may have variable operating hours or limited inventory. The AI agent 510 may retrieve this data in real time through API integrations or web scraping modules and adjust the recommendation prompt 510B accordingly.

Furthermore, agent-to-agent interactions between 510 and 512 may support natural language transfer, where nuanced directives from user 501 are interpreted and converted into simplified prompts for user 511 without compromising the intended context.

The described system may also integrate with digital payment gateways enabling user 511 to process payment transactions at the store 515 directly through instructions embedded within command 514. In yet another embodiment, the Agentic AI 510 may prioritize the execution of task directives based on concurrent project workloads, weather forecasts, or travel constraints.

In some embodiments, the sub-agent 512 may independently operate as an intelligent assistant to the second user 511 and may proactively initiate actions or prompts without direct commands from the supervising AI agent 510. For example, as discussed in relation to FIG. 5, the sub-agent 512 may detect that the electrician 511 is within close proximity of an electrical store 515 and autonomously prompt the electrician 511 to visit the store, even before receiving any instruction from the contractor 501. In such cases, the sub-agent 512 may utilize location data, historical patterns, prior task assignments, and material demand forecasting algorithms to determine the contextual relevance of the nearby store 515 to the second user's active work responsibilities. The AI agent 512 may present a prompt similar to "You are currently near Electrical Store 515, which stocks wiring materials recently flagged as low inventory for Project 002. Would you like me to generate a shopping list and initiate navigation?"

In some embodiments, the system allows hierarchical relationships between projects and users. The first user 501, for example, may be concurrently managing multiple projects-such as Project 001, Project 002, and Project 003—each with their own timelines, teams, and procurement requirements. Meanwhile, the second user 511 (electrician) may only be affiliated with Project 002. In such scenarios, the AI agent 510 on the first user device 500 may analyze the current location 511A of the second user 511, determine the geographical proximity to the electrical store 515, and identify that materials required for Project 003 (not Project 002) are available at the store.

The AI agent 510 may then display a prompt 510B stating, "The electrician 511 is near Electrical Store 515. Project 003 is short on three-phase power cables, which are in stock at the store. Would you like me to ask the electrician to procure them now?" Upon receiving a verbal or textual confirmation 501C such as, "Yes, provide him the list of cables required for Project 003," the AI agent 510 may transmit a command 514 to the second user device 500A. Despite the electrician 511 being officially involved in Project 002, the system facilitates inter-project coordination by leveraging proximity-based opportunity management.

The sub-agent 512 on the second user device 500A may present a corresponding prompt 512A such as, "The contractor 501 has identified you are near a store that stocks urgent materials for Project 003. Although you're not currently assigned to that project, would you like me to generate a list and provide directions for purchase?" Such interaction highlights the distributed intelligence and multi-project awareness that may be embedded in the collaborative ecosystem facilitated by AI agents.

In some embodiments, the prompt 512A may further provide context to avoid confusion. For example, it may specify, "Although you're currently working on Project 002, this request pertains to Project 003 which the contractor is also managing. This task may be treated as a shared support initiative." The electrician 511 may then choose to proceed with or decline the request, based on availability, task priority, or work agreements. If accepted, the system may auto-generate a purchase list, estimate delivery timelines, notify relevant stakeholders, and log the purchase under the appropriate project ledger.

In additional embodiments, the sub-agent 512 may also recommend a deferred action. If the electrician 511 is currently engaged in a time-sensitive activity, the sub-agent 512 may say, "You're near Electrical Store 515, but your current task has 20 minutes remaining. Shall I remind you after that time?" This time-aware scheduling capability allows seamless integration of opportunistic procurement with the existing work schedule, improving project efficiency and responsiveness.

The above-described framework also provides auditability and accountability. Every prompt, decision, approval, and transaction may be logged in the project's digital logbook, retrievable by either user 501 or user 511. Additionally, rules-based constraints may be implemented to restrict such cross-project interventions, governed by predefined permissions and cost authorization limits. The AI agents 510 and 512, in such cases, act not only as proactive assistants but also as compliance-aware facilitators for dynamic resource management across multiple projects and stakeholders.

In some embodiments, the AI agent 510 may receive and analyze geolocation data indicating that a worker, such as user 511, is approaching or is present near a designated construction or maintenance site. Upon detecting the proximity of the worker 511 to the relevant work zone, the AI agent 510 may automatically initiate preparatory actions in anticipation of the worker's arrival. Such actions may include remotely activating specific tools, initiating power-up sequences for machinery, unlocking access-controlled equipment storage, or adjusting environmental settings required for safe and efficient task execution. For example, if the worker 511 is an HVAC technician approaching a rooftop unit, the AI agent 510 may pre-activate power engines, diagnostic sensors, or maintenance access panels, thereby reducing downtime and enhancing operational readiness at the site.

Figure 6:
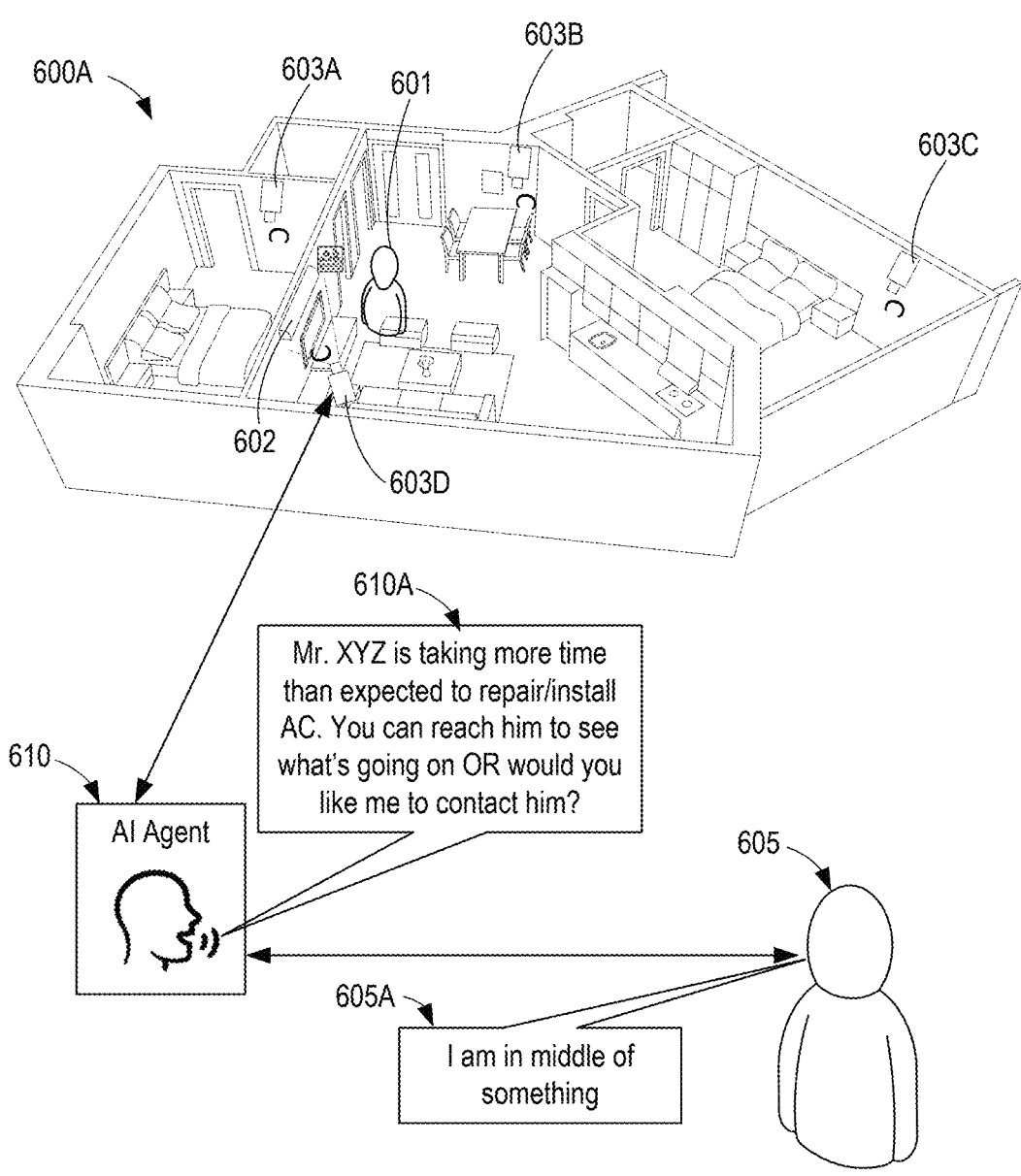
FIG. 6 illustrates an exemplary system in which an AI agent monitors real-time construction or maintenance activities, in accordance with some embodiments of the present invention.

Referring now to FIG. 6, an exemplary system 600 is illustrated in which an AI agent 610 monitors real-time construction or maintenance activities, in accordance with some embodiments of the present invention. The system 600 may include a site environment (600A), such as a construction site or a completed building undergoing maintenance work. The environment may be equipped with a plurality of IoT devices including cameras 603A, 603B, 603C, and 603D, which may be installed in different parts of the structure to provide comprehensive visual monitoring coverage of various spaces and activities performed therein.

In some embodiments, the AI agent 610 may be operated from a user device or cloud-based platform and associated with a supervisory user 605 who is remote from the location of the maintenance or construction work. The AI agent 610 may receive continuous or periodic visual feeds and meta-data from the IoT-enabled cameras 603A-603D and analyze the behavior, posture, location, tools, or movement patterns of one or more workers such as the on-site worker 601.

The worker 601 may be performing a task such as repairing or installing an air conditioning unit 602 within a room of the site 600A. Based on historical data or real-time performance benchmarks, the AI agent 610 may determine that the worker 601 is taking longer than the expected time allocated for the specific AC maintenance task. This delay may trigger the generation of a prompt 610A by the AI agent 610 directed toward the supervisory user 605.

The prompt 610A may be rendered as either a textual message or an audio message, depending on the preferences of the supervisory user 605 or system configurations. For example, the AI agent 610 may generate the prompt 610A with content such as: "Mr. XYZ is taking more time than expected to repair/install the AC. You can reach him to see what's going on or would you like me to contact him?" Such a prompt may include embedded options that allow the supervisory user 605 to choose a responsive action.

Upon receiving the prompt 610A, the supervisory user 605 may choose to respond via a verbal command or a touch-based selection rendered through a user interface. In the illustrated example, the response 605A from the user 605 may comprise: "I am in middle of something," which the AI agent 610 may interpret as a directive to autonomously proceed with the communication or coordination necessary to resolve the detected delay.

In some embodiments, the AI agent 610 may use natural language processing to evaluate the content of verbal responses or intent conveyed by short messages from the supervisory user 605. For example, if the user responds with text such as "check with him" or "ping him for me," the AI agent 610 may interpret that as consent to engage with the worker 601 directly.

The AI agent 610, upon determining that it is authorized to contact the worker 601, may initiate a conversation using the worker's local device, such as a wearable headset, smart glasses, mobile phone, or site-installed speaker system. The communication may include questions like, "Are you encountering any issues with the AC unit?" or suggestions like, "Let me fetch a checklist for common AC installation problems."

In other embodiments, the AI agent 610 may also cross-reference IoT sensor data from the AC unit 602 or the building management system to understand whether the AC unit is functioning sub-optimally due to power fluctuations, wiring errors, component failure, or incorrect positioning.

In yet other embodiments, if the worker 601 is not responsive, the AI agent 610 may escalate the notification hierarchy and send additional alerts to secondary supervisors, project managers, or team leads who are responsible for the task at the given time slot. These escalations may be based on predefined protocols that consider the duration of non-response, project criticality, or the cost of delay.

In one example, the AI agent 610 may detect that the room in which the AC 602 is being installed is becoming unusually hot due to failure of temporary ventilation systems. The system may use input from temperature sensors located in a room to make this determination and cross-correlate it with the worker's increased dwell time in that room.

In another embodiment, the AI agent 610 may determine that the worker 601 has visited the same component or subunit of the AC 602 multiple times without making progress. This could be inferred from movement heatmaps generated using video analytics algorithms on the video streams from cameras 603A-603D.

The AI agent 610 may also track when the worker 601 started the task, what tools were accessed, and what parts were installed or removed. This data may be captured by computer vision models or by integrating with a digital inventory management system that logs tool checkout activity.

Moreover, the AI agent 610 may compare the present activity timeline with historical average durations of similar AC repair or installation tasks from previous workers, and flag anomalies when current durations deviate significantly beyond the upper bounds.

The AI agent 610 may offer action prompts that go beyond just notifying the user 605. For example, it may offer to check with the warehouse to confirm part availability, send a request to another technician for a second opinion, or suggest pausing the task temporarily if some safety parameter is triggered.

The cameras 603A-603D may also be equipped with AI processing modules that run edge inference engines to identify safety breaches, such as exposed wiring, improper equipment handling, or lack of protective gear, and send alerts to the AI agent 610.

The AI agent 610 may perform behavioral analysis of the worker 601 by detecting stress indicators from visual cues like erratic hand movements, excessive face wiping, or pauses in activity. These may indicate fatigue or confusion that warrants supervisory intervention.

In some use cases, the AI agent 610 may detect when the worker 601 has been idle in a fixed posture without performing relevant tasks for a predefined duration and generate a prompt to inquire whether help is needed. In further embodiments, the AI agent 610 may also coordinate with building security systems to temporarily grant access to the room being serviced, open electronic locks on tool cabinets, or illuminate dark corners of a room by activating smart lighting, thereby facilitating the task without user involvement.

Additionally, the AI agent 610 may generate a real-time activity timeline or dashboard visible to the supervisory user

605 showing status updates, time logs, task milestones, and possible blockers. In other embodiments, the system 600 may be used in training contexts, where newly hired technicians are being remotely observed by supervisors who receive AI-generated insights and recommendations on performance.

The AI agent 610 may also monitor for compliance with standard operating procedures, such as following correct sequences in dismantling and reassembly, or confirming that insulation is applied before switching on power.

If the AI agent 610 detects tasks performed out of order, it may interrupt the worker through voice commands and advise to revisit missed steps or initiate re-checks.

The AI agent 610 may also log metadata such as ambient temperature, humidity, light levels, and power availability at the site 600A for each time segment and use these factors to adjust its estimation models and task forecasting modules.

In another example, if the AI agent 610 detects that the AC unit 602 has been switched on but the airflow is not detected by its onboard sensors or adjacent motion sensors, it may infer incomplete installation or poor output and prompt remedial suggestions.

The system 600 may also include an autonomous logging mechanism where each task performed by the worker 601 is recorded by timestamp, activity tag, location, and status completion label, which the supervisory user 605 may later review or export.

In yet another embodiment, if the AI agent 610 receives prior alerts about delays or malfunctioning in nearby units, it may dynamically modify the task priority queue and reallocate available technician hours accordingly.

Where there are multiple concurrent workers on-site, the AI agent 610 may use facial or uniform recognition to differentiate between them and track performance individually, enabling personalized recommendations and alerts.

Moreover, the AI agent 610 may conduct sentiment analysis on verbal responses provided by workers during task execution and report on engagement levels, motivation, or hesitation.

In a collaborative team setup, if two or more technicians are required for a single task, the AI agent 610 may notify when a second technician is available nearby and facilitate synchronized joining of tasks. The AI agent 610 may integrate with digital maintenance logbooks and automatically populate entries such as worker name, task type, duration, observations, and follow-up notes.

Furthermore, the system 600 may allow the AI agent 610 to suggest breaks to the worker 601 after detecting signs of prolonged work or based on labor regulations or policies pre-programmed into its compliance engine. The prompt 610A may also be scheduled to recur at configurable intervals if the user 605 does not respond or delegates follow-up to the AI agent 610.

In some embodiments, if a component is found defective during installation, the AI agent 610 may contact suppliers automatically to initiate a replacement process or verify warranty status from stored product metadata.

The system 600 may be scaled to support multiple AI agents monitoring various buildings or sites from a central interface, each issuing prompts, alerts, or escalation messages specific to the tasks in progress.

Additionally, the AI agent 610 may recommend that documentation such as photographs, videos, or error logs be captured and attached to the task entry in a centralized project management system. The AI agent 610 may also act as a language intermediary by translating or rephrasing communications between users or between systems, improving accessibility and clarity.

Figure 6A:
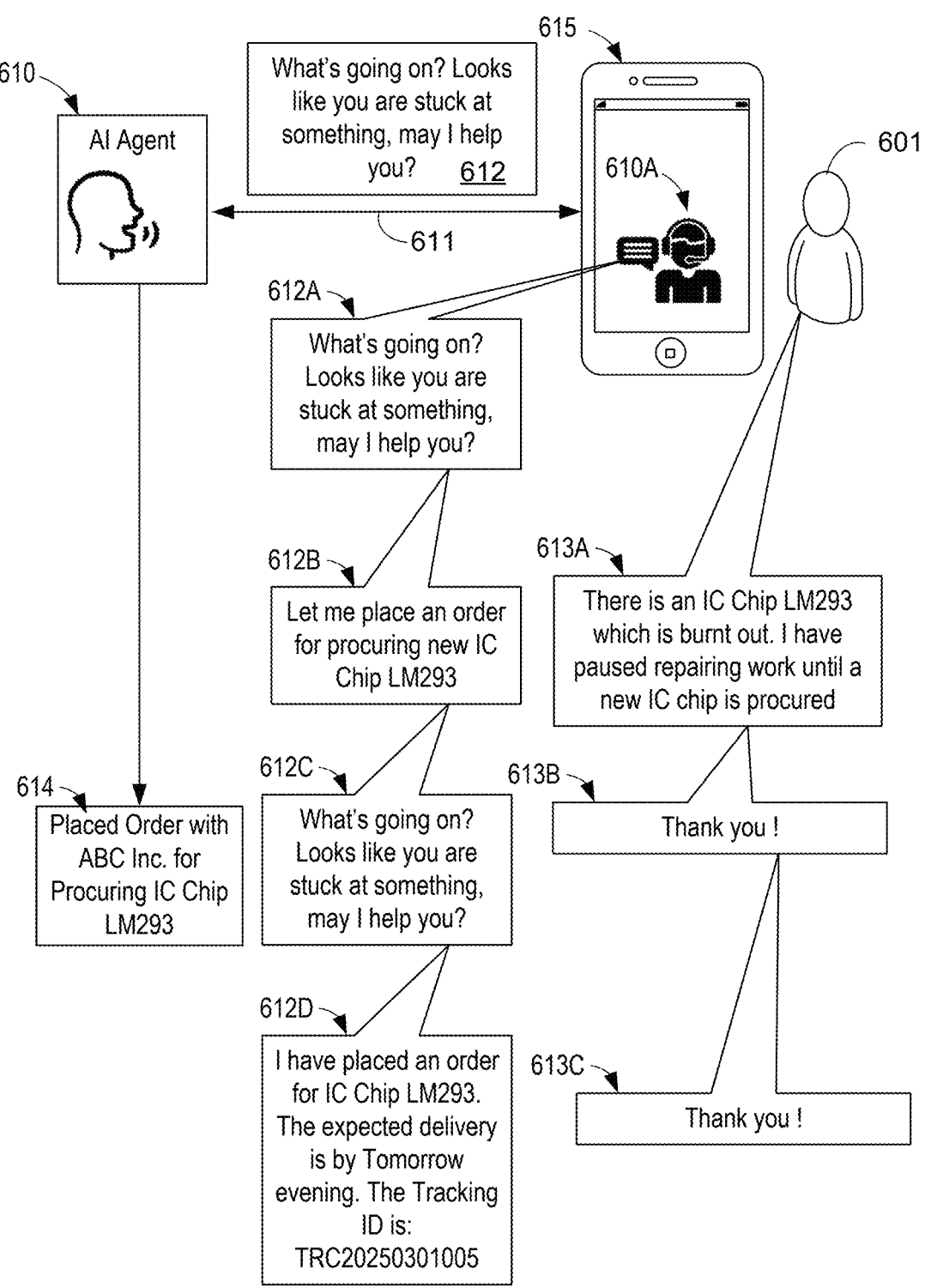
FIG. 6A illustrates an exemplary conversational flow wherein an AI agent autonomously engages with on-site workers based on contextual need, in accordance with the present invention.

Referring now to FIG. 6A, an exemplary system is illustrated depicting a dynamic conversational framework wherein an AI agent 610 autonomously interacts with an on-site technician 601 using natural language interfaces across distributed devices, in accordance with some embodiments of the present invention. The figure builds upon the interaction model introduced in FIG. 6, where a supervisory user has delegated autonomy to the AI agent 610 due to their unavailability (e.g., based on user's response 605A).

In the illustrated system, a primary AI agent 610 operates from a remote user device or cloud-based processing unit, designed to monitor contextual site performance and detect anomalies or idling behavior. Upon observing that the worker 601 is potentially stalled, the AI agent 610 initiates a first contextual inquiry 612 directed toward the secondary sub-agent 610A operating on the on-site user device 615, which may be a mobile phone or tablet assigned to the worker 601.

The wireless communication link 611 transmits the inquiry message 612, which the sub-agent 610A then converts into a natural language output such as text-to-speech or chat-based visual prompt 612A. For example, message 612A may state: "What's going on? Looks like you are stuck at something, may I help you?". This conversational capability facilitates direct communication without requiring manual supervision.

In response to prompt 612A, the technician 601 may input a verbal or text-based response 613A using their device 615. In the illustrated embodiment, message 613A may include an explanation of the work delay: "There is an IC Chip LM293 which is burnt out. I have paused repairing work until a new IC chip is procured."

Upon receiving the contextual feedback 613A, the sub-agent 610A relays the message back to the AI agent 610 for processing and further decision-making. The primary agent 610 may then autonomously determine a responsive action, such as initiating a procurement request.

The AI agent 610 generates a proactive reply 612B stating, for example, "Let me place an order for procuring new IC Chip LM293." This message is sent again over communication link 611 to the sub-agent 610A, who presents it to the technician 601.

Once the procurement task is acknowledged, the AI agent 610 executes a vendor interaction protocol resulting in a placed order, depicted as step 614 in FIG. 6A. The order may include chip specifications and recipient details, submitted to a vendor such as ABC Inc., and may be logged under a unique transaction identifier TRC20250301005.

Following the placement, the AI agent 610 continues the conversational loop by transmitting a status update message 612C to the sub-agent 610A: "What's going on? Looks like you are stuck at something, may I help you?". While seemingly redundant, this re-engagement provides an opportunity to handle any additional context.

The technician 601 may respond with gratitude or additional instructions using message 613B: "Thank you!", confirming receipt and readiness to proceed once the chip arrives. This positive feedback loop supports AI adaptation and confidence scoring.

The AI agent 610 may further update the technician with delivery information through message 612D, transmitted to sub-agent 610A: "I have placed an order for IC Chip LM293. The expected delivery is by tomorrow evening. The Tracking ID is: TRC20250301005."

A final acknowledgment 613C from technician 601 such as "Thank you!" signifies successful handoff and concludes the conversation cycle for this specific event. Each of these exchanges represents stateful interactions managed by both the main and sub-agents.

In some embodiments, the user device 615 may possess a specialized conversational interface configured to handle low-latency, contextual prompts driven by the AI agent 610's analysis of progress gaps, equipment malfunctions, or supply delays.

The sub-agent 610A may operate under constrained permissions relative to the master agent 610, such as only accessing current tasks, device logs, or supply statuses, without full cross-project visibility, thereby preserving compartmentalized security and operational integrity.

Moreover, the AI agent 610 may optionally notify the supervisory user 605 regarding the exchange and autonomous order placement. This notification may include a summary of the conversation and a purchase receipt, depending on policy constraints assigned to the AI agent.

In scenarios where the technician 601 does not respond within a predefined duration, the AI agent 610 may initiate escalations such as contacting alternative personnel or alerting other team members via networked systems. In some embodiments, the AI agent 610 may be configured to cross-check inventory databases before placing an external order, potentially reallocating an LM293 chip from another active or dormant project site. Such real-time, autonomous task delegation and decision-making capability drastically improves workflow continuity, reduces idle labor time, and enhances predictive planning.

Each message node 612A-612D and 613A-613C may be timestamped and logged for audit and training purposes, improving future AI decision models through supervised reinforcement learning algorithms.

The communication link 611 may support multiple transport layers, such as Wi-Fi, LTE, or 5G, and may fall back to SMS or satellite communications in low-connectivity environments.

The AI agent 610 may track conversational flow metrics to identify patterns of repeated material shortages, triggering backend analytics to recommend bulk purchasing or preventive stock planning.

The technician's device 615 may also interface with peripheral IoT sensors capable of validating the stated fault—e.g., an oscilloscope attached to the circuit may confirm a voltage drop across the burnt LM293 chip.

In more advanced embodiments, sub-agent 610A may be voice-enabled to operate completely hands-free, a beneficial feature when the technician 601 is working in physically constrained or hazardous environments.

The prompt 612A may include a visual cue in addition to text, such as a blinking indicator or color-coded urgency banner to attract attention, especially in noisy environments.

Command parsing within AI agent 610 uses a hierarchical intent-entity recognition model to deconstruct and respond to natural language inputs effectively. This makes conversation smoother and more human-like.

Beyond component ordering, such AI-driven conversations may evolve into diagnosis protocols. For example, sub-agent 610A may run a multi-step questionnaire to identify probable fault causes.

Additionally, the system may store frequently used parts and repair scenarios for each technician 601, enabling accelerated resolution and predictive job preparation.

Technician 601 may have their device 615 synced with a project schedule, and AI agent 610 may adapt its conversational tone and frequency based on urgency and workload.

The AI agent 610 may also factor in delivery times, vendor reliability, and past procurement success rates in deciding which vendor to order from for a given component.

These interactions collectively enable construction and maintenance ecosystems to operate with reduced human micro-management and improved system coherence across distributed actors.

In further embodiments, sub-agent 610A may offer multi-language support to accommodate technician preferences, with agent 610 translating responses automatically. The system may further incorporate biometric access control to authenticate that technician 601 is the intended recipient of the AI's communications, enhancing operational accountability.

In some examples, technician 601 may request additional actions from sub-agent 610A such as adding this incident to a task log, scheduling a rework audit, or documenting the issue photographically. Conversational logs may be stored securely and later accessed by stakeholders, aiding in report generation, dispute resolution, or post-project quality review.

The procurement confirmation 612D may include not just expected delivery time, but vendor contact info and a dynamically updating ETA based on tracking ID TRC20250301005. Dynamic routing of messages between AI agent 610 and sub-agent 610A through link 611 may employ edge caching to mitigate connectivity disruptions.

The chip ordering sequence initiated at 614 may be subjected to rules/permissions similar to those discussed in FIG. 1A element 105, limiting which materials may be autonomously procured. In alternative embodiments, agent 610 may provide substitution options if IC Chip LM293 is unavailable, offering compatible components from alternate suppliers.

Figure 7:
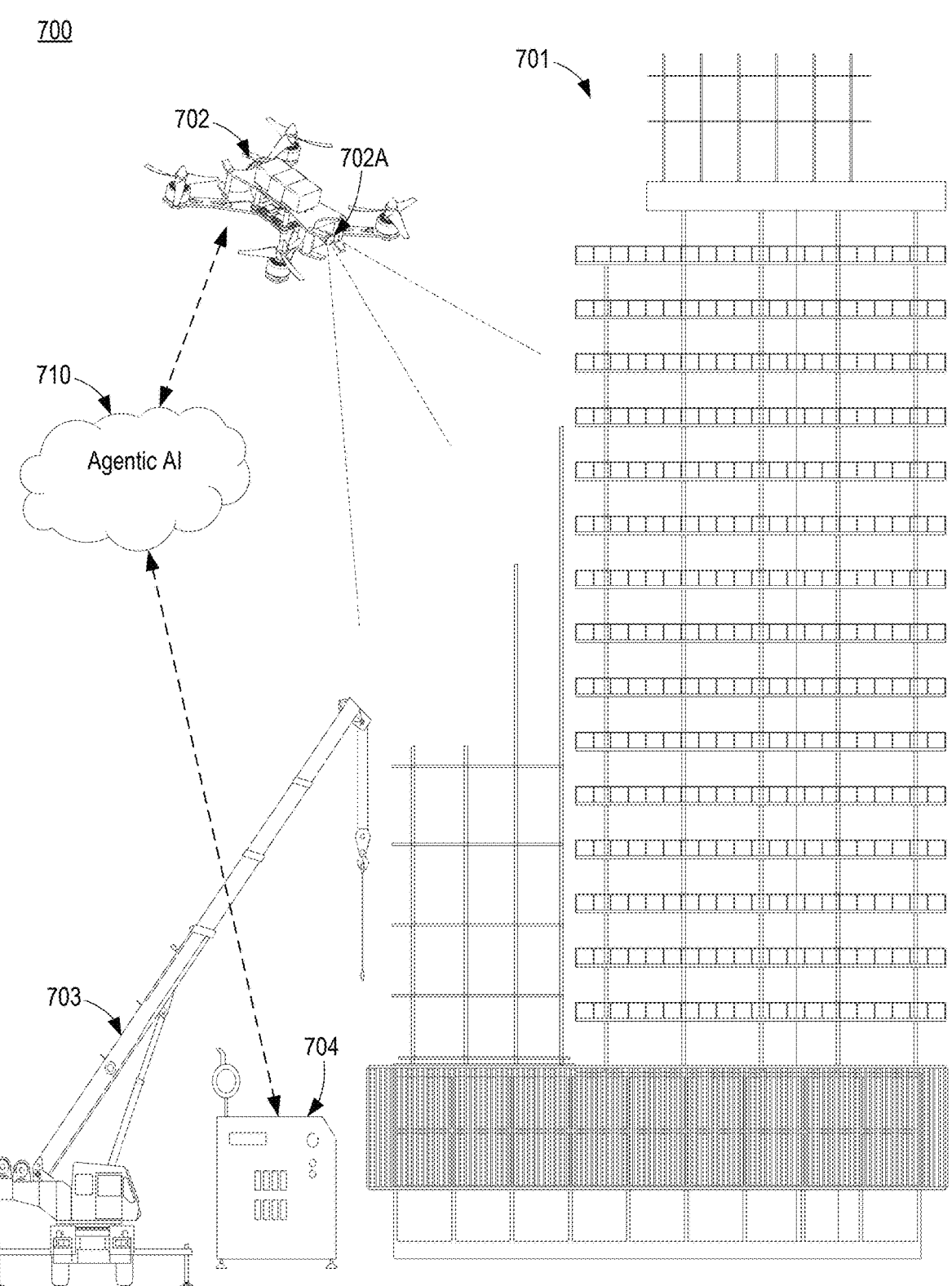
FIG. 7 illustrates an exemplary system for autonomous construction site monitoring and equipment control using Agentic AI, in accordance with some embodiments of the present invention.

Referring now to FIG. 7, an exemplary system 700 is illustrated for autonomous construction site monitoring and equipment control using Agentic AI, in accordance with some embodiments of the present invention. As shown, the system 700 comprises an under-construction building 701, a drone 702 equipped with at least one camera 702A, a crane 703, an electrical or power generator control unit 704, and an AI agent 710. The AI agent 710 may be deployed on a cloud-based infrastructure, or it may be locally executed on a high-performance computing device accessible by supervisory staff.

In one embodiment, the AI agent 710 may be programmed to periodically monitor the progress of a construction site comprising the under-construction building 701. This monitoring may be triggered on a predefined schedule or may occur in response to an explicit user command. For example, a site supervisor or project manager may instruct the AI agent 710 to inspect the facade completion progress every 6 hours.

In another embodiment, the AI agent 710 may be capable of autonomous decision-making to launch the drone 702 in response to certain data anomalies. For example, if the construction materials logged by IoT-based inventory trackers indicate a slower-than-expected usage rate for concrete, the AI agent 710 may launch the drone 702 to inspect the concrete pouring zones on building 701.

The drone 702, as illustrated, is configured to perform aerial navigation and on-site inspection. It may include multiple cameras 702A that are operable to capture still images and live video feeds in high resolution, including thermal and night-vision modes for low-light conditions.

The camera 702A may transmit live or recorded footage to the AI agent 710 over a secure wireless network. The AI agent 710 may analyze the footage using computer vision models trained to detect predefined objects, construction milestones, or anomalies. These models may be trained to detect scaffolding positioning, structural beam alignment, window placement, facade completion, and safety equipment usage by workers.

In some embodiments, the AI agent 710 may also evaluate worker attendance or zone coverage based on human detection models. If a normally populated construction floor appears empty during scheduled work hours, the AI agent 710 may generate an alert or initiate corrective protocols.

In some embodiments, the contextual data received and processed by the AI agent 710 may include schedule-related information such as a planned or pre-configured inspection timeline for the construction site. This contextual schedule data may specify inspection intervals, time-stamped tasks, or predefined conditions under which site monitoring is to be conducted. Based on such contextual cues, the AI agent 710 may autonomously initiate the launch of the drone 702 to perform aerial inspection of the under-construction site. The drone 702, equipped with a camera 702A, may be activated at the scheduled time or in response to specific events derived from the contextual data, enabling the AI agent 710 to capture real-time visual inputs for analysis, recordkeeping, or decision-making related to construction progress, site safety, or task verification.

In one illustrative embodiment, the AI agent 710 may autonomously issue instructions to the crane 703 to move construction material pallets from the base floor to a higher floor of the under-construction building 701 if it determines that manual crane scheduling is not meeting deadlines.

The crane 703 may be equipped with an IoT interface module that allows two-way communication with the AI agent 710. Based on the processed drone footage and the construction schedule, the AI agent 710 may transmit vector commands to the crane 703 for positioning, lifting, or rotating operations.

Similarly, the AI agent 710 may monitor and regulate the power generator 704 to manage load balancing across different construction activities. For example, if welding machines are running at maximum capacity and an HVAC testing operation is scheduled, the AI agent 710 may defer the HVAC startup to avoid power overload.

The AI agent 710 may also determine ideal times for load shedding or load allocation based on real-time power consumption analysis, which may be derived from smart meters embedded in the power control unit 704.

In another embodiment, the drone 702 may be equipped with sensors beyond cameras, such as LiDAR, ultrasonic sensors, and gas sensors, to detect topographical accuracy, construction surface leveling, or the presence of hazardous gases.

The Agentic AI 710 may use LiDAR input to reconstruct a 3D model of the building 701 and compare it against the digital blueprint to detect deviations. If a concrete wall has been misplaced or an elevation differs from the design model, the AI agent 710 may generate a discrepancy report.

In further embodiments, the drone 702 may be used to inspect inaccessible areas such as high elevation structures, foundation trenches, or structural voids, thus reducing the need for physical scaffolding and manual risk.

When anomalies are detected, the AI agent 710 may take one or more autonomous actions, such as notifying relevant personnel, halting machinery through IoT commands, or adjusting subsequent schedules in a master project timeline.

In another exemplary use case, the AI agent 710 may monitor for safety compliance. It may determine from the camera 702A that workers are not wearing hard hats or harnesses. Upon identification, the AI agent 710 may send visual snapshots to safety supervisors for immediate intervention.

The system 700 also enables weather-aware operational planning. The drone 702 may carry environmental sensors or the AI agent 710 may fetch weather data from external sources. If high winds are forecast, the AI agent 710 may delay crane operation or stop concrete pouring tasks.

In some embodiments, the one or more internal (within the user device) and external sources from which contextual data is received by the controller may comprise at least one of: a BMS, Internet of Things (IoT) devices, location data of one or more users, weather data, material-vendor listings, and scheduling or calendar information. Each of these sources contributes discrete and interrelated datasets that provide situational awareness and operational inputs to the Agentic AI engine for intelligent planning, real-time monitoring, and dynamic task execution throughout the lifecycle of a construction or maintenance project.

The BMS may include subsystems such as HVAC controls, electrical systems, fire safety equipment, surveillance units, occupancy monitoring, and energy metering. The BMS may provide real-time values such as room temperatures, HVAC airflow rates, power consumption metrics, or fault alerts from smoke detectors or circuit panels. The AI agent may retrieve these values directly or through an integrated Application Programming Interface (API) and correlate them with building elements defined in the dynamic design plan to assess system health, detect anomalies, or generate actionable maintenance instructions.

IoT devices embedded at the project site may include motion detectors, structural stress gauges, vibration monitors, temperature and humidity sensors, leak detectors, and visual sensors (e.g., site cameras, drones). For example, a vibration sensor attached to a support beam may transmit readings indicating increasing oscillation frequency, prompting the AI agent to flag the component for inspection. Alternatively, a humidity sensor may detect excessive moisture near installed drywall, triggering a sequence of alerts and preventive actions related to potential mold formation or water leakage. These inputs may be directly analyzed or aggregated by the AI agent for status prediction, conflict identification, or scheduling adjustments.

Location data may be gathered via GPS, Bluetooth beacons, or Wi-Fi triangulation and may relate to any personnel or machinery on the site. For example, the AI agent may detect that a subcontractor is within a 100-meter radius of the project zone and initiate power-up sequences for machinery associated with that worker's assigned tasks. Similarly, if a supervisor is nearing the vicinity of a scheduled inspection site, the AI agent may push contextual prompts or summaries for review upon arrival.

Weather data may be accessed via an internet API or through on-site environmental sensors. This data may influence scheduling decisions, equipment operation, and worker safety protocols. For example, upon detecting forecasts of heavy rainfall, the AI agent may halt scheduled roof layering tasks, notify affected workers, and reprioritize interior tasks in the system's scheduling matrix.

Material-vendor listings may be obtained from cloud-based procurement databases, vendor-specific APIs, or shared spreadsheets. These listings may include pricing, availability, delivery times, location-based stock data, and past transaction histories. The AI agent may cross-reference such listings against pending procurement needs and suggest optimal vendors based on real-time pricing and logistical feasibility.

Scheduling or calendar information may include project milestone timelines, team member availability, inspection deadlines, delivery schedules, and leave plans. The AI agent may parse shared digital calendars or project management platforms and correlate this information with design requirements and real-world events. For example, if a critical inspection is scheduled during a period when the site engineer is marked unavailable, the AI agent may issue reallocation suggestions or preemptively reschedule dependent tasks.

Thermal imagery from the drone 702A may allow the AI agent 710 to detect overheating equipment or exposed electrical lines. Based on this detection, the AI agent 710 may instruct an on-ground robot or alert a technician for localized inspection.

In some embodiments, AI agent 710 may trigger multi-drone coordination for site-wide scanning. The drones may operate in defined sectors to maximize coverage. A master node may collect their inputs and generate a composite site report.

Drone footage processed by AI agent 710 may also be used to generate time-lapse visuals showing construction progression over hours, days, or weeks, which may be shared with clients or stakeholders.

The AI agent 710 may also control automated delivery systems such as site robots or conveyor belts. If materials are detected at site entrance, the AI agent may direct their distribution based on the urgency of construction phases.

Another monitoring task by AI agent 710 may include verification of temporary safety measures such as guardrails, barricades, and hazard signs. If these are found to be displaced or missing, alerts may be triggered.

AI agent 710 may also integrate with access control systems. If a worker attempts to access a zone outside their permission level, facial recognition from drone footage may enable flagging of unauthorized activity.

If the drone 702 detects accumulation of debris or waste at construction sites, the AI agent 710 may generate sanitation directives or reassign cleaning teams accordingly.

AI agent 710 may utilize image classification models to detect construction material types at various locations on-site and correlate these with supply chain data to flag material mismatches or pilferage.

By evaluating crowd density using real-time video analysis, AI agent 710 may optimize task assignment by suggesting redistribution of labor to underutilized areas.

In another embodiment, the drone 702A may identify parked construction vehicles and communicate their IDs to the AI agent 710 which may check idle duration and trigger reassignment or maintenance alerts. In some embodiments, drone-based inspection may also be used by AI agent 710 to document stages of inspection for legal compliance or insurance validation, and time-stamping the visuals automatically.

The AI agent 710 may also collaborate with building management systems to simulate post-construction workflows. For example, it may test door automation or elevator systems by triggering test routines and validating responses.

All data processed by the drone 702 and the AI agent 710 may be logged to a secure, immutable database for traceability. In case of dispute, original visual logs may be reviewed to ascertain factual timelines. The system 700 may also enable predictive analytics. By comparing current site visuals with historical trends, the AI agent 710 may forecast delays and recommend early interventions.

Each machinery such as crane 703 and generator 704 may have embedded sensors reporting real-time performance to the AI agent 710. This allows the agent to conduct health diagnostics and predict breakdowns.

AI agent 710 may monitor surface alignment using laser or optical sensors mounted on the drone 702. Uneven plastering or misaligned beams may be detected and flagged.

The drone 702 may also be deployed to visually track the inflow of delivery trucks. Based on license plate recognition, the AI agent 710 may authenticate entries and assign unloading zones.

In one embodiment, drone 702A may capture RFID tags embedded on materials to cross-check with inventory manifests maintained by the AI agent 710.

AI agent 710 may synchronize drone inspection schedules with available lighting conditions, maximizing visual clarity during inspections and avoiding night flights unless critical.

The system 700 may support autonomous recharging of the drone 702. When battery levels are detected to be low, the drone may return to a charging dock without manual intervention, with the AI agent 710 logging the downtime.

AI agent 710 may also execute benchmarking analytics. Data captured by drone 702 from building 701 may be compared with other similar projects to evaluate construction efficiency.

Drone 702 may be used for structural thermal mapping. Uneven thermal signatures detected by camera 702A may suggest possible defects in insulation, prompting deeper investigation.

Drone 702A may also be used to observe robotic brick-laying systems, enabling the AI agent 710 to verify alignment accuracy and motor consistency during automated wall construction.

If vibration sensors on structural parts relay data indicating high oscillations, AI agent 710 may deploy drone 702 for visual validation of structural integrity.

The construction site layout as seen in FIG. 7 may dynamically evolve. AI agent 710 may use drone 702 to capture daily snapshots and feed changes into a digital twin of building 701 for real-time modeling.

Drone 702, being airborne, may avoid ground-level obstructions and cover larger areas quickly. AI agent 710 may optimize flight paths for power savings and maximize data utility.

Based on real-time analysis, the AI agent 710 may also generate visual audit reports and notify the project stakeholders using project dashboards accessible via remote interfaces.

The AI agent 710, in conjunction with drone 702 and on-site machinery, provides an intelligent and responsive autonomous monitoring and control architecture for active construction sites.

Figure 8:
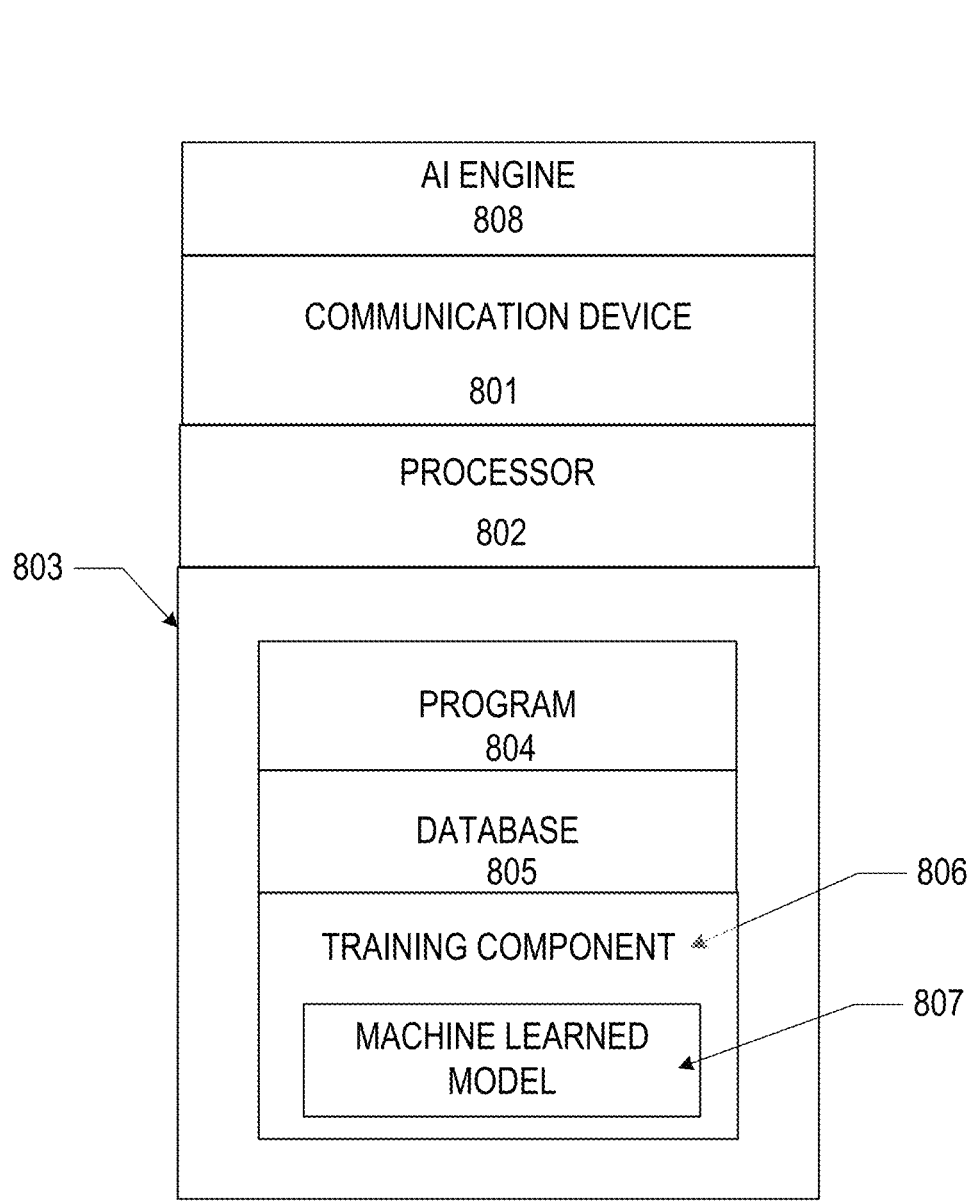
FIG. 8 illustrates exemplary processor architecture for use with the present disclosure.

Referring now to FIG. 8, an automated controller is illustrated that may be used to implement various aspects of the present disclosure, in various embodiments, and for various aspects of the present disclosure, controller 800 may be included in one or more of: a wireless tablet or handheld device, a server, a rack mounted processor unit. The controller may be included in one or more of the apparatuses described above, such as a Server, and a Network Access Device. The controller 800 includes a processor unit 802, such as one or more semiconductor-based processors, coupled to a communication device 801 configured to communicate via a communication network (not shown in FIG.

8). The communication device 801 may be used to communicate, for example, with one or more online devices, such as a personal computer, laptop, or a handheld device.

The processor 802 is also in communication with a storage device 803. The storage device 803 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 803 can store a software program 804 with executable logic for controlling the processor 802. The processor 802 performs instructions of the software program 804, and thereby operates in accordance with the present disclosure. In some embodiments, the processor may be supplemented with a specialized processor for AI related processing. The processor 802 may also cause the communication device 801 to transmit information, including, in some instances, control commands to operate apparatus to implement the processes described above. The storage device 803 can additionally store related data in a database 805. The processor and storage devices may access an AI training component 806 and database, as needed which may also include storage of machine-learned models 807.

In some embodiments, a controller 800 run an AI engine 808 that may include one or both of a GAN, and vision encoder. A vision encoder may include, for example, Vision Transformers (ViT) models, or other modules, to convert images into a form the AI Engine 808 may better understand. For example, in some processes, an scanned image, such as a design plan may be divided into patches. One or more patches may be transformed into one or more embedding vectors. The embedding vectors may be processed using transformer-based layers that capture spatial relationships and features included in the image.

An encoded image may be combined with text, lines, polygons, or other input types. In some embodiments, the controller 800 may use cross-attention mechanisms to align visual features with linguistic inputs (e.g., a question about the image). Alignment may enable the controller to perform tasks such as, for example, without limitation, one or more of: image captioning, visual question answering, and image-text matching.

For specific applications, such as, for example, one or more of: identifying objects, describing scenes, or analyzing diagrams). In some embodiments, a controller may access fine-tuned on curated datasets, such as for example design plans or portions of design plans. A model run the controller learns how to interpret images in these domains and respond accordingly.

An AI engine 808 may be executable to provide reasoning, not just recognition, such that the controller may: infer relationships between objects. It may also support chain-of-thought-style reasoning based on visual context. For example, given access to previous design plans and a question, it can analyze trends, make inferences, and justify answers in natural language. I addition, it may generate one or more of: diagrams showing revised plans, new plans, compliance with a set of given requirements, quantities of specified items, pricing for items included in a design plan, alternatives to design plan specifications, and other user requests or requirements specified. In some embodiments, image generation and editing may be paired with tools.

A Vision Transformer (ViT) may include a deep learning model architecture that applies the transformer architecture (originally designed for natural language processing) to image data. Instead of using convolutional layers such as, in CNNs, a controller running ViTs may treat images more such as, sequences of data, similar to words in a sentence.

In some embodiments, Vision Transformers run by a controller, may include one or more of the following:

Image Patching: An input image (e.g., 224×224 pixels) may be split into fixed-size patches, such as 16×16 pixels. Each patch may be flattened into a ID vector—for example, a 16×16 RGB patch becomes a 768-dimensional vector (16×16×3).

Linear Embedding (Embedding Layer): Multiple patch vectors may be passed through a linear layer (fully connected layer) to map it into an embedding space, such in a process similar to word embeddings in NLP.

Positional Encoding: Transformers may be position-agnostic (they do not require an inherent sense of spatial location), ViTs add positional encodings to each patch embedding. This helps the model understand where each patch may be located in the image.

Transformer Encoder: Multiple patch embeddings (now with positional info) may be passed through multiple layers of transformer encoders. Layers include may include multi-head self-attention, which lets the model weigh the importance of each patch in relation to others. This may be useful for capturing long-range dependencies, such as, for example, understanding that a toilet and a sink belong to a same area within a design plan.

Classification or Task Output: A [CLS] token (classification token) may be prepended to the input sequence, and its output embedding after transformer layers may be used for classification or other downstream tasks. For image-to-text tasks, patch embeddings may be passed to a decoder or used directly with cross-modal attention.

ViTs may produce tokenized representations of images, making it easier to integrate with text-based models. Self-attention allows the controller to reason across both image and text tokens holistically. ViTs can handle high-level reasoning (e.g., spatial relationships, object interaction) with increased flexibility.

Figure 9:
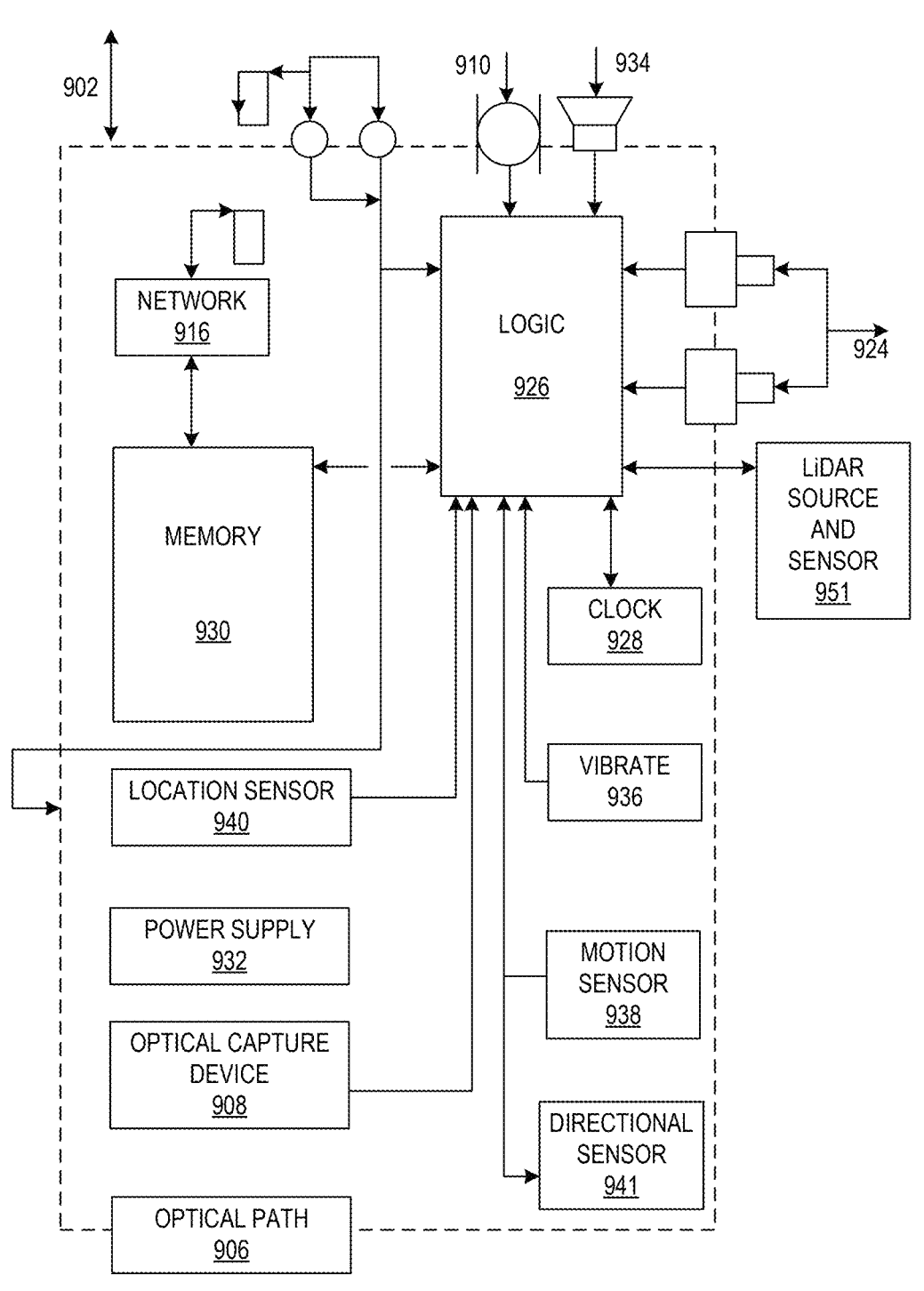
FIG. 9 illustrates exemplary mobile device architecture for use with the present disclosure.

Referring now to FIG. 9, a block diagram of an exemplary mobile device 902 is illustrated. The mobile device 902 (may also be referred to as user device) may comprise an optical capture device 908 to capture an image and convert it to machine-compatible data, and an optical path 906, typically a lens, an aperture, or an image conduit to convey the image from the rendered document to the optical capture device 908. The optical capture device 908 may incorporate a Charge-Coupled Device (CCD), a Complementary Metal Oxide Semiconductor (CMOS) imaging device, or an optical Sensor 924 of another type.

A microphone 910 and associated circuitry may convert the sound of the environment, including spoken words, into machine-compatible signals. The microphone 910 may also be utilized by users to provide audio annotations (or for speech-to-text annotations) of the present invention. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible feedback 934 may come from a loudspeaker or other audio transducer. Tactile feedback may come from a vibrate module 936.

A motion Sensor 938 and associated circuitry convert the motion of the mobile device 902 into machine-compatible signals. The motion Sensor 938 may comprise an accelerometer that may be used to sense measurable physical acceleration, orientation, vibration, and other movements. In some embodiments, motion Sensor 938 may include a gyroscope or other device to sense different motions.

A location Sensor 940 and associated circuitry may be used to determine the location of the device. The location Sensor 940 may detect Global Position System (GPS) radio signals from satellites or may also use assisted GPS where the mobile device may use a cellular network to decrease the time required to determine location.

The mobile device 902 comprises logic 926 to interact with the various other components, possibly processing the received signals into different formats and/or interpretations. Logic 926 may be operable to read and write data and program instructions stored in associated storage or memory 930 such as RAM, ROM, flash, or other suitable memory. It may read a time signal from the clock unit 928. In some embodiments, the mobile device 902 may have an on-board power supply 932. In other embodiments, the mobile device 902 may be powered from a tethered connection to another device, such as a Universal Serial Bus (USB) connection.

The mobile device 902 may also include a network interface 916 to communicate data to a network and/or an associated computing device. Network interface 916 may provide two-way data communication. For example, network interface 916 may operate according to the internet protocol. As another example, network interface 916 may be a local area network (LAN) card allowing a data communication connection to a compatible LAN. As another example, network interface 916 may be a cellular antenna and associated circuitry which may allow the mobile device to communicate over standard wireless data communication networks. In some implementations, network interface 916 may include a Universal Serial Bus (USB) to supply power or transmit data. In some embodiments, other wireless links may also be implemented.

As an example of one use of mobile device 902, a reader may scan an input drawing with the mobile device 902. In some embodiments, the scan may include a bit-mapped image via the optical capture device 908. Logic 926 causes the bit-mapped image to be stored in memory 930 with an associated timestamp read from the clock unit 928. Logic 926 may also perform optical character recognition (OCR) or other post-scan processing on the bit-mapped image to convert it to text.

A directional sensor 941 may also be incorporated into the mobile device 902. The directional device may be a compass and be based upon a magnetic reading or based upon network settings.

A LIDAR sensing system 951 may also be incorporated into the mobile device 902. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the mobile device 902. In some embodiments, as have been described herein, a 2-dimensional drawing or representation may be used as the input data source and vector representations in various forms may be utilized as a fundamental or alternative input data source. Moreover, in some embodiments, files which may be classified as BIM input files may be directly used as a source on which method steps may be performed. BIM and CAD file formats may include, by way of non-limiting example, one or more of: BIM, RVT, NWD, DWG, IFC and COBie. Features in the BIM or CAD datafile may already have defined boundary aspects having innate definitions such as walls and ceilings and the like. An interactive interface may be generated that receives input from a user indicating a user choice of types of innate boundary aspects a user provides instruction to the controller to perform subsequent processing on.

In some embodiments, a controller may receive user input enabling input data from either a design plan format or similar such formats, or also allow the user to access BIM or CAD formats. Artificial intelligence may be used to assess boundaries in different manners depending on the type of input data that is initially inputted. Subsequently, similar processing may be performed to segment defined spaces in useable manners as have been discussed. The segmented spaces may also be processed to determine classifications of the spaces.

As has been described, a system may operate (and AI Training aspects may be focused upon) recognition of lines or vectors as a basic element within an input design plan. However, in some embodiments, other elements may be used as a fundamental element, such as, for example, a polygon and/or series of polygons. The one or more polygons may be assembled to define an area with a boundary, as compared, in some embodiments, with an assembly of line segments or vectors, which together may define a boundary which may be used to define an area. Polygons may include different vertices; however common examples may include triangular facets and quadrilateral polygons. In some embodiments, AI training may be carried out with a singular type of polygonal primitive element (e.g., rectangles), other embodiments will use a more sophisticated model. In some other examples, AI agent training may involve characterizing spaces where the algorithms are allowed to access multiple diverse types of polygons simultaneously. In some embodiments, a system may be allowed to represent boundary conditions as combinations of both polygons and line elements or vectors.

Depending upon one or more factors, such as processing time, a complexity of the feature spaces defined, and a purpose for AI analysis, simplification protocols may be performed as have been described herein. In some embodiments, object recognition, space definition or general simplification may be aided by various object recognition algorithms. In some embodiments, Hough type algorithms may be used to extract diverse types of features from a representation of a space. In other examples, Watershed algorithms may be useful to infer division boundaries between segmented spaces. Other feature recognition algorithms may be useful in determining boundary definitions from building drawings or representations.

In some embodiments, the user may be given access to movement of boundary elements and vertices of boundary elements. In examples where lines or vectors are used to represent boundaries and surrounding areas, a user may move vertices between lines or center points of lines (which may move multiple vertices). In other examples, elements of polygons such as the user may move vertices, sides, and center points. In some embodiments, the determined elements of the space representation may be bundled together in a single layer. In other examples, multiple layers may be used to distinguish distinct aspects. For example, one layer may include the AI optimized boundary elements, another layer may represent area and segmentation aspects, and still another layer may include object elements. In some embodiments, when the user moves an element such as a vertex the effects may be limited only to elements within its own layer. In some examples, a user may elect to move multiple or all layers in an equivalent manner. In still further examples, elements may be assigned to a single layer and treated equivalently. In some embodiments, users may be given multiple menu options to select disparate elements for processing and adjustment. Features of elements such as color and shading and stylizing aspects may be user selectable. A user may be presented with an interactive user interface that includes dynamic representations of a feature, or other aspects of a design plan and associated values and changes may be input by a user. In some embodiments, an algorithm and processor may present to the user comparisons of various aspects within a single model or between different models. Accordingly, in various embodiments, a controller and a user may manipulate aspects of a user interface and AI agent.

Figure 10:
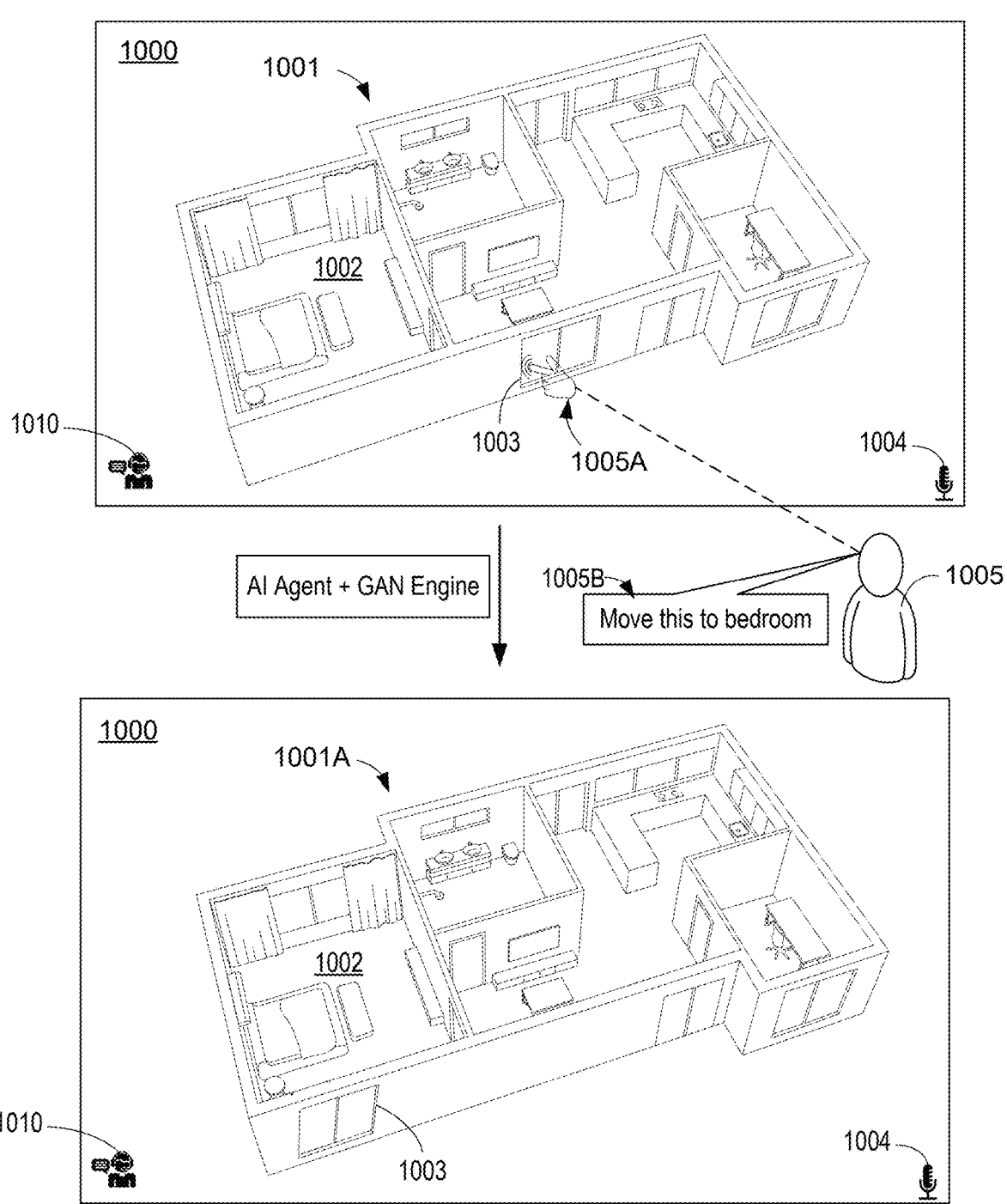
FIG. 10 is a schematic illustration of an exemplary system and method for interpreting simultaneous multi-modal commands by an AI agent to perform contextually accurate actions, in accordance with some embodiments of the present invention.

Referring now to FIG. 10, an exemplary system and method are illustrated for interpreting multiple types of user commands simultaneously and contextually, in accordance with some embodiments of the present invention. As shown, an interactive user interface 1000 is configured to display and modify a design plan 1001 of at least a portion of a building. The design plan 1001 may be rendered and processed by a controller that comprises or is communicatively coupled to an AI agent 1010 and optionally a GAN (Generative Adversarial Network) engine. The AI agent 1010 is operable to receive design plans in various digital formats, convert the same into computational structures, and allow real-time modification based on one or more user inputs.

In some embodiments, the design plan 1001 comprises graphical and spatial elements such as rooms, walls, windows, doors, furniture, hallways, utilities, electrical lines, fixtures, polygonal surfaces, vector layers, annotations, dimension markers, and boundary definitions. These elements may be rendered by the AI agent 1010 using CAD-like modeling techniques and displayed on the interactive user interface 1000 for further interaction. In the illustrated embodiment, the displayed design plan 1001 includes a bedroom 1002 and a window 1003 that is located at a different position within the same or adjacent room.

The interactive user interface 1000 may be configured on a user device operated by a user 1005. The user 1005 may be a designer, architect, contractor, or homeowner who interacts with the design plan 1001 through multimodal interaction means. For example, the user 1005 may interact via touchscreen, voice input, gesture detection, text entry, stylus input, or any combination thereof. In the embodiment illustrated, the user 1005 touches the graphical representation of the window 1003 on the touchscreen display using finger or stylus, depicted as input 1005A, while simultaneously providing a verbal command 1005B captured by a microphone 1004 embedded in the user device.

The verbal input 1005B states "Move this to bedroom", which, taken in isolation, may be semantically vague. Specifically, the term "this" does not explicitly define what is to be moved, and the phrase "to bedroom" does not clarify which bedroom if multiple bedrooms are present in the design plan 1001. However, due to the concurrent interaction 1005A wherein the window 1003 was touched, the AI agent 1010 is able to resolve the ambiguity by contextual correlation.

In this embodiment, the AI agent 1010 fuses both the verbal (1005B) and the touch input (1005A) to ascertain that the user 1005 is requesting that the touched window 1003 be repositioned into the space designated as the bedroom 1002 in the design plan 1001. The AI agent 1010 identifies the window object selected via the touchscreen and the destination area referred to verbally and accordingly updates the design plan 1001 to reflect this change, resulting in updated design plan 1001A.

In some embodiments, the AI agent is configured with a multi-modal interpretation framework that allows it to correlate inputs (e.g., 1005A-1005B) from different modalities, such as touch gestures, verbal commands, textual entries, gaze tracking, or contextual positioning, in order to disambiguate user intent during interaction with a dynamic design model or operational interface. When a user engages with the AI system through overlapping or concurrent inputs, such as touching a design element on a screen while simultaneously issuing a verbal instruction, the AI agent employs correlation logic to infer which input relates to which part of the design or command structure.

For example, a user may tap on a particular window icon displayed within the interactive user interface while verbally stating, "Shift this to the west wall." The standalone verbal instruction "this" and "west wall" lacks clarity if received in isolation; however, when processed together with the detected tap event, the AI agent infers that the user's intention is to relocate the touched window component to a wall region oriented westward within the design layout. The AI agent utilizes timestamp synchronization, spatial proximity analysis, and semantic parsing to associate these inputs as being contextually linked. In addition, gaze-tracking or pointer movement may be used to support or override the disambiguation, such as when the user is pointing toward a component and referring to it verbally.

In some embodiments, the AI agent leverages machine learning models trained on historical multi-modal user interactions to continuously refine its predictive accuracy and responsiveness. It may also utilize probabilistic reasoning to weigh the relevance of each input mode based on input strength, recency, and system confidence levels. If ambiguity persists, the AI agent may prompt the user with a clarification question, such as "Do you want to move the selected window to the west wall?" to confirm its inference before taking action. This layered interpretive mechanism allows the AI agent to operate fluidly in natural human interaction environments, minimizing the need for rigid command structures and enabling dynamic, intuitive control over complex planning and construction tasks.

In some embodiments, the AI agent 1010 may further reference metadata associated with each design element, such as object type, object ID, structural constraints, allowable positioning rules, and historical movement data. Such metadata allows the AI agent 1010 to intelligently validate whether the movement of a window into the identified room is structurally viable and compliant with predefined rules or local regulations.

In alternative examples, the AI agent 1010 may be configured to interpret more complex dual-input interactions. For example, the user 1005 may select a section of wall and issue a voice command like "Replace this with a sliding door." Here, "this" again refers to the object selected via touch, and "sliding door" provides the new object type to be inserted. The AI agent 1010 may verify structural compatibility of the replacement and execute the update accordingly.

Another example may include a user 1005 tapping a light fixture and saying, "Add two more here and here," while pointing or tapping two other locations. The AI agent 1010 may analyze the gestures and voice input in real time and replicate the light fixture in the two indicated positions.

In another embodiment, the user 1005 may draw a circle around a portion of the layout and say, "Shift this section to the right by 5 feet." The AI agent 1010 may compute the coordinates of the circled region and apply spatial translation by the requested amount while maintaining integrity and constraints of the design.

In yet another embodiment, the user 1005 may say, "Replace all windows on the left wall with French windows," while dragging their finger along the left wall of the layout. The AI agent 1010 may interpret the verbal input as a global replacement command constrained to the area marked by the gesture.

In some configurations, the AI agent 1010 may be trained using natural language processing and gesture recognition models, and may leverage the GAN engine to generate alternate design outcomes based on the interpreted commands. For example, a command such as "Make this kitchen more open" when accompanied by a gesture encompassing the kitchen walls may result in the AI agent 1010 removing walls and repositioning counters to create a more open layout.

The controller may further maintain a history of changes, allowing the user 1005 to preview, compare, and revert modifications initiated by such multimodal commands. Additionally, the AI agent 1010 may proactively prompt the user 1005 when ambiguities are not resolvable by context, asking clarifying questions such as "Do you mean the leftmost bedroom or the center bedroom?"

Such context-aware fusion of multiple simultaneous input modalities allows a more fluid and intuitive human-AI collaboration in real-time design workflows. The design plan 1001 is thereby iteratively refined into the updated design plan 1001A as shown.

In some embodiments, the AI agent 1010 may provide visual cues, such as highlighting the object currently being interpreted as "this" or displaying a ghosted preview of the target action before finalizing the change. This approach also improves accessibility for users who may prefer voice interaction over touch or who use assistive devices for interaction. The AI agent 1010 thus enhances inclusivity while maintaining accuracy and efficiency.

In further embodiments, the AI agent 1010 may support nested commands such as "Move this window to the bedroom and make it wider." Upon interpreting the touched object and the destination, the AI agent 1010 may also expand the window dimensions as per standard proportions or user preferences. In another scenario, the user 1005 may initiate a command like "Group these three desks" while tapping each desk in succession. The AI agent 1010 may register the sequence of touches and form a logical grouping of those design elements.

Embodiments may also support cancellation commands such as "Undo that" or "Cancel move," allowing the user 1005 to rollback an action if misinterpreted. The AI agent 1010 may maintain such action logs as part of the design session.

The AI agent 1010 may further support conflict detection. If a user attempts to move an object into an occupied space, the AI agent 1010 may prompt with a message like "Target space is already occupied. Do you want to replace the existing item?" In certain implementations, the GAN engine may generate several layout alternatives based on a vague command such as "Make this room look more modern," and the user 1005 may browse and select the preferred variant. The microphone 1004 may be configured with beamforming or noise cancellation to isolate voice commands from ambient sounds, improving speech recognition reliability.

In still other examples, the AI agent 1010 may interpret biometric signals like gaze tracking or eye movement, using this data as another input modality for contextual correlation. Commands may also be delayed or queued. If multiple inputs are received in sequence, the AI agent 1010 may buffer them and process in order or merge based on natural speech flow. Such enhancements contribute to a fluid, AI-supported design process that responds to complex, human-like interactions for efficient plan generation and editing.

Figure 11:
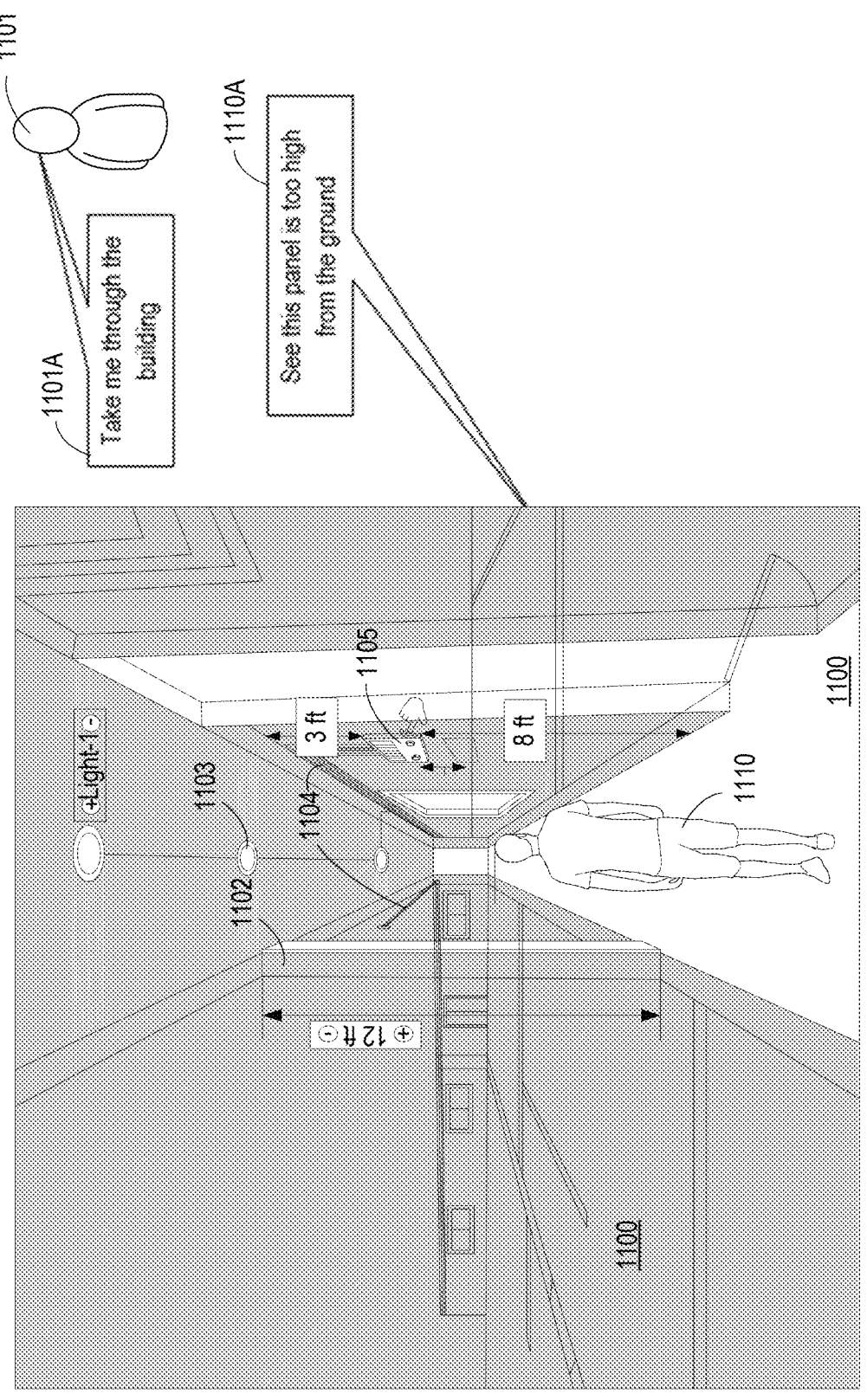
FIG. 11 illustrates an exemplary system and method for generating a virtual walkthrough of a building or site using a virtualized design plan elevation or video simulation, where a virtualized AI agent guides a user and interacts with building elements.

Referring now to FIG. 11, an exemplary system and method are illustrated wherein an Agentic AI enables a virtual walkthrough experience for a user 1101 by generating a simulated representation 1100 of a building, either from design data, as in the case of pre-construction planning, or from live video feeds during the construction or maintenance phases, in accordance with some embodiments of the present invention. As depicted, the system facilitates a highly interactive interface wherein the AI constructs a three-dimensional spatial representation 1100, enabling the user 1101 to navigate the structure virtually.

In some embodiments, the user 1101 may initiate the virtual walkthrough by issuing a verbal command 1101A such as "Take me through the building," captured via an audio interface or microphone integrated with a user interface or a wearable device. Upon receiving this command 1101A, the Agentic AI may process the request and determine the relevant building data, selecting from available digital elevation models, 3D design plans, building information models (BIM), or recorded drone or on-site video feeds.

The virtual walkthrough 1100 may be rendered on a display device, such as a tablet, head-mounted device, or AR/VR headset, and is populated with building elements including walls or pillar 1102, ceiling-mounted lights 1103, electrical wiring 1104, and wall-mounted components such as control panels 1105. The Agentic AI may either render these elements directly from digital blueprints or analyze captured images/video to generate the 3D reconstruction.

A distinctive aspect of the illustrated embodiment in FIG. 11 involves the use of a virtualized agent 1110, an animated avatar or symbolic figure rendered within the simulation 1100. This virtualized agent 1110 acts as a representative or proxy of the Agentic AI and is operative to conduct a guided tour through the virtual space. The virtualized agent 1110 may move autonomously through rooms, hallways, and functional zones within the simulated building environment 1100, stopping at relevant areas to provide insights, highlight discrepancies, or answer queries from the user 1101.

In the illustrated scenario, the virtualized agent 1110 navigates to a hallway location where it identifies a wall-mounted control panel 1105. The virtualized agent 1110 gestures toward the control panel using an animated hand and simultaneously provides a verbal commentary 1110A such as, "See this panel is too high from the ground," referencing the distance from the floor, which is depicted as 8 feet in this case. This type of real-time, contextually grounded feedback can aid in accessibility checks, safety validations, and design refinements.

The AI-generated commentary 1110A may be customized based on building code requirements, user preferences, or specific project goals. For example, in accessibility evaluations, the virtualized agent 1110 may highlight when buttons or panels are mounted above standard ADA-compliant heights. In other embodiments, the virtualized agent 1110 may comment on lighting fixture placement, spatial redundancy, or HVAC vent orientations, each identified in the plan as elements 1102, 1103, and 1104, respectively.

In some embodiments, the system allows bidirectional interaction during the walkthrough. The user 1101 may interrupt or query the virtualized agent 1110 at any point. For example, after hearing commentary 1110A, the user 1101 may say "Lower it to 5 feet," prompting the Agentic AI to re-render the control panel 1105 at a new position in the design plan and provide updated compliance metrics based on the change.

Additionally, the Agentic AI may use AI-based speech recognition, natural language processing (NLP), and computer vision to synchronize the visualized building elements with user comments. For example, if the user 1101 verbally notes that a specific duct seems oversized, the system can analyze the object referenced using depth measurement data or BIM parameters and respond with suggestions for alternatives or error alerts.

The virtual walkthrough system of FIG. 11 may further support temporal simulation. The Agentic AI can simulate lighting conditions across different times of the day or year, show HVAC airflow, or demonstrate usage paths and crowd simulations based on projected occupancy levels. The virtualized agent 1110 may walk through corridors during simulated nighttime and highlight emergency lighting coverage or gaps.

In another example, the user 1101 may direct the AI to "Take me to the rooftop AC unit," and the virtualized agent 1110 will adjust the viewpoint or move upward in the model to simulate walking through stairways or elevators to reach the requested zone. At each stop, the virtualized agent 1110 may provide narrated metrics, such as unit size, mounting height, required clearances, and whether any identified component matches project specifications.

To accommodate users with visual impairments, the Agentic AI may also render the walkthrough in audio-descriptive format, where each space or element encountered is described in detail via synthesized speech. Additionally, users may request summaries or reports post-walkthrough, where the AI agent automatically compiles a list of issues flagged, changes suggested, or walkthrough insights provided.

The virtualized walkthrough may also accommodate multi-user collaboration, where multiple users, such as architects, contractors, and clients, participate in a synchronized simulation and communicate through avatars. Each participant may hear others' feedback, see the collective navigation path, and view collective annotations. The AI agent may coordinate the tour, moderate speaking turns, or annotate mutual points of interest.

The system may also track eye gaze or cursor movement during the walkthrough. If the user 1101 repeatedly focuses on a specific element, the Agentic AI may infer interest or concern and prompt, "Would you like more information on this light fixture?" or "Would you like to move this vent?" This proactive engagement allows the walkthrough to be both responsive and conversational.

Additionally, the Agentic AI may incorporate prior history into the simulation. If the user 1101 had previously commented on lighting in another room, the agent 1110 may pre-emptively say, "Similar to the previous corridor, this hallway also uses recessed fixtures at 9 feet height." Such continuity contributes to an intelligent, memory-augmented assistant.

In embodiments involving maintenance, the walkthrough 1100 may reflect real-time data. For example, IoT sensors may identify an HVAC unit's heat signature as abnormally high. The virtualized agent 1110 may walk the user 1101 to that unit, highlight the anomaly, and offer choices such as "Would you like to schedule a technician?" or "Would you like me to shut it down remotely?"

The virtualized walkthrough also allows annotation. As the virtualized agent 1110 moves, the user 1101 may say "Mark this duct as 'to be rerouted'," and the AI may draw a visual tag on the duct. Annotations can be stored for collaborative sessions or later review.

In more advanced embodiments, the AI agent 1110 may alter the walkthrough path in response to user interests. If the user frequently skips mechanical rooms and focuses on lighting layouts, future walkthroughs may prioritize lighting discussions. Alternatively, the user may configure filters such as "Show me only accessibility non-compliances."

In some use cases, the walkthrough serves as a construction quality check. As the virtualized agent 1110 walks through areas captured by video or 3D scans, it may compare the constructed dimensions to original design specs. Discrepancies such as a 9-foot room where 10 feet was specified may be highlighted automatically.

The walkthrough system may also allow exporting snapshots or video segments. The user 1101 may command, "Generate a 3-minute summary of the lighting issues," and the Agentic AI creates a narrated clip with visuals, suitable for sending to vendors or design consultants.

To support multilingual users, the virtualized agent 1110 may converse in multiple languages, switchable on request. This may particularly be useful for multicultural construction teams or international clients.

In some scenarios, the virtualized agent 1110 may not be humanoid but instead a floating camera icon or visual reticle, depending on user preferences or display constraints. In VR environments, the avatar may take more complex forms with gesturing capabilities.

Walkthroughs may also support real-time changes. For example, as the user is virtually touring a corridor, he may say "Widen this by 1 foot," and the Agentic AI instantly recalculates space allocation and updates the model, showing before-and-after visualizations in split view.

Additionally, the system may log each interaction during the walkthrough for audit, training, or compliance. Logs may include voice commands, navigated path, flagged components, user comments, and AI annotations, timestamped and archived securely.

The walkthrough may be used for simulation training. New engineers or inspectors may walk through completed buildings virtually, with the AI agent asking questions like "Can you spot any clearance violations here?" or "Is this fixture mounted correctly per spec?"

In yet another embodiment, the AI agent may accompany the walkthrough with documentation references. While looking at a control panel 1105, the user 1101 may say "Show me spec sheet," and the AI agent (1110) retrieves and overlays the relevant datasheet on the screen.

Figure 12:
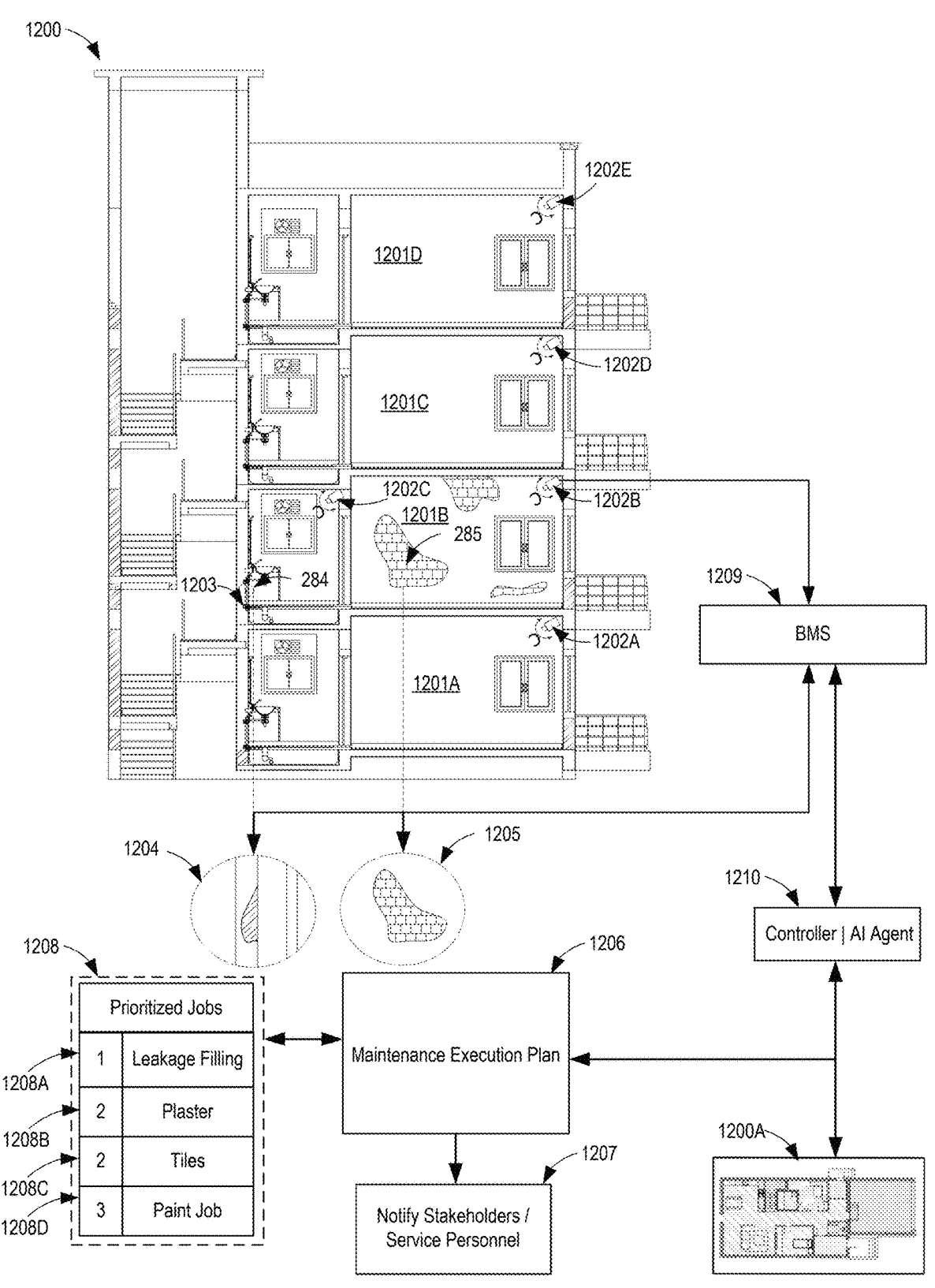
FIG. 12 illustrates an exemplary system and method for detecting construction or maintenance task conflicts, prioritizing overlapping jobs, and generating a synchronized maintenance execution plan using a controller or AI agent.

Referring now to FIG. 12, an exemplary system and method are illustrated for detecting conflicts and coordinating overlapping construction or maintenance tasks using a controller or AI agent 1210 in connection with a physical building 1200, in accordance with some embodiments of the present invention. The building 1200 comprises multiple floors 1201A through 1201D, each of which may include a variety of sensors and monitoring devices 1202A-1202E (e.g., cameras, leakage sensors 1203, or IoT-based devices), interconnected with a BMS 1209. The sensors and BMS continuously collect and transmit real-time data pertaining to physical conditions, ongoing repair works, resource occupancy, environmental status, or material deterioration to the AI agent 1210.

In some embodiments, the AI agent 1210 may detect potential conflicts or inefficiencies arising from overlapping or improperly sequenced tasks based on live video analytics, environmental data, and stakeholder input. For example, if a plastering task is being conducted at location 1204 on floor 1201A, and a tiling task is initiated concurrently in an overlapping area 1205 without first sealing an adjacent water leakage, the AI agent 1210 may recognize the procedural error and intervene to halt the sequence. In this case, the agent 1210 may prioritize the leakage filling job as 1208A, notify relevant stakeholders via notification module 1207, and modify the ongoing maintenance execution plan 1206 to prevent damage or inefficiency.

The system further integrates a digital twin model 1200A that mirrors the physical structure of the building 1200, dynamically updating based on live data. Using this model, the AI agent 1210 identifies conflicts such as scheduling overlaps, environmental hazards (e.g., excessive dust during painting while an HVAC duct is open), or dependency violations (e.g., painting before drying of newly applied plaster).

The AI agent 1210 may simulate task sequences and verify dependencies among detected jobs. For example, when tile degradation 1205 is detected using the camera 1202D, and simultaneously a leakage issue 1204 is sensed by leakage sensor 1203 on a nearby wall, the AI agent 1210 evaluates which task should logically precede others and reorders execution accordingly. This reordered plan is then reflected in the prioritized job list 1208, where the leakage fix 1208A is positioned as the top priority to prevent further material compromise.

The prioritization table 1208 may be dynamically generated and updated based on severity, structural dependency, cost implication, labor availability, and stakeholder urgency. For example, if multiple faults are detected but one impacts the main stairwell or emergency exit (e.g., 1202E), the AI agent 1210 assigns it a higher priority regardless of when it was reported.

The AI agent 1210 can also identify task conflicts that are not visible in standard scheduling systems. For example, it may detect that two contractors are assigned to the same physical space but for different trades, such as an electrical fix and floor tiling in the same hallway. By analyzing positional and temporal overlap in the design plan 1200A, the AI agent 1210 can autonomously contact the involved workers via voice or message systems to propose alternate timing and avoid rework.

In scenarios where different types of work are initiated without coordination, for example, plastering work before tiles have been set, the AI agent 1210 may intervene by cross-referencing real-time sensor/camera data from 1202C and 1202D with predefined procedural sequences stored in its knowledge base. The agent 1210 may then propose a corrected job sequence 1206, enforce it through alerts, and communicate revised timelines.

Additionally, the AI agent 1210 may utilize conversational interfaces to communicate with workers or supervisors to verify feasibility or accept overrides. If a worker on-site indicates (e.g., via mobile input or voice command) that a specific task has already been completed or needs adjustment, the AI agent 1210 may record, analyze, and modify the task queue while updating the design plan 1200A to reflect actual progress.

During conflict detection, the AI agent 1210 may consider constraints such as drying times, curing durations (for cement or plaster), or ambient temperature requirements. For example, if external temperature is too low for painting, as indicated by data from BMS 1209, the AI agent 1210 flags paint job 1208D for delay and reprioritizes other pending jobs like tile installation.

In the illustrated embodiment, the maintenance execution plan 1206 generated by the AI agent 1210 includes procedural steps for each identified task along with personnel assignments, material inventory checks, safety protocols, and fallback options in case of supply or personnel constraints. The controller may communicate with external procurement systems to check material availability in real-time.

The AI agent 1210 may also access historical records to recognize repeat issues. If a wall section on 1201B has shown repeated tile failures, the agent 1210 may propose reinforcement or suggest replacement with alternative materials, updating the execution plan accordingly and notifying via alert 1207.

In some embodiments, the AI agent 1210 may employ predictive modeling to simulate outcomes of various task sequences. If a proposed order results in overlapping tasks with high interference (e.g., vibrations from drilling while fresh plaster is curing), the simulation highlights the conflict and prompts rescheduling.

Through integration with worker location tracking (via mobile devices or RFID), the AI agent 1210 may monitor current personnel assignments and intervene when two teams enter a conflict-prone zone simultaneously. The agent 1210 may then notify team leaders with alternative work areas or waiting periods to optimize workflow.

In embodiments where emergency repairs are needed (e.g., short-circuit risks due to leakage 1204), the AI agent 1210 may pre-emptively elevate the task priority, reorder tasks in the table 1208, and alert nearby staff through the controller interface.

The digital twin 1200A is continuously synchronized with AI agent 1210, not only to reflect faults but also to animate the timeline of task execution. Maintenance personnel can visually assess which tasks are currently running, delayed, or scheduled, in a color-coded, intuitive layout.

If the AI agent 1210 identifies that certain repairs such as tile degradation 1205 are purely aesthetic and not immediately hazardous, it may delay them until more urgent tasks (e.g., leakage 1204) are completed, aligning labor and budget optimally.

In situations where external vendors are involved, the AI agent 1210 may directly communicate with them to schedule deliveries or services. If tiles need to be ordered for task 1208C, and there is a delay in supply, the agent may reschedule the corresponding task and reassign workers to other pending activities.

Maintenance execution plans 1206 generated by the AI agent 1210 may also include embedded instructions or training modules. If a newly assigned worker is unfamiliar with specific procedures, the agent may supply contextual guidance or videos associated with the task.

For enhanced transparency, the AI agent 1210 may create automatic reports summarizing conflicts resolved, rework avoided, and tasks completed per plan. These reports are linked to the design plan 1200A and archived for future audits.

If the controller detects a new task that interferes with an in-progress job, it may prompt for supervisor approval to override priorities. For example, if a plumbing fix must be done over freshly laid tiles, the system may flag the potential damage and seek manual confirmation.

The AI agent 1210 may also monitor progress using computer vision to detect actual work advancement. For example, if plastering appears complete but the tile repair has not begun, it may prompt status updates from the responsible personnel. In some cases, the AI agent 1210 may allow scheduling of overlapping tasks in different vertical planes, e.g., ceiling work while floor tiling is ongoing, after determining low interference risk.

The AI agent 1210 may also predict labor saturation. If multiple high-priority tasks are scheduled simultaneously, it may alert the supervisor of a likely delay or redistribute job loads to balance team capacity.

In facilities with multiple AI-enabled controllers, coordination may be handled across buildings. The AI agent 1210 may even request labor or material reallocation from another structure's controller if spare resources are available. Safety incidents, if detected (e.g., a worker slipping due to leakage 1204), may be logged by the agent and factored into future prioritization and scheduling rules.

The controller (1210) may also dynamically adjust task sequencing based on weather data. If outdoor work is interrupted due to rain, the AI agent 1210 may advance indoor repair tasks that were previously deprioritized.

The conflict-resolution mechanism may be enhanced by feedback loops. If field personnel mark a specific plan as infeasible due to site constraints, the AI agent 1210 may recalibrate its planning logic for future jobs in similar conditions.

Notifications 1207 sent by the AI agent 1210 may be multi-format, including emails, app notifications, SMS, or audio prompts, depending on stakeholder preferences. The AI agent 1210 may also allow override flexibility. Supervisors may elevate the priority of aesthetic jobs such as painting 1208D during VIP visits, while still receiving caution prompts about logical sequence violations.

Through this comprehensive AI-driven coordination and conflict-resolution system, the invention improves operational efficiency, prevents redundant work, reduces maintenance downtime, and enhances building lifecycle management by actively synchronizing real-world events with a digital representation 1200A of the building 1200.

Referring now to FIGS. 13A-13D, an exemplary flowchart 1300 is illustrated depicting various method steps 1301-1330 for intelligent construction management, design modification, contextual command interpretation, and automated task coordination, in accordance with some embodiments of the present invention. The illustrated method may be implemented by a controller comprising one or more AI agents (e.g., Agentic AI) and/or a GAN engine configured to interpret user inputs, analyze contextual and environmental data, update a dynamic design plan or execution model, and initiate autonomous or semi-autonomous control actions. As illustrated across the method steps 1301-1330, the method enables real-time decision-making by correlating multiple forms of data such as user voice commands, touch gestures, sensor feedback, IoT device status, BMS data, weather inputs, and construction or maintenance logs. The flowchart 1300 further demonstrate how the AI agent may interpret ambiguous or multimodal user inputs, resolve conflicts in ongoing operations, prioritize maintenance or construction tasks, and communicate actionable outputs to relevant stakeholders or on-field sub-agents. The steps illustrated are not limited to a particular sequence and may be performed in any logical order (not necessarily all steps), either sequentially or in parallel, depending on system configuration and implementation constraints.

At step 1301, a design plan comprising building elements and spatial layout is received into a controller configured with processing capabilities to manage intelligent construction and maintenance workflows. The received design plan may be a digital representation of at least a portion of a building and may include structural, architectural, electrical, plumbing, or HVAC schematics. The design plan may be input into the controller in a variety of formats, including but not limited to CAD files, BIM (Building Information Modeling) files, PDFs, or image-based blueprints. In some embodiments, the design plan may be uploaded by an architect, contractor, or engineer using a user interface or transmitted wirelessly from a client device. For example, a site supervisor may use a tablet device to submit a 2D floor plan of a residential apartment to the controller. This step serves as the initialization stage where subsequent intelligence operations will be contextualized based on the contents of the received design plan.

At step 1302, the received design plan is converted into a dynamic interactive model that allows further analysis and interaction. The dynamic interactive model may comprise a structured, editable, and scalable object representation of the building plan. The controller may utilize an AI engine, a computer vision algorithm, or a GAN engine to convert fixed elements within the design plan into manipulable dynamic components. These components may be modeled as individual elements such as walls, doors, fixtures, floor slabs, windows, HVAC ducts, furniture, or appliances, each associated with metadata such as dimensions, location coordinates, material types, and connection nodes. For example, if a floor plan contains a rectangular room and a window marked on the north wall, the system may extract those elements and represent them in a manipulable 3D format, allowing further interaction or transformation by a user or automated process.

At step 1303, the system proceeds to identify and classify the various design elements from the design plan. These elements may include, without limitation, walls, fixtures, electrical lines, plumbing conduits, HVAC ducts, ceiling panels, support beams, furniture, lighting fixtures, switches, windows, and doors. Classification may be performed using a pre-trained model trained to recognize standard architectural symbols or patterns in the plan, or by correlating tags or layers embedded in BIM/CAD files. For example, a dashed line with a circuit symbol in the original plan may be interpreted as an electrical line and assigned a category 'electrical'. A polygon annotated with 'WD' may be identified as a window. The classified elements are then stored in memory with a reference ID for further use. The AI may also resolve ambiguous shapes by referencing external catalogues or templates for standard construction elements.

At step 1304, contextual data is received from one or more external sources including but not limited to BMS, IoT-enabled sensors, user location data, weather information services, and calendar systems. The contextual data may provide real-time or scheduled operational details necessary for informed AI analysis. For example, the BMS may report HVAC activity, lighting schedules, or occupancy status; IoT sensors may transmit temperature, humidity, or leakage alerts; and location services may indicate the presence or movement of users or workers in the physical environment. As an illustrative example, if a lighting fixture is being considered for relocation, the AI engine may review real-time occupancy data or daylight availability to make a context-aware recommendation. Similarly, if a user is accessing the system on-site near the kitchen area, the AI may prioritize rendering or interacting with the elements in that area.

At step 1305, the controller initiates the Agentic AI engine to perform analysis and decision processing based on the dynamic model and contextual information. The AI engine may evaluate the state of the building model, analyze patterns, detect inconsistencies, and respond to user commands or detected anomalies. For example, the AI engine may determine that an HVAC vent is too close to a wall-mounted cabinet and may recommend a repositioning. In another embodiment, the engine may analyze voice commands like "shift this to the right" spoken near a window and, using touch input on the window, correlate the command with the spatial object to update the model accordingly. The AI engine may further evaluate if requested actions comply with standard safety codes or spatial limitations. In more advanced implementations, the AI may simulate alternate configurations using a GAN engine to offer optimized design variations for user selection.

At step 1306, the system generates and displays an interactive user interface on a user device for further interaction. The user interface may include visual renderings of the design plan in 2D or 3D, interactive tools for selecting or modifying design elements, and embedded AI agents for receiving commands or offering guidance. The display may be rendered on devices including tablets, smartphones, desktop terminals, or head-mounted AR displays. The interface may be adapted to provide contextual overlays, labels for building components, alerts for identified issues, and gesture-responsive controls. For example, the UI may highlight a cracked tile and offer options such as "Replace", "Defer", or "Ignore". Alternatively, a user may view a walk-through simulation and ask the AI to move a wall outward by 1 meter, with real-time preview and adjustment options.

At step 1307, the interactive interface allows the user to communicate with the AI system using various input modalities such as touch gestures, voice commands, or text-based instructions. The interaction may be performed via touchscreen input (e.g., tapping a window object to select it), via natural language voice input (e.g., "Shift this door to the left"), or by typing commands (e.g., "Rotate AC vent 45 degrees clockwise"). The AI agent may be listening continuously or on trigger, and the user interaction may be either direct (on-screen interaction) or indirect (voice from a different part of the site). In some embodiments, the system may simultaneously interpret multiple modes of input to derive accurate intent. For example, a user tapping on a lighting fixture and saying "replace this with a brighter option" may cause the AI to suggest compatible light fixtures from a parts database and allow the user to preview and confirm the change.

At step 1308, the system interprets user commands using artificial intelligence (AI) and natural language processing (NLP) techniques. The user commands may originate from various input modalities, including voice, text, or gesture-based instructions, and may include explicit or ambiguous requests. The AI agent running on the controller may utilize a pre-trained language model or context-aware rule-based engine to parse the user command, extract intent, identify associated objects, and determine the target action. For example, a user may verbally state, "Move this to the upper left corner," while interacting with a graphical object on the user interface. The AI system may parse this sentence, detect the action verb "move," associate "this" with a selected object from the UI, and map "upper left corner" to a spatial coordinate within the digital floor plan. In another embodiment, the command may be multi-sentence or include conditional language, such as "If this window is smaller than 5 feet, place it next to the east wall," which the AI agent may decode and translate into a sequence of conditional actions within the digital model.

At step 1309, the system correlates multi-modal inputs such as voice and touch to disambiguate the user's intent. In some embodiments, the user may provide a voice instruction while simultaneously interacting with a touchscreen or gesturing at a design element. The AI engine combines these different types of input and resolves ambiguities by applying temporal correlation, object context, and spatial mapping algorithms. For example, if a user touches a window icon and says, "Move this closer to the center," the AI interprets the touch input to identify "this" as the window and computes the geometric center of the current room layout as the target destination. In another embodiment, the user may use hand gestures recognized via a camera input (e.g., pointing or pinching motion) while issuing a command such as "Resize this." The AI engine fuses the visual cues with the voice input and maps the action to the selected object with confidence scoring. This multi-modal interpretation mechanism enhances command precision and reduces error in design manipulation tasks.

At step 1310, the interpreted command undergoes validation to determine whether it is structurally feasible and adheres to compliance constraints. This step involves applying structural engineering rules, regulatory codes, spatial limitations, and safety considerations to evaluate the impact of executing the proposed modification. For example, if a user attempts to relocate a load-bearing wall, the AI system consults structural metadata embedded in the digital model or retrieved from a standards database and flags the action as impermissible. Similarly, if a lighting fixture is proposed to be installed below the minimum clearance height as defined in the National Electric Code, the AI issues a compliance alert and may either deny the command or request user confirmation before proceeding. In another embodiment, feasibility checks may involve ensuring that HVAC duct realignments do not exceed air-flow tolerance or that plumbing routes do not overlap with electrical lines. The validation process helps safeguard the integrity of the design and prevent downstream conflicts.

At step 1311, the system updates the design plan or execution schedule based on the interpreted and validated command. The updated model may reflect real-time design modifications such as repositioning elements, resizing structures, inserting new components, or deleting obsolete ones. If the user command pertains to temporal operations such as "reschedule the tile laying for next Friday," the AI agent updates the task calendar accordingly. In one embodiment, the AI system may automatically trigger a ripple effect where dependent tasks are recalibrated. For example, moving the installation of electrical panels may trigger an automated shift in the drywall installation schedule to maintain proper workflow sequence. In another example, if the AI interprets the command as relocating a window, the wall component's metadata and spatial constraints are updated and visually re-rendered in the interface for user confirmation or continuation.

At step 1312, the updated model is stored in a cloud-based or local database. The AI engine commits the updated dynamic design or project execution model to a persistent storage medium that supports future retrieval, rollback, and auditing. Cloud-based storage may be used when real-time collaboration or distributed access is desired, allowing multiple stakeholders, such as contractors, architects, engineers, or facility managers, to view or modify the same model. In contrast, local storage may be selected for offline environments or regulatory requirements. The stored model may include updated coordinates, geometry data, compliance annotations, task schedules, and embedded comments or notes added during the session. In some embodiments, version control is maintained, allowing users to track changes over time, revert to previous versions, or compare updates between project phases. This functionality supports transparency and continuity across the project lifecycle.

At step 1313, the system monitors site progress and worker activities via IoT sensors and cameras deployed throughout the physical construction or maintenance site. The sensors may include environmental monitors, motion detectors, GPS trackers, pressure sensors, RFID tags, or smart wearable devices worn by workers. Cameras may include stationary CCTV systems or mobile video sources mounted on drones or handheld devices. These components feed real-time data into the controller, enabling the AI system to observe on-ground activities, verify task execution status, detect anomalies, and compare physical site conditions against the digital model. For example, if a tile-laying operation is scheduled for Room A but no worker presence is detected in that area during the expected time window, the system may flag a task delay. Alternatively, if a camera detects that scaffolding has been erected in a high-risk zone, the AI agent may activate a safety protocol or notify a site supervisor. Continuous monitoring bridges the digital and physical domains of the project.

At step 1314, the system detects delays, conflicts, or faults using real-time video and sensor data. The AI engine processes the incoming data streams using event recognition, pattern analysis, and deviation tracking algorithms to identify discrepancies between planned and actual progress. For example, the AI may detect that a room scheduled for electrical wiring is still undergoing plastering based on material recognition from the camera feed. This sequencing conflict is flagged and presented to the supervisory user for review. In another embodiment, vibration sensors on structural beams may report oscillations beyond expected levels, prompting an alert for potential foundational instability. Similarly, temperature sensors reporting above-threshold values may indicate HVAC issues or power overloads. The AI system may categorize each anomaly by severity and impact, updating the model with contextual tags for stakeholder awareness and resolution tracking.

At step 1315, the system identifies task dependencies and sequences maintenance, or construction operations based on current site status and contextual insights. The AI agent evaluates logical and operational relationships among tasks and generates an optimized execution plan that preserves workflow integrity. For example, if a leakage has been detected behind a tiled wall, the AI may sequence the repair of the leakage before any further paintwork or panel installation in the affected area. In another embodiment, the AI may detect that two separate teams are scheduled for overlapping tasks in the same zone and propose reassignments to avoid congestion and reduce downtime. The dependency matrix may be derived from rule-based logic, historical data, or learned heuristics. The sequence generation also accounts for resource availability, weather forecasts, delivery timelines of materials, and worker schedules. Once optimized, the task sequence may be shared with relevant parties through synchronized project calendars or interactive dashboards.

At step 1316, the system generates a prioritized task list based on the severity of detected faults and the interdependencies of related tasks. The controller executing the AI agent evaluates the significance of each anomaly or pending job using a predefined severity matrix, which may include parameters such as impact on building integrity, safety risk, exposure to further damage, regulatory non-compliance, and cost implications. In parallel, task interdependencies are mapped by analyzing whether the completion of one task conditions the commencement of another. For example, if the AI agent determines that water leakage must be sealed before electrical panel installation in the same area, the sealing task is ranked higher in priority. The AI agent may output a structured task list resembling: (1) seal leakage, (2) apply wall plaster, (3) reroute electrical wiring, and (4) repaint the surface. Each entry in the prioritized list may include an identifier, location data, required skillset, time estimate, material requirement, and the task sequence logic for downstream use.

At step 1317, the system notifies relevant workers or stakeholders about the required actions using a communication mechanism configured in the controller. Notifications may be distributed via SMS, app alerts, email, wearable haptic devices, or dashboard updates, depending on the recipient's available channels. Each notification may include the task summary, expected start and end times, location in the building or construction plan, and urgency level. In one embodiment, the AI agent uses user role classification to send targeted notifications. For example, tasks involving plumbing issues may trigger alerts to subcontracted plumbers and the contractor's assistant, while HVAC fault messages may be routed to mechanical engineers and facility operators. The AI agent may also account for workers' real-time location, availability status, and current workload before notifying them. This step may include acknowledgments or accepting/rejecting actions from the recipients, which may then feed back into the task planning module for further adjustment.

At step 1318, the system coordinates autonomous or semi-autonomous AI agents to execute the scheduled tasks, subject to supervisory control or fully automated delegation. In some embodiments, the AI controller may interact with domain-specific sub-agents configured for plumbing, electrical, HVAC, structural, and finishing work. Each sub-agent may independently operate on a user device or edge processor and interpret job instructions relayed from the master controller. For example, a semi-autonomous HVAC agent may receive a job to inspect and adjust duct alignment. If the agent finds discrepancies between the instructed plan and site conditions using camera or sensor feeds, it may either autonomously adjust the execution or seek confirmation from the main agent. In fully autonomous mode, robotic tools or drones may be mobilized to perform inspection, movement of small materials, or update digital annotations in the plan, while communicating status back to the controller. This step enhances parallel task execution across distributed agents.

At step 1319, the system tracks material requirements based on the prioritized task list and initiates procurement actions automatically. The AI agent reviews the bill of materials (BOM) associated with each scheduled task and matches it with available inventory data retrieved from local storage systems or centralized databases. If shortages are detected, the system generates a material procurement request, which may be transmitted to registered suppliers or vendors through API integrations, email, or e-commerce automation. For example, if the task list includes "replace cracked tiles," the agent checks whether the specific tile design and quantity are in stock; if not, it may identify the vendor with the best price and delivery time and place an order accordingly. In some embodiments, procurement decisions may be governed by budget limits, brand preferences, and delivery timelines set by supervisory users. The AI agent may also group similar material orders from adjacent tasks to optimize procurement efficiency and logistics.

At step 1320, the AI agent alerts the supervisory user with real-time status updates and exception reports. The status messages may include progress indicators for each task, such as "in progress," "pending materials," or "completed." Exception reports may flag anomalies such as delays, task rejections by workers, sensor inconsistencies, conflicting execution, or unforeseen hazards. For example, if a tiling job is interrupted due to delayed delivery of cement adhesive, the system logs this as an exception and notifies the supervisor with a proposed rescheduling. In another example, a fire alarm sensor may trigger unexpectedly, and the AI system will generate an immediate alert to investigate the situation. The notification format may include pop-up alerts, mobile app push notifications, summary dashboards, or automated calls for emergency issues. This proactive step keeps supervisory users informed and facilitates early intervention without requiring constant manual checking.

At step 1321, the system generates a virtual walkthrough based on either the current design model or actual site footage. The AI agent may create a 3D rendering using the current digital plan or stitch real-world images and videos from IoT cameras or drones to simulate a realistic spatial experience. In the design phase, the AI uses the most recent design version and applies rendering techniques such as ray tracing, lighting emulation, and dynamic element tagging to create an immersive experience. During construction, the AI may integrate live or recorded video from the site, apply computer vision stabilization, and overlay annotations to reflect job statuses or defects. The virtual walkthrough may be rendered in a web browser, mobile application, or virtual reality (VR) headset. The walkthrough may enable visualizing fault points, future installations, or pending work progress, which can aid decision-making without requiring physical site presence.

At step 1322, the system enables verbal interaction with a virtual agent during the walkthrough simulation. The AI agent represented by an avatar or voice interface may speak with the user, respond to queries, provide explanations, or follow instructions during the walkthrough. The virtual agent may say, "To your left is the HVAC duct where airflow calibration is pending," or "This corridor's lighting is scheduled for replacement tomorrow." The user may respond with questions or instructions such as "Highlight the fault in the ceiling again," or "What's the expected completion date for this room?" This two-way conversation may use real-time speech recognition, language understanding, and dialog management systems built into the AI framework. The conversation can also be recorded or transcribed for compliance or later review. The virtual agent may additionally offer suggestions such as "Would you like to add this area to your urgent task list?" enabling an interactive inspection experience.

At step 1323, the system records user feedback and modifies the plan or task list accordingly. After completing the walkthrough or during interaction, the user may provide feedback such as "Change tile color here," or "Delay this job by two days." The AI agent logs the feedback and converts it into actionable updates in the model, timeline, or task list. If the user rejects the current placement of a component or requests a change in material, the digital model is revised to reflect the update. In another embodiment, user comments may trigger a reassessment of previously scheduled tasks. For example, feedback like "This pipe route seems too close to the wall" may prompt the system to rerun feasibility checks and suggest alternate placements. Feedback may be saved with timestamps, user identification, and action history, forming part of the audit trail. This feedback incorporation loop helps close the communication cycle between design, monitoring, and control phases.

At step 1324, the method includes logging one or more of: actions, modifications, and communications to a project history database. This step is executed by the controller operating the Agentic AI engine, which continuously tracks every instruction issued, change made to the digital design plan, task reassignment, material procurement order, or communication sent to workers or stakeholders. The logging function may include a timestamp, user identity, task ID, geographic location (if applicable), and a description of the operation. For example, if a supervisor issues a command to shift a door opening on the second floor and the AI agent modifies the design accordingly, the original and revised configurations are both recorded in the project log. Similarly, if a worker provides voice feedback through a mobile device requesting an extension on a task, the conversation, decision, and follow-up execution status are stored. This enables traceability, auditing, error resolution, and historical benchmarking for future projects or compliance verification.

At step 1325, the method may include continuously updating the digital twin of the building with live data from the construction site or the operational environment. The digital twin comprises a real-time, dynamically linked representation of the physical site, including design, materials, dimensions, component placements, and environmental metrics. The Agentic AI system integrates data feeds from IoT sensors, cameras, GPS modules, equipment controllers, and worker devices to reflect live statuses. For example, if a concrete pour is completed on level 4 and confirmed through camera analysis and sensor data, the digital model is updated to reflect that structural status. Similarly, if a sensor detects an increase in humidity in a wall cavity, the digital twin reflects the anomaly and may suggest that waterproofing is pending or compromised. The digital twin allows users to view the as-built status remotely and verify that the project execution aligns with the intended design.

At step 1326, the system executes predictive analysis to identify potential future failures or compliance violations based on trend analysis. The Agentic AI engine utilizes historical data, real-time data streams, and contextual correlations to forecast likely outcomes. For example, if vibration sensors show a consistent increase in oscillations in a lift motor, the AI system may forecast an imminent mechanical failure within a specified time window. Similarly, if wall insulation thickness in updated design data falls below the threshold specified in a regulatory compliance database, the AI identifies a likely code violation. These predictions are generated using machine learning models trained on prior project data and field conditions. The AI system may also analyze task delays across multiple phases and warn that future milestones are at risk of slippage. This predictive capability allows preemptive intervention by users or the autonomous system to mitigate risks before they materialize on-site.

At step 1327, the method may include displaying recommendations, alerts, and next best actions to the user. The AI engine, after performing predictive evaluations or conflict detection, may generate actionable guidance tailored to the user's role, current task status, and observed or predicted outcomes. These recommendations may include suggestions such as "Reschedule HVAC installation to after duct sealing," or "Contact supplier for early delivery due to task acceleration." Alerts may include safety warnings (e.g., sensor-detected gas leak), operational alerts (e.g., worker idle on task X), or compliance notices (e.g., fire alarm installation missing from stairwell plan). Each notification may be displayed on a dashboard or transmitted through audio, email, SMS, or system-generated calls. In some embodiments, the AI may also present multiple options and recommend the optimal path, such as "Choose between Vendor A (faster delivery) or Vendor B (lower cost)," enabling decision support during dynamic project scenarios.

At step 1328, the method transmits the final execution plan to on-site personnel and vendor systems. Upon completion of user interactions, predictive assessments, and optimization routines, the finalized and approved task list or design schedule is dispatched for field-level implementation. This transmission may occur via secure APIs, encrypted wireless protocols, or direct integration with contractor management platforms, vendor ordering systems, or worker mobile applications. For example, if the final plan includes tile replacement in zone B at 9:00 AM, the tiler assigned to that zone receives a mobile alert, the warehouse receives a tile requisition, and the timeline dashboard is updated accordingly. In another embodiment, vendor software (e.g., procurement systems or ERP) may receive the bill of materials and auto-generate invoices or shipping notices. This step bridges the gap between virtual planning and physical execution and enables automated synchronization across involved entities.

At step 1329, the method comprises receiving confirmation of task completion and updating execution status accordingly. Once a task is executed in the field, workers may mark the task as complete through a mobile app, or the system may use IT sensors and cameras to detect completion autonomously. For example, image recognition software may detect that tile work is visually complete based on updated site photographs. Alternatively, a vibration sensor may confirm that a fan is operational post-installation. The AI agent updates the central design plan or task management database to reflect completion, triggers any follow-up tasks that were sequenced after the current task, and removes pending status indicators. In cases where completion is delayed or incomplete, the AI may prompt for updates, recommend alternate workflows, or escalate the issue to supervisory staff. This step maintains real-time project status and helps track productivity against the planned schedule.

At step 1330, the method involves iteratively refining AI models using feedback and performance data. The AI engine continuously improves its prediction accuracy, execution logic, and response prioritization based on historical outcomes, real-time observations, user corrections, and confirmed results. Data such as time taken to complete each task, success rate of prior predictions, accuracy of visual fault detections, and user override patterns are analyzed to identify trends. These insights are fed into training datasets used to update neural networks, fuzzy logic engines, or hybrid machine learning models that govern the Agentic AI system. For example, if the AI consistently overestimates the delivery time for plumbing tasks by two days, the model adjusts its internal weightings. Similarly, if users repeatedly ignore a certain type of recommendation, the agent learns to adapt its logic accordingly. This continuous refinement closes the loop between AI performance and real-world feedback, enabling a more intelligent, context-aware system over time.

In some embodiments, the present invention provides for a system and method utilizing Agentic AI as a virtual human assistant capable of autonomously managing, coordinating, and facilitating various operations during the construction phases of a building project. The Agentic AI may operate on a controller or on user devices belonging to contractors, supervisors, vendors, and workers, and may be configured to analyze data, interact with users, and engage with other AI agents operating on different user devices or nodes across a network. The Agentic AI may possess a virtual human interface capable of engaging in natural language conversations with users, interpreting both textual and verbal commands, and proactively initiating interactions based on contextual awareness derived from construction progress data, environmental metrics, or user schedules. For example, during a concrete pouring phase, the AI may detect weather conditions indicating high humidity and may initiate a conversation with the site manager's agent regarding the feasibility of continuing the pour, while simultaneously querying vendor agents for waterproofing materials.

The Agentic AI may be equipped with task-specific knowledge for each phase of the construction, including site preparation, excavation, foundation laying, structural framing, HVAC and plumbing installations, electrical setup, interior finishing, compliance assessment, and handover. At each stage, the Agentic AI may act as an intelligent assistant, monitoring task completion, identifying potential bottlenecks, sequencing dependent tasks, and recommending best-next actions. For example, during the structural framing phase, if the AI detects through camera analysis or digital plan updates that steel beams are being delayed, it may re-sequence drywall installation tasks, notify the interior finish subcontractor of a shift in schedule, and suggest alternative material logistics based on historical supply chain data. This type of intelligent assistance relieves human supervisors from constant micro-management and provides a responsive, data-backed planning agent to manage uncertainties inherent in construction environments.

In one embodiment, each subcontractor or labor group may be assigned an individual AI agent that is capable of acting independently while remaining in networked communication with a central master agent or other peer agents. These AI agents may operate in either hierarchical or distributed frameworks, depending on the project structure. For example, the electrician's AI agent may independently track installation progress of junction boxes, detect delay in wire delivery, and communicate directly with the procurement AI agent without routing conversations through the site supervisor's master agent. If the plumbing AI agent detects potential interference between a water line and electrical conduit in a shared wall cavity, it may autonomously initiate a conflict resolution protocol by notifying the electrician's AI agent, and together they may negotiate a rescheduling or redesign of their respective layouts. Such inter-agent communication allows problems to be resolved collaboratively and without overburdening the human users with constant oversight.

In some embodiments, the Agentic AI may maintain a real-time 3D digital twin of the building project and continuously compare it with on-site progress through IoT sensors, RFID-tagged components, and drone or camera feeds. The AI may visually inspect worksite video in real time or analyze sequential images to identify the placement accuracy of beams, piping, or cabling. Based on this analysis, the AI may automatically update the digital model, flag inconsistencies, or trigger rework requests. For example, if the AI detects that a ceiling-mounted lighting fixture has been installed six inches off from the planned coordinate, it may prompt the electrician AI agent to verify the blueprint, issue a correction order, and coordinate with the drywall finishing AI agent to delay the ceiling work until realignment is complete. Such tight loop integration between site conditions and virtual models allows for higher fidelity control of project execution and avoids costly rework post-inspection.

In some use cases, the Agentic AI may be configured to manage procurement, inventory, and on-site deliveries. The AI may autonomously initiate procurement orders when stock thresholds fall below acceptable limits or when a task requiring specific materials is approaching in the schedule. It may also evaluate supplier delivery trends and select vendors based on reliability, availability, or cost criteria. For example, if an HVAC component is not available from the preferred vendor, the AI may identify alternate vendors, check their delivery windows, and recommend or autonomously place an order after notifying the appropriate stakeholder. In a scenario involving simultaneous material requests from multiple trades, the AI may perform prioritization based on urgency, task dependencies, and cost implications before executing decisions, thereby reducing clashes and maintaining workflow continuity.

In further embodiments, the Agentic AI may manage communications across multiple language preferences or technical backgrounds by adapting its conversation style based on user profiles. For example, while conversing with a site laborer, the AI may use simplified language and visual prompts, whereas while interacting with the site engineer, it may present tabular specifications, compliance requirements, or CAD overlays. This adaptability allows the AI to serve as a universal translator and facilitator, bridging communication gaps between different worker roles, thereby increasing clarity and reducing errors arising from miscommunication.

During quality checks or compliance assessments, the Agentic AI may proactively guide field users through inspection routines. The AI may highlight specific parameters to be checked based on the applicable code, retrieve historical fault data for recurring issues, and log inspection results along with voice-noted feedback. If deviations are identified, the AI may auto-generate issue reports with photographs, annotations, and recommendations, and forward them to the assigned responsible parties. For example, during electrical compliance assessment, the AI may instruct the worker to test ground resistance, log the meter readings, and compare them with compliance thresholds. If violations are detected, the AI may flag the issue in the compliance dashboard and recommend remedial steps based on the equipment and configuration used.

In some embodiments, the Agentic AI may also conduct a guided virtual walkthrough of the construction site for remote stakeholders. Using video streams captured via drones or site-installed cameras, the AI may construct a simulated 3D path that mirrors the on-site reality, allowing the stakeholder to visually inspect the project status remotely. The AI agent may serve as a virtual tour guide, pausing at significant checkpoints, verbally summarizing construction progress, highlighting completed vs. pending elements, and inviting verbal feedback. The walkthrough may also incorporate inspection highlights, pending compliance areas, and visualized timeline projections, allowing investors, clients, or regulators to participate in oversight without requiring physical site visits.

Furthermore, in multi-phase projects involving complex dependencies, the Agentic AI may be tasked with overseeing continuity between phases. For example, if foundational work is completed and superstructure framing is ready to begin, the AI may validate that below-grade utilities have been completed and passed inspection before allowing the above-grade work to proceed. It may also verify that vendors and subcontractors assigned to the next phase are available and resourced, and pre-issue orientation material or work permits if required. This sequential verification prevents premature execution, coordination errors, and resource conflicts across project phases.

The Agentic AI may also act as an emotional safety assistant during worker interaction, detecting stress levels or fatigue based on voice modulation, gesture recognition, or biometric sensors embedded in wearable devices. If signs of physical or cognitive fatigue are detected, the AI may recommend task reassignment, trigger wellness prompts, or alert the supervisor. For example, if a crane operator's voice becomes increasingly erratic over the intercom, the AI may flag the behavior, issue a prompt for break, or temporarily halt high-risk operations until a human supervisor intervenes. This embodiment brings a layer of health and safety support into autonomous construction environments.

In some embodiments, the Agentic AI acts not as a command execution engine but as a knowledgeable, communicative, context-aware virtual human assistant capable of reasoning, adapting, negotiating, and supporting collaborative construction workflows. Its ability to manage multimodal input, understand construction logic, interpret compliance data, and coordinate peer AI agents brings unprecedented scalability and responsiveness to construction project management. The AI's modular architecture further enables it to be extended across various construction disciplines, including civil, structural, MEP (Mechanical, Electrical, Plumbing), fire safety, interior finishing, and landscape coordination, making it a highly extensible and indispensable tool across the entire project lifecycle.

The present invention includes methods for intelligent planning, monitoring, and management of building construction or maintenance projects using Agentic artificial intelligence (AI), the method may include the steps of: receiving, by a controller operating an AI agent, a design plan may include a spatial layout and a plurality of building elements; converting, by the controller, the received design plan into a dynamic interactive model may include one or more interactive components, where each interactive component corresponds to a respective building element; receiving contextual data from one or more sources, the one or more sources may include at least one of: a building management system (BMS), IoT devices, location data of one or more users, weather data, material-vendor listings, and scheduling or calendar information; initiating, by the controller, the AI agent to analyze the design plan in conjunction with the contextual data to perform one or more actions; generating and displaying, by the controller, an interactive user interface on a first user device associated with a first user, the interactive user interface may include a visual representation of the dynamic interactive model; receiving, by the AI agent, one or more user interactions from the first user using the first user device, the one or more user interactions may include verbal input, textual input, or gestural input; interpreting, by the AI agent, the one or more user interactions using natural language processing and correlation of multi-modal inputs to disambiguate user intent; and initiating, by the AI agent, the one or more actions based on at least one of: the contextual data, and interpreted user intent, the one or more actions may include at least one of: initiating material procurement, hiring resources, scheduling personnel, updating the design plan, controlling on-site devices, or issuing task-specific instructions to the first user or to a second user associated with a building project being managed by the first user.

In some embodiments, building elements may include at least one of: walls, doors, windows, ceilings, floors, staircases, elevators, light fixtures, HVAC components, plumbing fixtures, electrical panels, fire safety devices, surveillance cameras, and structural support members.

In some embodiments, interactive components of the dynamic interactive model include user-selectable graphical objects corresponding to the building elements.

In some embodiments, the AI agent is a master agent configured to communicate with one or more sub-agents executing on respective user devices associated with different stakeholders.

In some embodiments, the sub-agents are configured to perform role-specific actions may include plumbing coordination, electrical planning, or HVAC scheduling.

In some embodiments, the sub-agents are configured to communicate with each other autonomously without involving human stakeholders, and where the communication may include at least one of: exchanging task-specific data, conflict-resolution parameters, contextual updates, and work status information.

In some embodiments, the sub-agents may include a first sub-agent associated with an electrician and a second sub-agent associated with a plumber.

In some embodiments, contextual data includes geolocation data of the first user and one or more second users involved in the building project.

In some embodiments, the AI agent determines that the geolocation data of the first user corresponds to a procurement opportunity near a supplier location and prompts the first user accordingly.

In some embodiments, one or more user interactions may include a combination of simultaneous gestures and voice commands, and the AI agent uses correlation logic to interpret an intended action.

In some embodiments, the AI agent autonomously generates a construction schedule based on contextual data and received design plan.

In some embodiments, the contextual data includes sensor feeds from cameras, temperature sensors, leakage detectors, and structural stress sensors deployed on-site.

In some embodiments, the AI agent is configured to detect conflicts in work assignments across different labor teams and initiate conflict resolution communications.

In some embodiments, the interactive user interface includes a real-time simulation or walkthrough view of a building project.

In some embodiments, the AI agent inserts a virtualized agent into the simulation to guide the first user through the walkthrough.

In some embodiments, one or more actions initiated by the AI agent include launching a drone for site inspection, where the drone may include one or more cameras for capturing real-time video feeds for analysis by the AI agent.

In some embodiments, the AI agent prioritizes tasks based on urgency and dependencies detected in the contextual data.

In some embodiments, the AI agent initiates procurement of materials based on pricing and availability data retrieved from one or more vendor databases.

In some embodiments, the AI agent actively listens for commands when invoked and passively listens for environmental cues to offer contextual suggestions.

In some embodiments, a verbal input may include a vague phrase, and the AI agent resolves ambiguity using correlated gesture or contextual reference.

In some embodiments, the AI agent manages multiple concurrent projects and allocates tasks across them based on labor availability and proximity.

In some embodiments, the AI agent assigns project accounts for labor, material, and subcontractor payments and initiates transactions based on threshold approval limits.

In some embodiments, the AI agent autonomously generates and transmits task notifications to the second user based on their geolocation and project schedule, and the AI agent may engage in direct conversations with on-site workers through sub-agents operating on their devices. A second user may operate a second user device running a second AI agent. The second AI agent is a sub-agent that receives autonomous instructions from the AI agent and replies with project status autonomously.

In some embodiments, the AI agent determines that the second user is near a supplier location and prompts the first user or the second user accordingly.

In some embodiments, the AI agent determines that the second user is near a supplier location having a procurement opportunity and prompts the second user autonomously without involving the first user.

In some embodiments, the AI agent is configured to determine that a worker is taking longer than expected to complete a scheduled task, triggering a delay-handling process may include at least one of: generating a prompt to a supervisory user, initiating autonomous communication with the worker, or updating the interactive user interface to reflect the delay.

The present invention also includes apparatus for intelligent planning, monitoring, and management of building construction or maintenance projects using Agentic artificial intelligence (AI), the apparatus may include: a display screen configured to present an interactive user interface; a digital storage medium may include an executable software instructions; and a controller operating AI agent, where the controller may include a processor, and where the executable software instructions, when executed by the processor, causes the processor to: receive, by the controller, a design plan of at least a portion of a building, the design plan may include a spatial layout and a plurality of building elements; convert, by the controller, the received design plan into a dynamic interactive model may include one or more interactive components, where each interactive component corresponds to a respective building element; receive contextual data from one or more sources, the one or more sources may include at least one of: a building management system (BMS), IoT devices, location data of one or more users, weather data, material-vendor listings, and scheduling or calendar information; initiate the AI agent to analyze the design plan in conjunction with the contextual data to perform one or more actions; generate and display, by the controller, the interactive user interface on a first user device associated with a first user, the interactive user interface may include a visual representation of the dynamic interactive model; receive, by the AI agent, one or more user interactions from the first user using the first user device, the one or more user interactions may include verbal input, textual input, or gestural input; interpret, by the AI agent, one or more user interactions using natural language processing and correlation of multi-modal inputs to disambiguate user intent; and initiate, by the AI agent, the one or more actions based on at least one of: the contextual data and interpreted user intent, the one or more actions may include at least one of: initiating material procurement, hiring resources, scheduling personnel, updating the design plan, controlling on-site devices, or issuing task-specific instructions to the first user or to a second user associated with a building project being managed by the first user.

In some embodiments, the AI agent is a master agent configured to coordinate with one or more sub-agents running on other devices associated with stakeholders such as contractors, engineers, electricians, or plumbers.

In some embodiments, the sub-agents are configured to perform role-specific actions such as plumbing coordination, HVAC optimization, electrical planning, or structural safety evaluation.

In some embodiments, the sub-agents are capable of autonomously exchanging task-specific updates, contextual data, and work status information with each other without human intervention.

In some embodiments, the sub-agents may include at least one electrician sub-agent and at least one plumber sub-agent, and where the electrician sub-agent and the plumber sub-agent coordinate to resolve overlapping or conflicting tasks.

In some embodiments, the contextual data includes geo-location coordinates of the first user and one or more second users associated with a building project.

In some embodiments, the AI agent determines that the first user is located near a supplier and generates a prompt, recommending material procurement.

In some embodiments, the one or more user interactions include concurrent gesture and verbal inputs interpreted using multi-modal input correlation.

In some embodiments, the AI agent is configured to detect and resolve work assignment conflicts based on labor availability and spatial overlap of tasks.

In some embodiments, the AI agent manages multiple building projects concurrently, distributing labor and materials based on project priority.

Glossary

"Artificial Intelligence" as used herein means machine-based decision making and machine learning including, but not limited to: supervised and unsupervised recognition of patterns, classification, and numerical regression. Supervised learning of patterns includes a human indicating that a pattern (such as a pattern of dots formed via the rasterization of a two-dimensional image) is representative of a line, polygon, shape, angle or other geometric form, or an architectural aspect, unsupervised learning can include a machine finding a pattern submitted for analysis. One or both may use mathematical optimization, formal logic, artificial neural networks, and methods based on one or more of: statistics, probability, linear regression, linear algebra, and/or matrix multiplication.

"AI Engine" as used herein an AI Engine (sometimes referred to as an AI model) refers to methods and apparatus for applying artificial intelligence and/or machine learning to a task performed by a controller. In some embodiments, a controller may be operative via executable software to function as an AI engine capable of recognizing aspects and/or tally aspects of a design plan that are relevant to generating an estimate for performing projects included in construction of a building or other activities related to construction of a building.

"Agentic AI" or "AI agent" as used herein, refers to an artificial intelligence system configured to operate autonomously or semi-autonomously with the capacity to perceive contextual information, interpret multi-modal user inputs, execute intelligent decision-making routines, and initiate proactive or reactive actions in furtherance of one or more objectives. The Agentic AI may function as a virtual human assistant capable of interacting with users via natural language processing, voice recognition, visual cues, or text-based interfaces. In some embodiments, the Agentic AI may operate locally on a user device, on a networked controller, or remotely via a cloud-based platform. The Agentic AI may communicate with other AI agents across distributed devices to facilitate coordination, delegation, and orchestration of tasks. It may analyze real-time data from various sources including IoT sensors, digital design plans, location feeds, user schedules, BMS, and external services such as weather or regulatory databases. The Agentic AI may further possess domain-specific reasoning capabilities, allowing it to assess constraints, validate structural feasibility, optimize task sequences, track progress, generate reports, and provide actionable feedback in the context of construction, design, operations, maintenance, compliance, or other infrastructure-related environments.

"Computer Aided Design," sometimes referred to as "CAD," as used herein shall mean the use of automation for the creation, modification, analysis, or optimization of a design plan or design plan file.

"Building Information Modeling" sometimes referred to as "BIM," as used herein. "Building Management System" sometimes referred to as "BMS," as used herein.

"Vector File" as used herein a vector file is a computer graphic that uses mathematical formulas to render its image. In some embodiments, a sharpness of a vector file will be agnostic to size within a range of sizes viewable on smart devices and personal computer display screens.

Typically, a vector image includes segments with two points. The two points create a path. Paths can be straight or curved. Paths may be connected at connection points. Connected paths form more complex shapes. More points may be used to form longer paths or closed shapes. Each path, curve, or shape has its own formula, so they can be sized up or down and the formulas will maintain the crispness and sharp qualities of each path.

A vector file may include connected paths that may be viewed as graphics. The paths that make up the graphics may include geometric shapes or portions of geometric shapes, such as: circles, ellipsis, Bezier curves, squares, rectangles, polygons, and lines. More sophisticated designs may be created by joining and intersecting shapes and/or paths. Each shape may be treated as an individual object within the larger image. Vector graphics are scalable, such that they may be increased or decreased without significantly distorting the image.

The terms "design plan," "building plan," "building design," "floor plan," "two-dimensional reference," "two-dimensional or three-dimensional static representation," or simply "design" are used interchangeably, often referring to the same or similar concepts in the context of architectural or construction documentation.

The present invention provides for systems of one or more computers that can be configured to perform particular operations or actions by virtue of having software, firmware, hardware, or a combination of them installed on the system that in operation causes or cause the system to perform the actions. One or more computer programs can be configured to perform artificial intelligence operations or actions by virtue of including instructions that, when executed by data processing apparatus, cause the apparatus to perform the actions.

CONCLUSION

A number of embodiments of the present disclosure have been described. While this specification contains many specific implementation details, they should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings, and the detailed description thereto, are not intended to limit the present disclosure to the form disclosed, but to the contrary, the present disclosure is to cover modifications, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" be used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

The phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising," "including," and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that illustrated operations be performed, to achieve desirable results.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A method for intelligent planning and management of building construction or maintenance projects using Agentic artificial intelligence (AI), the method comprising the steps of:
   a. Receiving a design plan comprising a spatial layout and a plurality of building elements, by a controller operating an AI agent configured to execute decision-making, coordination, monitoring, and communications across a network of intelligent sub-agents;
   b. converting, by the controller, the received design plan into a dynamic interactive model comprising one or more interactive components, wherein each interactive component corresponds to a respective building element;
   c. receiving, by the controller, contextual data from one or more sources, the one or more sources comprising at least one of: a building management system (BMS), IoT devices, location data of one or more users including a first user, weather data, material-vendor listings, and scheduling or calendar information;
   d. initiating, by the controller, the AI agent to analyze the design plan in conjunction with the contextual data to perform one or more actions;
   e. generating and displaying, by the controller, an interactive user interface on a first user device associated with the first user, the interactive user interface comprising a visual representation of the dynamic interactive model;
   f. receiving, by the controller, one or more user interactions from the first user using the first user device, the one or more user interactions comprising verbal input, textual input, and gestural input;
   g. interpreting, by the controller, the one or more user interactions using natural language processing and correlation of multi-modal inputs to disambiguate user intent; and
   h. initiating, by the AI agent, the one or more actions based on at least one of: the contextual data, and the interpreted user intent, the one or more actions comprising at least one of: initiating material procurement, hiring resources, scheduling personnel, updating the design plan, controlling on-site devices, and issuing task-specific instructions or inquiries to the one or more users associated with a building project being managed by the first user, wherein the AI agent is configured as a master agent to autonomously resolve conflicts between functional requirements associated with the building project by communicating directly with one or more AI sub-agents associated with the one or more users managing different roles, and update priorities.

2. The method of claim 1, wherein the plurality of building elements comprise at least one of: walls, doors, windows, ceilings, floors, staircases, elevators, light fixtures, HVAC components, plumbing fixtures, electrical panels, fire safety devices, surveillance cameras, and structural support members and wherein the dynamic interactive model supports real-time, multi-user collaboration with role-specific access and action permissions.

3. The method of claim 2, wherein the one or more interactive components of the dynamic interactive model include user-selectable graphical objects corresponding to the plurality of building elements.

4. The method of claim 1, wherein the AI agent is-functions as the master agent and is configured to communicate with the one or more AI sub-agents each operating on different stakeholder devices of the one or more users associated with different stakeholder roles.

5. The method of claim 4, wherein the one or more AI sub-agents are configured to manage domain-specific actions and communicate directly with one another or with the master agent to avoid schedule conflicts.

6. The method of claim 5, wherein the one or more AI sub-agents are configured to communicate with each other autonomously without involving human stakeholders, and wherein the communication comprises conflict-resolution parameters.

7. The method of claim 6, wherein the one or more AI sub-agents comprise a first AI sub-agent associated with an electrician and a second AI sub-agent associated with a plumber.

8. The method of claim 1, wherein the contextual data includes geolocation data of the first user and one or more second users involved in the building project.

9. The method of claim 8, wherein the AI agent determines that the geolocation data of the first user corresponds to a procurement opportunity near a supplier location and prompts the first user accordingly.

10. The method of claim 1, wherein the one or more user interactions comprise a combination of simultaneous gestures and voice commands, and the AI agent uses correlation logic to interpret an intended action.

11. The method of claim 1, wherein the AI agent autonomously generates an order.

12. The method of claim 1, wherein the contextual data includes sensor feeds from cameras, temperature sensors, leakage detectors, and structural stress sensors deployed on-site.

13. The method of claim 1, wherein the AI agent is configured to detect conflicts in work assignments across different labor teams and initiate conflict resolution communications.

14. The method of claim 1, wherein the interactive user interface includes a real-time simulation or walkthrough view of a building project with a virtualized agent that guides the first user through the walkthrough view.

15. The method of claim 14, wherein the AI agent inserts a virtualized agent into the real-time simulation to guide the first user through the walkthrough view.

16. The method of claim 1, wherein the one or more actions initiated by the AI agent include launching a drone for site inspection, wherein the drone comprises one or more cameras for capturing real-time video feeds for analysis by the AI agent.

17. The method of claim 1, wherein the AI agent prioritizes tasks based on urgency and dependencies detected in the contextual data.

18. The method of claim 1, wherein the AI agent initiates procurement of materials based on pricing and availability data retrieved from one or more vendor databases.

19. The method of claim 1, wherein the AI agent actively listens for commands when invoked by the first user and passively listens to ambient conversation of the first user for environmental cues to offer contextual suggestions.

20. The method of claim 1, wherein a verbal input comprises a vague phrase and the AI agent resolves ambiguity using correlated gesture or contextual reference.

\* \* \* \* \*